US012796556B2

(12) United States Patent
Han et al.

(10) Patent No.: US 12,796,556 B2
(45) Date of Patent: Nov. 10, 2026

(54) TRANSFER FILM STRETCHING DEVICE

(71) Applicant: Samsung Display Co., LTD., Yongin-si (KR)

(72) Inventors: Jeong Won Han, Yongin-si (KR); Han Chun Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 390 days.

(21) Appl. No.: 18/392,633

(22) Filed: Dec. 21, 2023

(65) Prior Publication Data

US 2024/0243107 A1 Jul. 18, 2024

(30) Foreign Application Priority Data

Jan. 12, 2023 (KR) ........................ 10-2023-0004504

(51) Int. Cl.
*H10W 90/00* (2026.01)

(52) U.S. Cl.
CPC .................................... *H10W 90/00* (2026.01)

(58) Field of Classification Search
CPC .......... B29C 55/10; B29C 55/20; H10P 72/74
See application file for complete search history.

(56) References Cited

U.S. PATENT DOCUMENTS

| | | | | |
|---|---|---|---|---|
| 7,858,902 | B2 | 12/2010 | Nakamura | |
| 2006/0180136 | A1 | 8/2006 | Nagai et al. | |
| 2008/0190902 | A1 * | 8/2008 | Nakamura | H10P 54/00 257/E21.599 |
| 2024/0072027 | A1 | 2/2024 | Han et al. | |

FOREIGN PATENT DOCUMENTS

| | | | | | |
|---|---|---|---|---|---|
| JP | 2005-294470 | A | | 10/2005 | |
| KR | 10-2012-0094428 | A | | 8/2012 | |
| KR | 20120094428 | A | * | 8/2012 | H10P 54/00 |
| KR | 10-2013-0045696 | A | | 5/2013 | |
| KR | 10-2019-0035209 | A | | 4/2019 | |
| KR | 10-2019-0099163 | A | | 8/2019 | |
| KR | 10-2024-0032217 | A | | 3/2024 | |
| KR | 10-2024-0049765 | A | | 4/2024 | |

OTHER PUBLICATIONS

Korean Office Action for KR Application No. 10-2023-0004504, dated Jun. 9, 2026, 9 pages.

* cited by examiner

*Primary Examiner* — Daniel Mcnally

(74) *Attorney, Agent, or Firm* — Womble Bond Dickinson (US) LLP

(57) ABSTRACT

A transfer film stretching device includes: a transfer film support unit having a top surface configured to receive a transfer film, the transfer film having light emitting elements arranged at a first distance mounted thereon; a first stretching unit outside the transfer film support unit and configured to move in one direction or another direction of a third direction while fixing an outer edge of the transfer film to stretch a width of the transfer film in an outer circumferential direction; and a second stretching unit between the first stretching unit and the transfer film support unit and movable in the one direction or the other direction of the third direction independently of the first stretching unit.

20 Claims, 29 Drawing Sheets

11 : 101, 201, 501
101 : 121, 131, 141
121 : 121-1, 121-2
131 : 131-1, 131-2, 131-3
141 : 141-1, 141-2
201 : 221, 231
501 : 521, 531

10 : 100, 200, 500
100 : 120, 130, 140
120 : 120-1, 120-2
130 : 130-1, 132-2, 130-3
140 : 140-1, 140-2
200 : 200, 230
230 : 230-1, 230-2

10 : 100, 200, 500
100 : 120, 130, 140
120 : 120-1, 120-2
130 : 130-1, 132-2, 130-3
140 : 140-1, 140-2
200 : 200, 230
230 : 230-1, 230-2

10 : 100, 200, 500
100 : 120, 130, 140
120 : 120-1, 120-2
130 : 130-1, 132-2, 130-3
140 : 140-1, 140-2
200 : 200, 230
230 : 230-1, 230-2

10 : 100, 200, 500
100 : 120, 130, 140
120 : 120-1, 120-2
130 : 130-1, 132-2, 130-3
140 : 140-1, 140-2
200 : 200, 230
230 : 230-1, 230-2

11 : 101, 201, 501
101 : 121, 131, 141
121 : 121-1, 121-2
131 : 131-1, 131-2, 131-3
141 : 141-1, 141-2
201 : 221, 231
501 : 521, 531

11 : 101, 201, 501
101 : 121, 131, 141
121 : 121-1, 121-2
131 : 131-1, 131-2, 131-3
141 : 141-1, 141-2
201 : 221, 231
501 : 521, 531

11 : 101, 201, 501
101 : 121, 131, 141
121 : 121-1, 121-2
131 : 131-1, 131-2, 131-3
141 : 141-1, 141-2
201 : 221, 231
501 : 521, 531

11 : 101, 201, 501
101 : 121, 131, 141
121 : 121-1, 121-2
131 : 131-1, 131-2, 131-3
141 : 141-1, 141-2
201 : 221, 231
501 : 521, 531

12 : 102, 202, 302, 502
102 : 122, 132, 142
122 : 122-1, 122-2
132 : 132-1, 132-2, 132-3
142 : 142-1, 142-2
202 : 222, 232
232 : 232-1, 232-2
302 : 332, 342
332 : 332-1, 332-2, 332-3
342 : 342-1, 342-2

12 : 102, 202, 302, 502
102 : 122, 132, 142
122 : 122-1, 122-2
132 : 132-1, 132-2, 132-3
142 : 142-1, 142-2
202 : 222, 232
232 : 232-1, 232-2
302 : 332, 342
332 : 332-1, 332-2, 332-3
342 : 342-1, 342-2

12 : 102, 202, 302, 502
102 : 122, 132, 142
122 : 122-1, 122-2
132 : 132-1, 132-2, 132-3
142 : 142-1, 142-2
202 : 222, 232
232 : 232-1, 232-2
302 : 332, 342
332 : 332-1, 332-2, 332-3
342 : 342-1, 342-2

12 : 102, 202, 302, 502
102 : 122, 132, 142
122 : 122-1, 122-2
132 : 132-1, 132-2, 132-3
142 : 142-1, 142-2
202 : 222, 232
232 : 232-1, 232-2
302 : 332, 342
332 : 332-1, 332-2, 332-3
342 : 342-1, 342-2

12 : 102, 202, 302, 502
102 : 122, 132, 142
122 : 122-1, 122-2
132 : 132-1, 132-2, 132-3
142 : 142-1, 142-2
202 : 222, 232
232 : 232-1, 232-2
302 : 332, 342
332 : 332-1, 332-2, 332-3
342 : 342-1, 342-2

12 : 102, 202, 302, 502
102 : 122, 132, 142
122 : 122-1, 122-2
132 : 132-1, 132-2, 132-3
142 : 142-1, 142-2
202 : 222, 232
232 : 232-1, 232-2
302 : 332, 342
332 : 332-1, 332-2, 332-3
342 : 342-1, 342-2

13 : 103, 203, 303, 503
103 : 123, 133, 143
123 : 123-1, 123-2
133 : 133-1, 133-2, 133-3
143 : 143-1, 143-2
203 : 223, 233
233 : 233-1, 233-2
303 : 333, 343
343 : 343-1, 343-2
503 : 523, 533

13 : 103, 203, 303, 503
103 : 123, 133, 143
123 : 123-1, 123-2
133 : 133-1, 133-2, 133-3
143 : 143-1, 143-2
203 : 223, 233
233 : 233-1, 233-2
303 : 333, 343
343 : 343-1, 343-2
503 : 523, 533

13 : 103, 203, 303, 503
103 : 123, 133, 143
123 : 123-1, 123-2
133 : 133-1, 133-2, 133-3
143 : 143-1, 143-2
203 : 223, 233
233 : 233-1, 233-2
303 : 333, 343
343 : 343-1, 343-2
503 : 523, 533

13 : 103, 203, 303, 503
103 : 123, 133, 143
123 : 123-1, 123-2
133 : 133-1, 133-2, 133-3
143 : 143-1, 143-2
203 : 223, 233
233 : 233-1, 233-2
303 : 333, 343
343 : 343-1, 343-2
503 : 523, 533

13 : 103, 203, 303, 503
103 : 123, 133, 143
123 : 123-1, 123-2
133 : 133-1, 133-2, 133-3
143 : 143-1, 143-2
203 : 223, 233
233 : 233-1, 233-2
303 : 333, 343
343 : 343-1, 343-2
503 : 523, 533

13 : 103, 203, 303, 503
103 : 123, 133, 143
123 : 123-1, 123-2
133 : 133-1, 133-2, 133-3
143 : 143-1, 143-2
203 : 223, 233
233 : 233-1, 233-2
303 : 333, 343
343 : 343-1, 343-2
503 : 523, 533

TRANSFER FILM STRETCHING DEVICE

CROSS-REFERENCE TO RELATED APPLICATION

This application claims priority to and the benefit of Korean Patent Application No. 10-2023-0004504, filed on Jan. 12, 2023, in the Korean Intellectual Property Office, the entire content of which is incorporated herein by reference.

BACKGROUND

1. Field

Aspects of embodiments of the present disclosure relate to a transfer film stretching device.

2. Description of the Related Art

The importance of display devices has steadily increased with the development of multimedia technology. In response thereto, various types of display devices, such as an organic light emitting diode (OLED) display, a liquid crystal display (LCD), and the like have been developed.

A display device is a device for displaying an image and generally includes a display panel, such as a light emitting display panel or a liquid crystal display panel. From among the types of display panels, the light emitting display panel may include a light emitting diode (LED), and the light emitting diode may include an organic light emitting diode using an organic material as a fluorescent material or an inorganic light emitting diode using an inorganic material as a fluorescent material.

To manufacture a display panel using an inorganic light emitting diode as a light emitting element, stretching devices for transferring micro LEDs grown on a wafer to a transfer film before the micro LEDs are disposed on a substrate of a display panel and to widen the gap between the micro LEDs may be used.

SUMMARY

Embodiments of the present disclosure provide a transfer film stretching device for stretching a transfer film on which light emitting elements are disposed in a stepwise manner.

However, aspects and features of the present disclosure are not to those set forth herein. The above and other aspects and features of the present disclosure will become more apparent to one of ordinary skill in the art to which the present disclosure pertains by referencing the detailed description of the present disclosure given below.

According to an embodiment, a transfer film stretching device includes: a transfer film support unit having a top surface configured to receive a transfer film having light emitting elements mounted thereon and arranged at a first distance; a first stretching unit outside the transfer film support unit and configured to move in one direction or another direction of a third direction while fixing an outer edge of the transfer film to stretch a width of the transfer film in an outer circumferential direction; and a second stretching unit between the first stretching unit and the transfer film support unit and movable in one direction or the other direction of the third direction independently of the first stretching unit.

The first stretching unit may include: a fixing unit configured to fix an outer circumference of the transfer film; a first vertical driving unit including a pressing frame overlapping the fixing unit in the third direction and configured to move the pressing frame in the other direction of the third direction to press the fixing unit; and a second vertical driving unit under the first vertical driving unit and configured to move in one direction or the other direction of the third direction.

The second stretching unit may include: an auxiliary support part configured to support the transfer film mounted on the top surface; and a third vertical driving unit under the auxiliary support part and configured to move in one direction or the other direction of the third direction.

The pressing frame may have a locking groove, the auxiliary support part may have a locking protrusion protruding toward the first stretching unit, and the second vertical driving unit may move in the other direction of the third direction while the locking groove is fitted and coupled with the locking protrusion with the transfer film sandwiched therebetween to spread apart the light emitting elements on the transfer film at a second distance. The second distance may be greater than the first distance.

The first stretching unit and the second stretching unit may be fixed and connected together by fitting and coupling of the locking protrusion and the locking groove and may move together in the other direction of the third direction to spread apart the light emitting elements on the transfer film at a third distance. The third distance may be greater than the second distance.

The fixing unit may have a circular or polygonal panel or a frame structure in which a circular or polygonal opening is formed, and the pressing frame may have a circular or polygonal panel or a frame structure in which a circular or polygonal opening is formed.

The first stretching unit and the second stretching unit may have a cylindrical or polygonal columnar shape having an opening, the second stretching unit may be in the opening of the first stretching unit, and the transfer film support unit may be in the opening of the second stretching unit.

The transfer film support unit may include a main support part configured to support the transfer film mounted on the top surface and a fourth vertical driving unit under the main support part and configured to move in one direction or the other direction of the third direction.

The pressing frame may have a locking groove, the auxiliary support part may have a locking protrusion protruding toward the first stretching unit, the second stretching unit and the transfer film support unit may move in one direction of the third direction while the locking groove is fitted and coupled with the locking protrusion with the transfer film sandwiched therebetween to spread apart the light emitting elements on the transfer film at the second distance.

The first stretching unit and the second stretching unit may be are fixed and connected by fitting and coupling of the locking protrusion and the locking groove and may move together in the other direction of the third direction to spread apart the light emitting elements on the transfer film at a third distance. The third distance may be greater than the second distance.

According to another embodiment, a transfer film stretching device includes: a transfer film support unit having a top surface configured to receive a transfer film having light emitting elements arranged thereon at a first distance; a first stretching unit outside the transfer film support unit and configured to move in one direction or another direction of a third direction while fixing an outer edge of the transfer film to stretch a width of the transfer film in an outer circumferential direction; a second stretching unit between the first stretching unit and the transfer film support unit and movable in one direction or the other direction of the third direction independently of the first stretching unit; and a third stretching unit outside the first stretching unit and movable in one direction or the other direction of the third direction independently of the first stretching unit and the second stretching unit.

The first stretching unit may include: a fixing unit configured to fix an outer circumference of the transfer film; a first vertical driving unit including a pressing frame overlapping the fixing unit in the third direction and configured to move the pressing frame in the other direction of the third direction to press the fixing unit; and a second vertical driving unit under the first vertical driving unit and configured to move in one direction or the other direction of the third direction.

The second vertical driving unit may move in the other direction of the third direction to spread apart the light emitting elements on the transfer film at a second distance.

The second stretching unit may include an auxiliary support part configured to support the transfer film mounted on the top surface and a third vertical driving unit under the auxiliary support part and configured to move in one direction or the other direction of the third direction.

The transfer film support unit may include a main support part configured to support the transfer film mounted on the top surface and a fourth vertical driving unit under the main support part and configured to move in one direction or the other direction of the third direction.

The third stretching unit may include a coupling part including a coupling frame overlapping the auxiliary support part in the third direction and a fifth vertical driving unit under the coupling part and configured to move in one direction or the other direction of the third direction. The coupling frame may include a locking protrusion protruding toward the auxiliary support part.

The auxiliary support part may have a locking groove overlapping the locking protrusion in the third direction, the second stretching unit and the transfer film support unit may have the locking groove fitted and coupled with the locking protrusion with the transfer film sandwiched therebetween and may move in one direction of the third direction to spread apart the light emitting elements on the transfer film at a second distance. The second distance may be greater than the first distance.

The third stretching unit and the second stretching unit may be are fixed and connected together by the fitting and coupling of the locking groove and the locking protrusion and may move together in the other direction of the third direction to spread apart the light emitting elements on the transfer film at a third distance. The third distance may be greater than the second distance.

The third stretching unit and the second stretching unit may be fixed and connected together by the fitting and coupling of the locking groove and the locking protrusion and may move together in the other direction of the third direction to spread apart the light emitting elements on the transfer film at the third distance.

The third stretching unit, the second stretching unit, and the transfer film support unit may be fixed and connected together by the fitting and coupling of the locking groove and the locking protrusion and may move in the other direction of the third direction to spread apart the light emitting elements on the transfer film at the third distance.

The first stretching unit, the second stretching unit, and the third stretching unit may have a cylindrical or polygonal columnar shape having an opening, the first stretching unit may be in the opening of the third stretching unit, the second stretching unit may be in the opening of the first stretching unit, and the transfer film support unit may be in the opening of the second stretching unit.

By stretching a transfer film by using a transfer film stretching device according to embodiments of the present disclosure, friction generated during stretching may not be concentrated in one place because the transfer film is stretched in a stepwise manner.

Accordingly, a component replacement cycle due to abrasion may be extended and facility operation time may be increased and productivity may be increased.

However, the aspects and features of the present disclosure are not limited to those mentioned herein, and various other aspects and features are included in this specification or would be understood by one of ordinary skill in the art.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
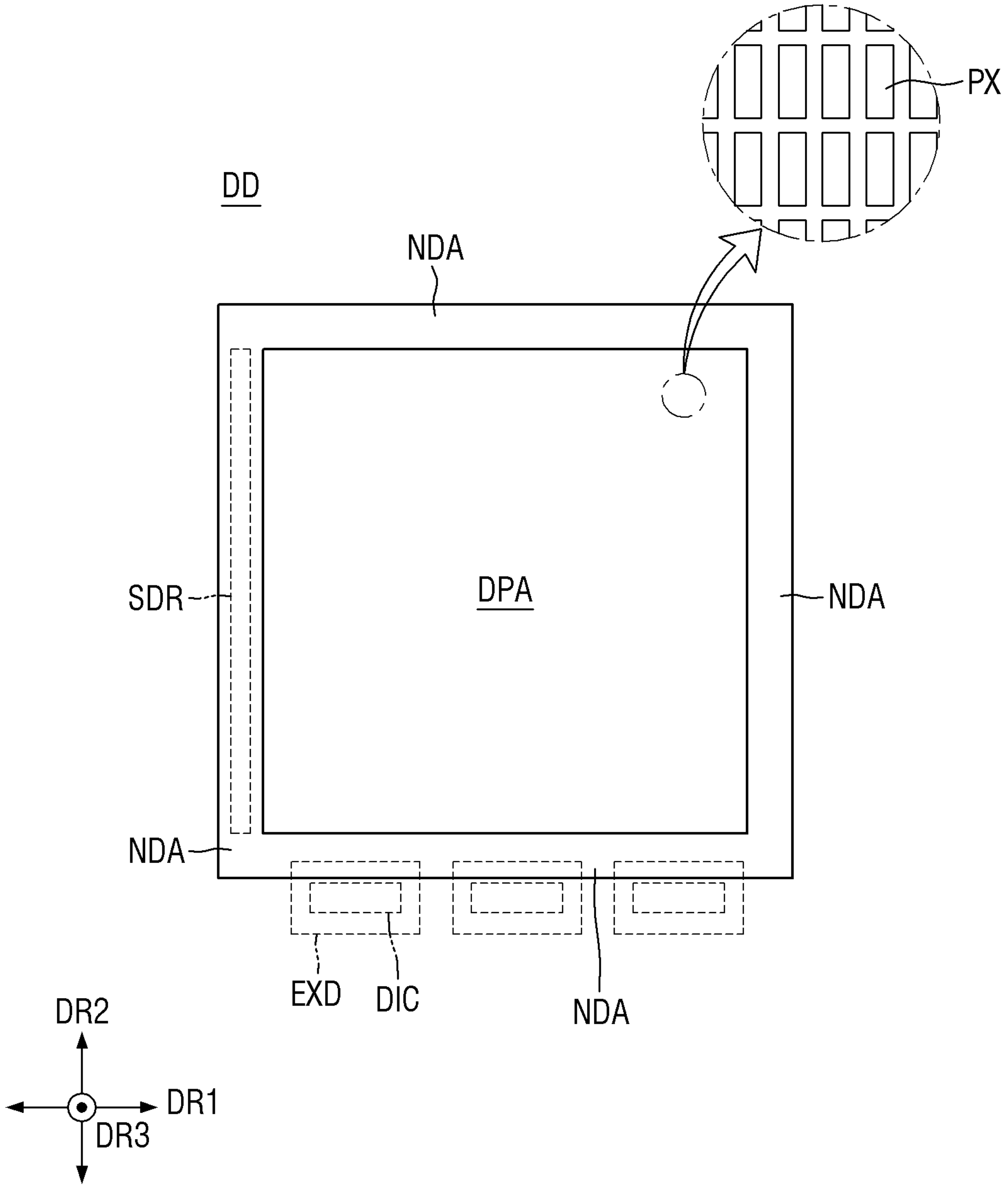
FIG. 1 is a plan view of a display device according to one embodiment.

Embodiments of the present disclosure will now be described more fully hereinafter with reference to the accompanying drawings. The embodiments may however, be provided in different forms and should not be construed as limiting. Some of the parts, components, and/or features of the described embodiments that are not necessary for one of ordinary skill in the art to fully understand the aspects and features of the present disclosure may be omitted to more clearly describe the present disclosure.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the present disclosure will be described in detail with reference to the accompanying drawings.

FIG. 1 is a plan view of a display device according to one embodiment.

Referring to FIG. 1, a display device DD, according to one embodiment, may be applied to a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances, such as a refrigerator and a washing machine, or an Internet-of-Things (IoT) device. Herein, the display device DD is shown as being a television (TV) as an example, and the TV may have a high resolution or an ultra-high resolution, such as HD, UHD, 4K, and 8K.

In addition, the display device DD, according to one embodiment, may be classified into various types according to its display method. Examples of the display device may include an organic light emitting diode (OLED) display device, an inorganic light emitting display (inorganic EL) device, a quantum dot light emitting display (QED) device, a micro-LED display device, a nano-LED display device, a plasma display device (PDP), a field emission display (FED) device, a cathode ray tube (CRT) display device, a liquid crystal display (LCD) device, an electrophoretic display (EPD) device, and the like. Hereinafter, the display device DD will be described as being a micro-LED display device as an example, and the micro-LED display device DD will be simply referred to herein as the display device DD unless special distinction is required. However, the present disclosure is not limited to a micro-LED display device, and other display devices mentioned above or known in the art may be applied within the same scope of technical spirit.

In addition, in the drawings, a first direction DR1 indicates a horizontal direction of the display device DD, a second direction DR2 indicates a vertical direction of the display device DD, and a third direction DR3 indicates a thickness direction of the display device DD. Herein, "left", "right", "upper", and "lower" indicate directions when the display device DD is viewed from above. For example, "right side" indicates one side in the first direction DR1, "left side" indicates the other side in the first direction DR1, "upper side" indicates one side in the second direction DR2, and "lower side" indicates the other side in the second direction DR2. Further, "above" indicates one side in the third direction DR3, and "below" indicates the other side in the third direction DR3.

The display device DD, according to one embodiment, may have a circular shape, an elliptical shape, or a square shape in a plan view, for example, a regular tetragonal shape. In addition, when the display device DD is a television (TV), it may have a rectangular shape with a long side positioned in the horizontal direction. However, the present disclosure is not limited thereto, and the long side of the display device 1 may extend in a vertical direction. In some cases, the display device 1 may be installed to be rotatable such that its long side is variably positioned to extend in the horizontal or vertical direction or somewhere therebetween.

The display device DD may have a display area DPA and a non-display area NDA. The display area DPA may be an active area at where an image is displayed. The display area DPA may have a square shape in a plan view similar to the overall shape of the display device DD but is not limited thereto. In some embodiments, the display area DPA may have a circular shape or an elliptical shape.

The display area DPA may include a plurality of pixels PX. The plurality of pixels PX may be arranged in a matrix. The shape of each pixel PX may be rectangular or square in a plan view. However, without being limited thereto, each pixel PX may have a rhombic shape in which each side is inclined with respect to one side direction of the display device DD. The pixels PX may include multiple color pixels PX. For example, the pixels PX may include, a first color pixel PX of red, a second color pixel PX of green, and a third color pixel PX of blue, although not limited thereto. The color pixels PX may be alternately arranged in a stripe type or a Pentile® type (e.g., an RGBG pixel structure). Pentile® is a registered trademark of Samsung Display Co., Ltd.

The non-display area NDA may be disposed around the display area DPA. The non-display area NDA may completely or partially surround the display area DPA. The display area DPA may have various shapes such as a circle shape or a square shape. The non-display area NDA may be formed to surround the periphery of the display area DPA. The non-display area NDA may be configured as a bezel of the display device DD.

A driving circuit or a driving element for driving the display area DPA may be disposed in the non-display area NDA. In one embodiment, a pad portion may be provided on a display substrate of the display device DD in the non-display area NDA disposed adjacent to a first side (e.g., the lower side in FIG. 1) of the display device DD, and an external device EXD may be mounted on pad electrodes of the pad portion. The external devices EXD may include, for example, a connection film, a printed circuit board, a driver integrated circuit (DIC), a connector, a wiring connection film, and the like. A scan driver SDR directly formed on the display substrate of the display device DD may be provided in the non-display area NDA disposed adjacent to a second side (e.g., the left side in FIG. 1) of the display device DD.

Figure 2:
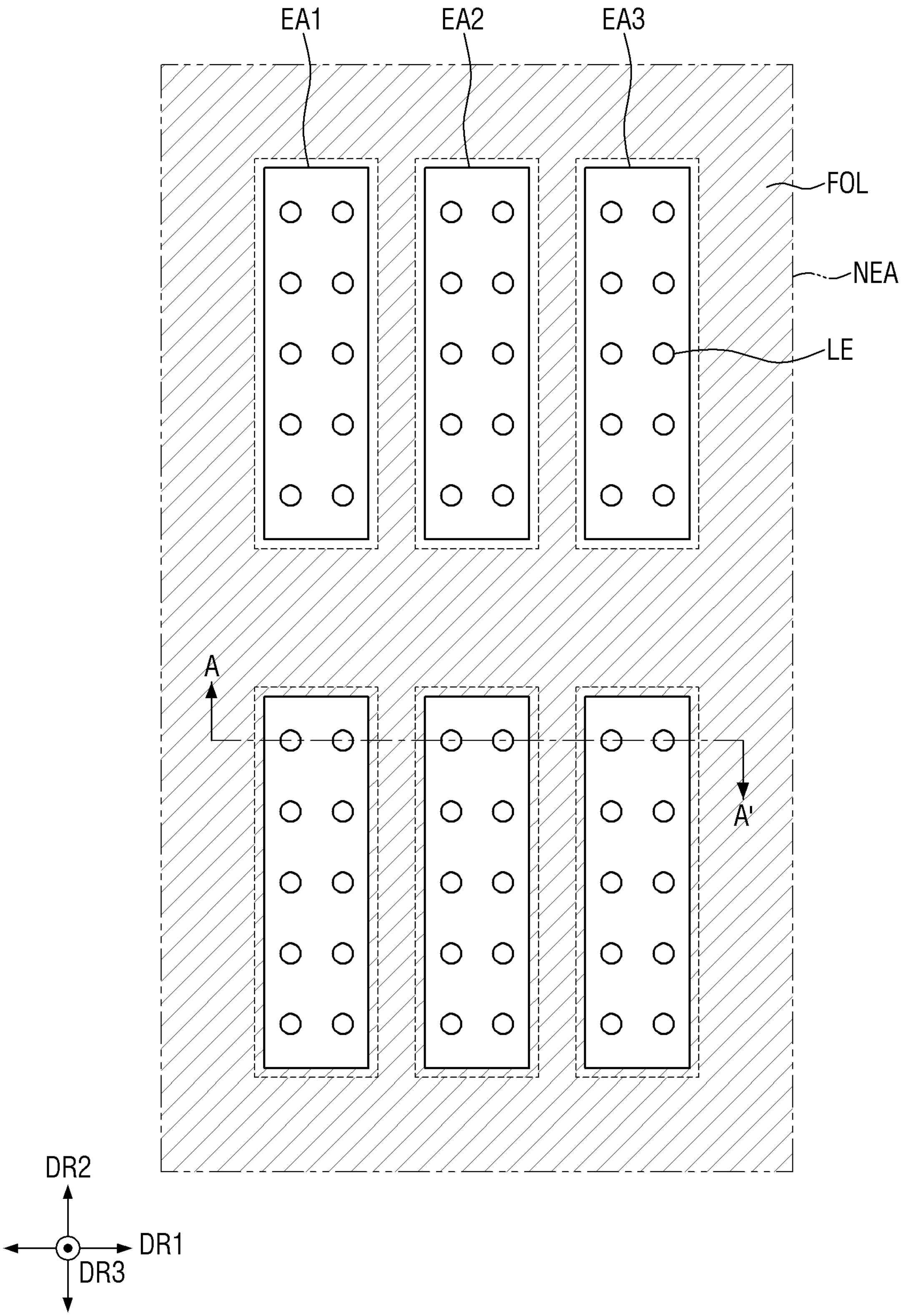
FIG. 2 is a plan view schematically illustrating an emission area of each pixel according to one embodiment.

FIG. 2 is a plan view schematically illustrating an emission area of each pixel according to one embodiment.

Referring to FIG. 2, the plurality of pixels PX may be arranged in a matrix, and the plurality of pixels PX may be divided into a first color pixel PX of red, a second color pixel PX of green, and a third color pixel PX of blue. In addition, a fourth color pixel PX of a white color may be further included.

The pixel electrode of the first color pixel PX may be positioned in a first emission area EA1 but at least a part thereof may extend to a non-emission area NEA. The pixel electrode of the second color pixel PX may be positioned in a second emission area EA2 but at least a part thereof may extend to the non-emission area NEA. The pixel electrode of the third color pixel PX may be positioned in a third emission area EA3 but at least a part thereof may extend to the non-emission area NEA. A pixel electrode of each pixel PX may penetrate at least one layer of the insulating layers to be connected to a switching element included in each pixel circuit.

A plurality of light emitting elements LE are disposed on the pixel electrode of the first emission area EA1, the pixel electrode of the second emission area EA2, and the pixel electrode of the third emission area EA3. For example, the light emitting element LE is disposed in each of the first emission area EA1, the second emission area EA2, and the third emission area EA3. In addition, a first color filter of a red color, a second color filter of a green color, and a third color filter of a blue color may be disposed on the first emission area EA1, the second emission area EA2, and the third emission area EA3 in which the plurality of light emitting elements LE are disposed, respectively. A first organic layer FOL may be disposed in the non-emission area NEA.

Figure 3:
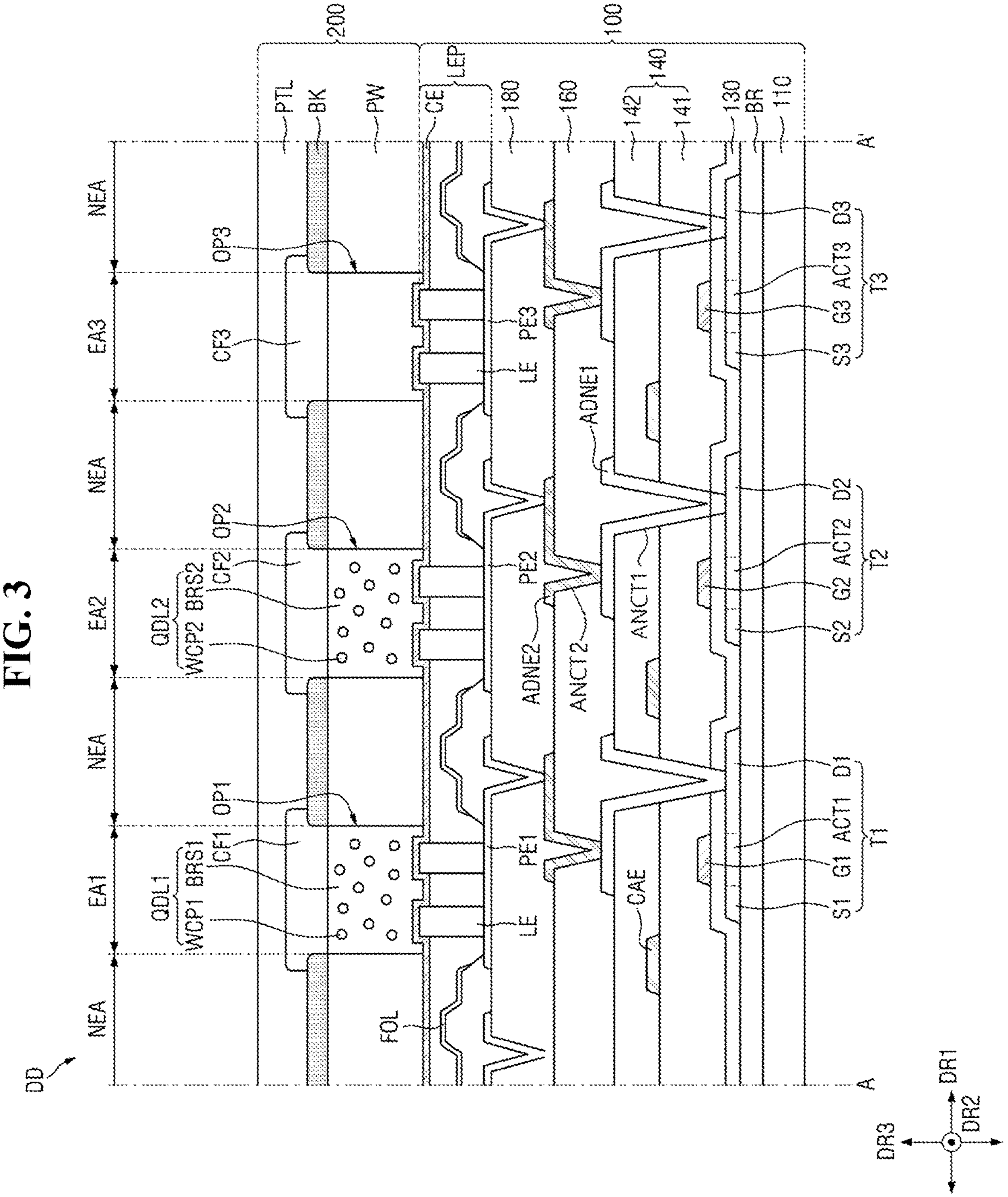
FIG. 3 is a cross-sectional view schematically illustrating a cross section taken along the line A-A' of FIG. 2 according to one embodiment.
Figure 4:
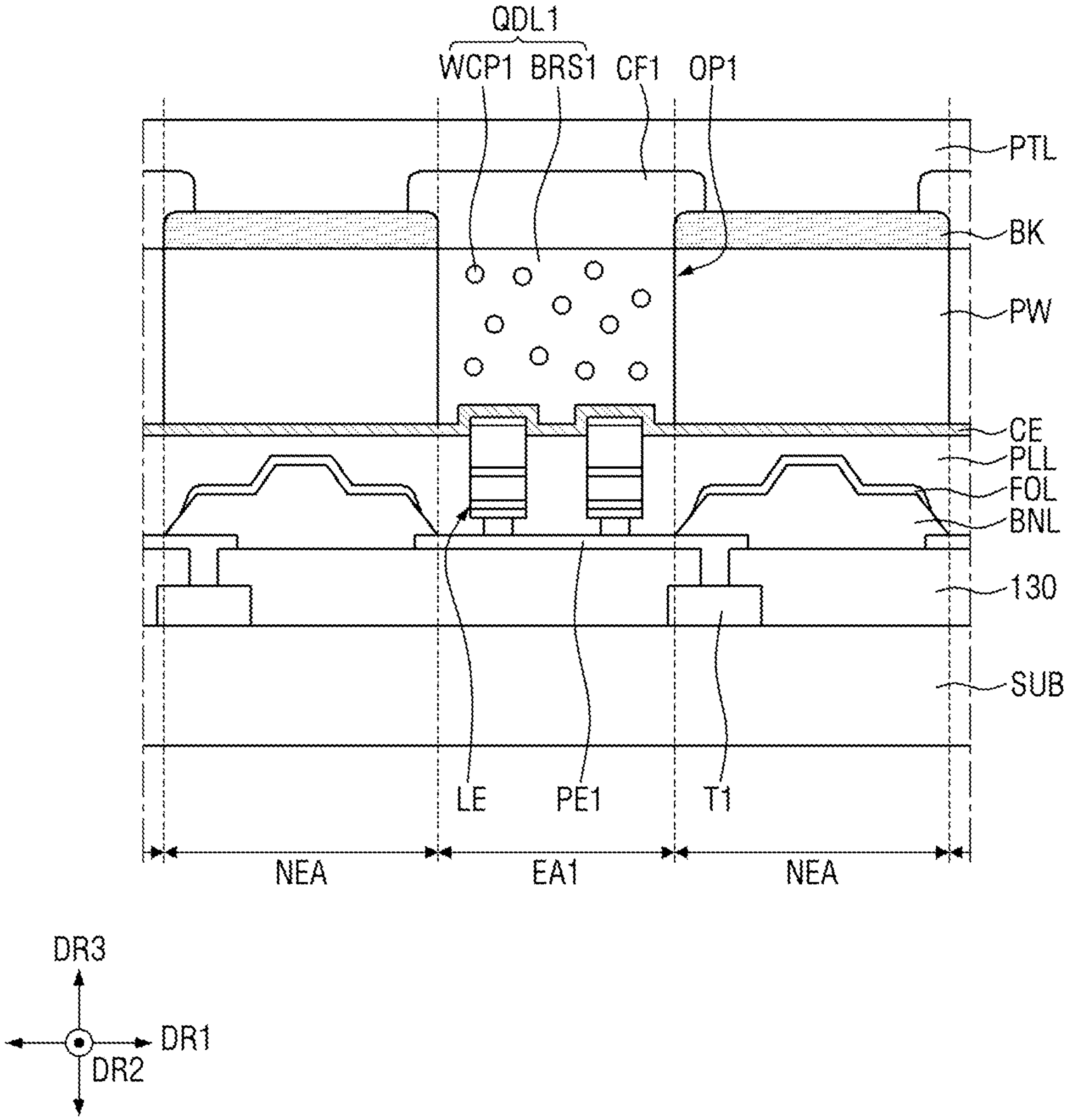
FIG. 4 is an enlarged view schematically illustrating a first emission area shown in FIG. 3.

FIG. 3 is a cross-sectional view schematically illustrating a cross section taken along the line A-A' of FIG. 2 according to one embodiment. FIG. 4 is an enlarged view schematically illustrating a first emission area shown in FIG. 3, and FIG. 5 is a cross-sectional view schematically illustrating a light emitting element shown in FIG. 4.

Figure 5:
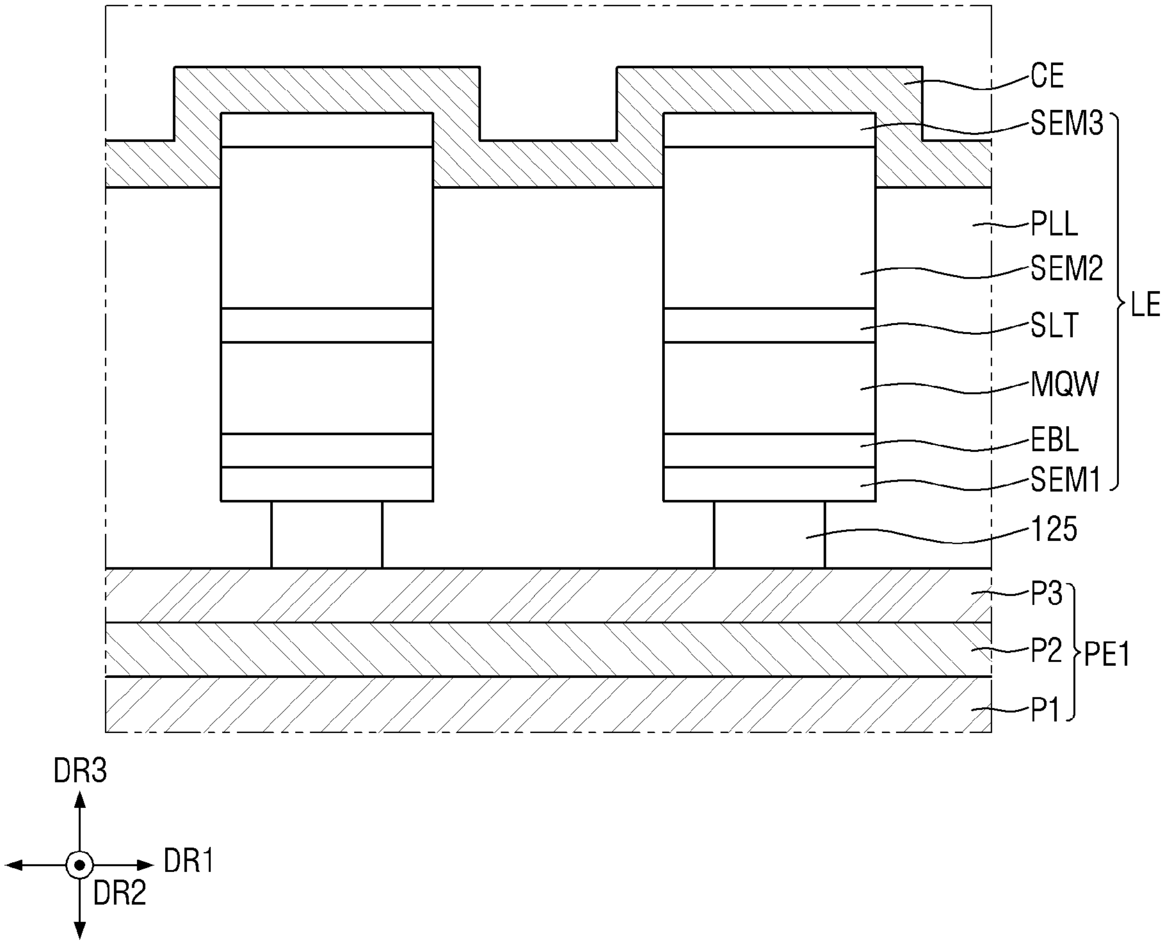
FIG. 5 is a cross-sectional view specifically illustrating a light emitting element shown in FIG. 4.

Referring to FIGS. 3 to 5, the display panel of the display device DD may include a display substrate 100 and a wavelength conversion member 200 disposed on the display substrate 100.

A barrier layer BR may be disposed on a first substrate 110 of the display substrate 100. The first substrate 110 may be formed of an insulating material, such as a polymer resin. For example, the first substrate 110 may be formed of polyimide. The first substrate 110 may be a flexible substrate that can be bent, folded, or rolled.

The barrier layer BR is a layer for protecting thin film transistors T1, T2, and T3 and a light emitting element unit LEP from moisture permeating through the first substrate 110, which is susceptible to moisture permeation. The barrier layer BR may be formed as a plurality of inorganic layers that are alternately stacked. For example, the barrier layer BR may be formed of multiple layers in which one or more inorganic layers including a silicon nitride layer, a silicon oxynitride layer, a silicon oxide layer, a titanium oxide layer, and an aluminum oxide layer are alternately stacked.

Each of the thin film transistors T1, T2, and T3 may be disposed on the barrier layer BR. Each of the thin film transistors T1, T2, and T3 includes an active layer ACTx, a gate electrode Gx, a source electrode Sx, and a drain electrode Dx (wherein x corresponds to the thin film transistor designation).

The active layer ACTx, the source electrode Sx, and the drain electrode Dx of the thin film transistors T1, T2, and T3 may be disposed on the barrier layer BR. The active layer ACTx of the thin film transistors T1, T2, and T3 includes polycrystalline silicon, monocrystalline silicon, low-temperature polycrystalline silicon, amorphous silicon, or an oxide semiconductor. The active layer ACTx, overlapping the gate electrode Gx in the third direction (e.g., the Z-axis direction), that is, the thickness direction of the first substrate 110, may be defined as a channel region. The source electrode Sx and the drain electrode Dx that do not overlap the gate electrode Gx in the third direction (e.g., the Z-axis direction) may have conductivity by doping a silicon semiconductor or an oxide semiconductor with ions or impurities.

The gate insulating layer 130 may be disposed on the active layer ACTx, the source electrode Sx, and the drain electrode Dx of the thin film transistors T1, T2, and T3. The gate insulating layer 130 may be formed of an inorganic layer, for example, a silicon nitride layer, a silicon oxynitride layer, a silicon oxide layer, a titanium oxide layer, or an aluminum oxide layer.

The gate electrode Gx of the thin film transistors T1, T2, and T3 may be arranged on the gate insulating layer 130. The gate electrode Gx may overlap the active layer ACTx in the third direction (e.g., the Z-axis direction). The gate electrode Gx may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

A first interlayer insulating layer 141 may be disposed on the gate electrode Gx of the thin film transistors T1, T2, and T3. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may be formed of a plurality of inorganic layers.

A capacitor electrode CAE may be disposed on the first interlayer insulating layer 141. The capacitor electrode CAE may overlap the gate electrode Gx of the thin film transistors T1, T2, and T3 in the third direction (e.g., the Z-axis direction). Because the first interlayer insulating layer 141 has a dielectric constant (e.g., a predetermined dielectric constant), the capacitor electrode CAE, the gate electrode Gx, and the first interlayer insulating layer 141 disposed therebetween may together form a capacitor. The capacitor electrode CAE may be formed as a single layer or multiple layers made of any one of molybdenum (Mo), aluminum (Al), chromium (Cr), gold (Au), titanium (Ti), nickel (Ni), neodymium (Nd), copper (Cu), or an alloy thereof.

A second interlayer insulating layer 142 may be disposed on the capacitor electrode CAE. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may be formed of a plurality of inorganic layers.

The first anode connection electrode ADNE1 may be disposed on the second interlayer insulating layer 142. The first anode connection electrode ADNE1 may be connected to the drain electrode Dx of the transistors T1, T2, and T3 through a first connection contact hole (e.g., a first connection contact opening) ANCT1 penetrating the gate insulating layer 130, the first interlayer insulating layer 141, and the second interlayer insulating layer 142. The first anode connection electrode ADNE1 may be formed as a single layer or multiple layers made of any one of molybdenum (Mo), aluminum (Al), chromium (Cr), gold (Au), titanium (Ti), nickel (Ni), neodymium (Nd), copper (Cu), or an alloy thereof.

A first planarization layer 160 for flattening a stepped portion formed by the thin film transistors T1, T2, and T3 (e.g., for providing a flat upper surface) may be disposed on the first anode connection electrode ADNE1. The first planarization layer 160 may be formed of an organic layer, such as an acryl resin, an epoxy resin, a phenolic resin, a polyamide resin, a polyimide resin, and the like.

A second anode connection electrode ADNE2 may be disposed on the first planarization layer 160. The second anode connection electrode ADNE2 may be connected to the first anode connection electrode ADNE1 through a second connection contact hole (e.g., a second connection contact opening) ANCT2 penetrating the first planarization layer 160. The second anode connection electrode ADNE2 may be formed as a single layer or multiple layers made of any one of molybdenum (Mo), aluminum (Al), chromium (Cr), gold (Au), titanium (Ti), nickel (Ni), neodymium (Nd), copper (Cu), or an alloy thereof.

The second planarization layer 180 may be disposed on the second anode connection electrode ADNE2. The second planarization layer 180 may be formed of an organic layer, such as acryl resin, epoxy resin, phenolic resin, polyamide resin, polyimide resin, and the like.

The light emitting element unit LEP may be formed on the second planarization layer 180. The light emitting element unit LEP may include a plurality of pixel electrodes PE1, PE2, and PE3, the plurality of light emitting elements LE, and a common electrode CE.

The plurality of pixel electrodes PE1, PE2, and PE3 may include the first pixel electrode PE1, the second pixel electrode PE2, and the third pixel electrode PE3. The first pixel electrode PE1, the second pixel electrode PE2, and the third pixel electrode PE3 may act as a first electrode of the light emitting element LE and may be an anode electrode or a cathode electrode. The first pixel electrode PE1 may be positioned in the first emission area EA1 but at least a part thereof may extend to the non-emission area NEA. The second pixel electrode PE2 may be positioned in the second emission area EA2 but at least a part thereof may extend to the non-emission area NEA. The third pixel electrode PE3 may be positioned in the third emission area EA3 but at least a part thereof may extend to the non-emission area NEA.

The first pixel electrode PE1 may penetrate the planarization layer 180 and may be connected to the first switching element T1 via the first anode connection electrode ADNE1 and the second anode connection electrode ADNE2. The second pixel electrode PE2 may penetrate the planarization layer 180 and may be connected to the second switching element T2 via the first anode connection electrode ADNE1 and the second anode connection electrode ADNE2. The third pixel electrode PE3 may penetrate the planarization layer 180 and may be connected to the third switching element T3 via the first anode connection electrode ADNE1 and the second anode connection electrode ADNE2.

The first pixel electrode PE1, the second pixel electrode PE2, and the third pixel electrode PE3 may be reflective electrodes. The first pixel electrode PE1, the second pixel electrode PE2, and the third pixel electrode PE3 may be formed of titanium (Ti), copper (Cu), or an alloy material of titanium (Ti) and copper (Cu) or may have a stacked structure of titanium (Ti) and copper (Cu). In addition, the first pixel electrode PE1, the second pixel electrode PE2, and the third pixel electrode PE3 may have a stacked structure formed by stacking a material layer having a high work function, such as titanium oxide (e.g., $TiO_2$), indium tin oxide (ITO), indium zinc oxide (IZO), zinc oxide (ZnO), indium tin zinc oxide (ITZO), or magnesium oxide (MgO), and a reflective material layer, such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), Titanium (Ti), copper (Cu), or a mixture thereof. The material layer having a high work function may be disposed above the reflective material layer and disposed closer to (or nearer to) the light emitting element LE. The first pixel electrode PE1, the second pixel electrode PE2, and the third pixel electrode PE3 may have a multilayer structure of ITO/Mg, ITO/MgF, ITO/Ag, and ITO/Ag/ITO but are not limited thereto.

A bank BNL may be positioned on the first pixel electrode PE1, the second pixel electrode PE2, and the third pixel electrode PE3. The bank BNL may have an opening exposing the first pixel electrode PE1, an opening exposing the second pixel electrode PE2, and an opening exposing the third pixel electrode PE3, and may define the first emission area EA1, the second emission area EA2, the third emission area EA3, and the non-emission area NEA. That is, an area of the first pixel electrode PE1 that is not covered by the bank BNL and is exposed therethrough may be the first emission area EA1. An area of the second pixel electrode PE2 that is not covered by the bank BNL and is exposed therethrough may be the second emission area EA2. An area of the third pixel electrode PE3 that is not covered by the bank BNL and is exposed therethrough may be the third emission area EA3. In addition, an area in which the bank BNL is positioned may be the non-emission area NEA.

The bank BNL may include an inorganic insulating material, for example, an acrylic resin, an epoxy resin, a phenolic resin, a polyamide resin, a polyimide resin, an unsaturated polyester resin, a polyphenylene resin, a polyphenylene sulfide resin, benzocyclobutene (BCB), or the like.

In one embodiment, the bank BNL may overlap the color filters CF1, CF2, and CF3 and a light blocking member BK of the wavelength conversion member 200, which will be described later. In an embodiment, the bank BNL may completely overlap the light blocking member BK. In addition, the bank BNL may overlap the first color filter CF1, the second color filter CF2, and the third color filter CF3.

The plurality of light emitting elements LE may be disposed on the first pixel electrode PE1, the second pixel electrode PE2, and the third pixel electrode PE3.

As illustrated in FIGS. 4 and 5, the light emitting element LE may be disposed in each of the first emission area EA1, the second emission area EA2, and the third emission area EA3. The light emitting element LE may be a vertical light emitting diode element elongated in the third direction DR3. That is, the length of the light emitting element LE in the third direction DR3 may be longer than the length thereof in the horizontal direction. The length in the horizontal direction indicates a length in the first direction DR1 or a length in the second direction DR2. For example, the length of the light emitting element LE in the third direction DR3 may be in a range of approximately 1 μm to approximately 5 μm.

The light emitting element LE may be a micro light emitting diode element. The light emitting element LE may include a connection electrode 125, a first semiconductor layer SEM1, an electron blocking layer EBL, an active layer MQW, a superlattice layer SLT, a second semiconductor layer SEM2, and a third semiconductor layer SEM3 in the thickness direction of the display substrate 100, that is, the third direction DR3. The connection electrode 125, the first semiconductor layer SEM1, the electron blocking layer EBL, the active layer MQW, the superlattice layer SLT, the second semiconductor layer SEM2, and the third semiconductor layer SEM3 may be sequentially stacked in the third direction DR3.

The light emitting element LE may have a cylindrical shape that wider than it is tall, a disc shape, or a rod shape. However, the present disclosure is not limited thereto, and the light emitting element LE may have various shapes, such as a rod shape, a wire shape, a tube shape, a polygonal prism, shape such as a regular cube, a rectangular parallelepiped, and a hexagonal prism, or a shape extending in one direction and having a partially inclined outer surface.

The connection electrode 125 may be disposed on each of the plurality of pixel electrodes PE1, PE2, and PE3. Hereinafter, the light emitting element LE disposed on the first pixel electrode PE1 will be described as an example, but this description is equally applicable to the second pixel electrode PE2 and the third pixel electrode PE3 except where specifically described otherwise.

Figure 7:
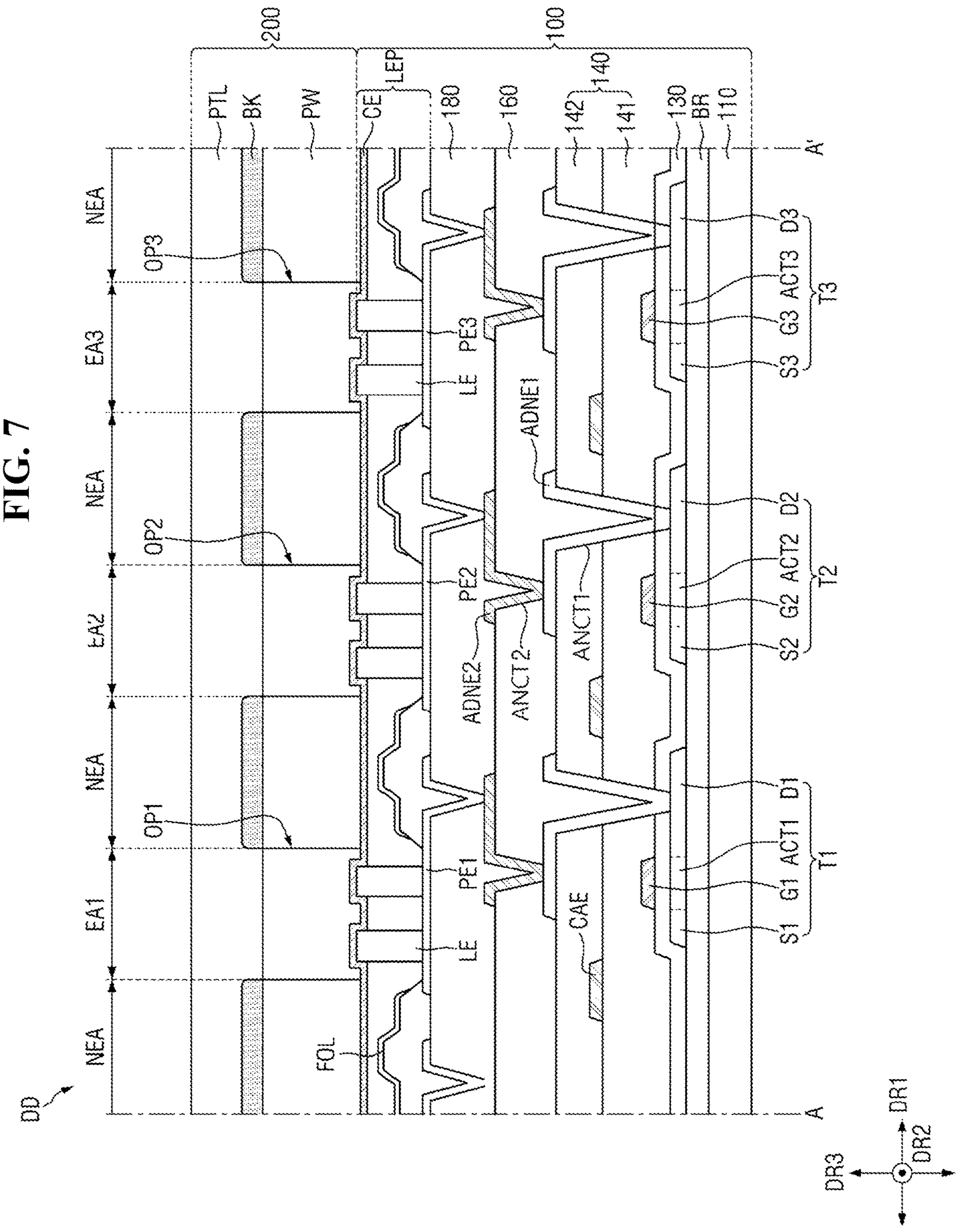
FIG. 7 is a cross-sectional view schematically illustrating a cross section taken along the line A-A' of FIG. 2 according to another embodiment.
Figure 8:
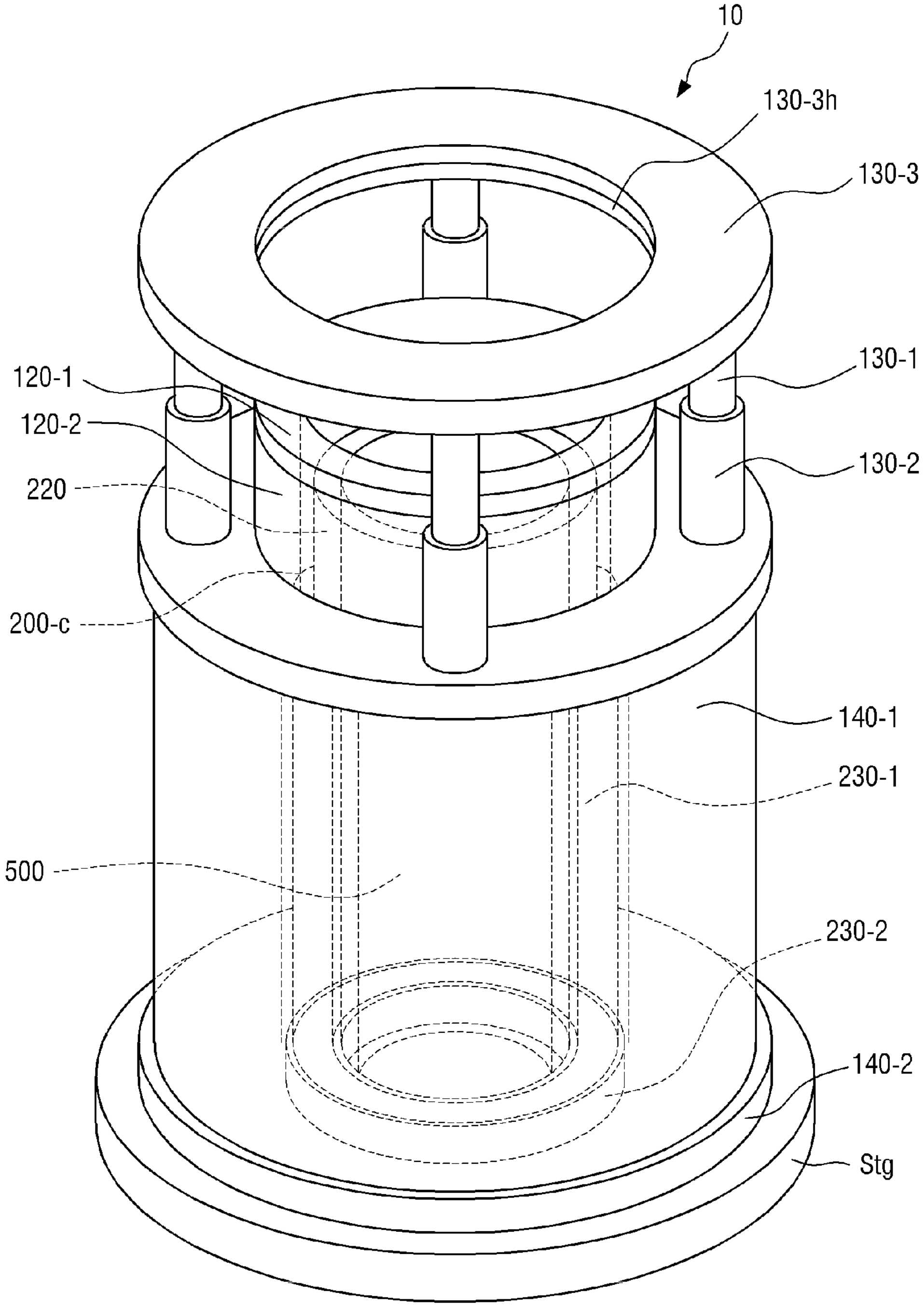
FIG. 8 is a perspective view of a transfer film stretching device according to one embodiment of the present disclosure.

The connection electrode 125 may apply an emission signal to the light emitting element LE by being adhered to the first pixel electrode PE1. The connection electrode 125 may be an ohmic connection electrode. However, the present disclosure is not limited thereto, and the connection electrode 125 may be a Schottky connection electrode. The light emitting element LE may include at least one connection electrode 125. FIGS. 7 and 8 illustrate an embodiment in which the light emitting element LE includes one connection electrode 125, but the present disclosure is not limited thereto. In some embodiments, the light emitting element LE may include a greater number of connection electrodes 125 or may omit the connection electrode 125 altogether. The following description of the light emitting element LE may be applied even when the number of connection electrodes 125 is different than one or other structures are further included.

When the light emitting element LE is electrically connected to the first pixel electrode PE1 in the display device DD, according to one embodiment, the connection electrode 125 may reduce the resistance and improve the adhesion between the light emitting element LE and the first pixel electrode PE1. The connection electrode 125 may include a conductive metal oxide. For example, the connection electrode 125 may be ITO. Because the connection electrode 125 is directly in contact with and connected to the first pixel electrode PE1, the connection electrode 125 may be made of the same material as the first pixel electrode PE1. In addition, the connection electrode 125 may selectively further include a reflective electrode made of a metal material having high reflectivity, such as aluminum (Al), or a diffusion barrier layer including nickel (Ni). Accordingly, adhesion between the connection electrode 125 and the first pixel electrode PE1 may be improved and, thus, a contact characteristic therebetween may be increased or improved.

Referring to FIG. 5, in an embodiment, the first pixel electrode PE1 may include a lower electrode layer P1, a reflective layer P2, and an upper electrode layer P3. The lower electrode layer P1 may be disposed at the lowermost portion of the first pixel electrode PE1 and may be electrically connected to the switching element. The lower electrode layer P1 may include a metal oxide and may include, for example, titanium oxide (e.g., $TiO_2$), indium tin oxide (ITO), indium zinc oxide (IZO), zinc oxide (ZnO), indium tin zinc oxide (ITZO), magnesium oxide (MgO), or the like.

The reflective layer P2 may be disposed on the lower electrode layer P1 to reflect light emitted from the light emitting element LE upwardly. The reflective layer P2 may include a metal having high reflectivity, may include, for example, silver (Ag), magnesium (Mg), aluminum (Al), platinum (Pt), lead (Pd), gold (Au), nickel. (Ni), neodymium (Nd), iridium (Ir), chromium (Cr), lithium (Li), calcium (Ca), or a mixture thereof.

The upper electrode layer P3 may be disposed on the reflective layer P2 and may be directly in contact with the light emitting element LE. The upper electrode layer P3 may be disposed between the reflective layer P2 and the connection electrode 125 of the light emitting element LE and may be directly in contact with the connection electrode 125. As described above, the connection electrode 125 is made of a metal oxide, and the upper electrode layer P3 may also be made of a metal oxide in the same way as the connection electrode 125.

The upper electrode layer P3 may be formed of titanium (Ti), copper (Cu), or an alloy material of titanium (Ti) and copper (Cu). In addition, the upper electrode layer P3 may have a stacked structure of titanium (Ti) and copper (Cu). In addition, the upper electrode layer P3 may include titanium oxide (e.g., $TiO_2$), indium tin oxide (ITO), indium zinc oxide (IZO), zinc oxide (ZnO), indium tin zinc oxide (ITZO), or magnesium oxide (MgO). In an embodiment, when the connection electrode 125 is made of ITO, the first pixel electrode PE1 may have a multilayer structure of ITO/Ag/ITO.

The first semiconductor layer SEM1 may be disposed on the connection electrode 125. The first semiconductor layer SEM1 may be a p-type semiconductor and may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer SEM1 may be any one or more of p-type doped AlGaInN, GaN, AlGaN, InGaN, AlN, and InN. The first semiconductor layer SEM1 may be doped with a p-type dopant, and the p-type dopant may be Mg, Zn, Ca, Se, Ba, or the like. For example, the first semiconductor layer SEM1 may be p-GaN doped with p-type Mg. The thickness of the first semiconductor layer SEM1 may be in a range of about 30 nm to about 200 nm but is not limited thereto.

The electron blocking layer EBL may be disposed on the first semiconductor layer SEM1. The electron blocking layer EBL may be a layer for suppressing or preventing too many electrons from flowing into the active layer MQW. For example, the electron blocking layer EBL may be p-AlGaN doped with p-type Mg. The thickness of the electron blocking layer EBL may be within a range of about 10 nm to about 50 nm, but the present disclosure is not limited thereto. Further, in some embodiments, the electron blocking layer EBL may be omitted.

The active layer MQW may be disposed on the electron blocking layer EBL. The active layer MQW may emit light by the coupling of electron-hole pairs according to an electrical signal applied through the first semiconductor layer SEM1 and the second semiconductor layer SEM2.

The active layer MQW may include a material having a single or multiple quantum well structure. When the active layer MQW contains a material having a multiple quantum well structure, the active layer MQW may have the structure in which a plurality of well layers and barrier layers are alternately laminated. In one embodiment, the well layer may be formed of InGaN and the barrier layer may be formed of GaN or AlGaN, but the present disclosure is not limited thereto. The thickness of the well layer may be in a range of approximately 1 nm to approximately 4 nm, and the thickness of the barrier layer may be in a range of approximately 3 nm to approximately 10 nm.

In other embodiments, the active layer MQW may have a structure in which semiconductor materials having large band gap energy and semiconductor materials having small band gap energy are alternately stacked and may include other group III to V semiconductor materials according to the wavelength band of the light to be emitted. The light emitted by the active layer MQW is not limited to the first light, and in some embodiments, the second light (light of the green wavelength band) or the third light (light of the red wavelength band) may be emitted.

The color of the light emitted from the active layer MQW may vary according to the indium (In) content. For example, as the indium (In) content decreases, the wavelength band of the light emitted by the active layer MQW may shift to the red wavelength band, and as the indium (In) content increases, the wavelength band of the light emitted by the active layer MQW may shift to the blue wavelength band. As one example, when the indium (In) content is less than about 15%, the active layer MQW may emit the first light in the red wavelength band having a main peak wavelength in a range of approximately 600 nm to approximately 750 nm. An another example, when the indium (In) content is about 25%, the active layer MQW may emit the second light in the green wavelength band having a main peak wavelength in a range of approximately 480 nm to approximately 560 nm. In addition, when the indium (In) content is about 35% or more, the active layer MQW may emit the third light in the blue wavelength band having a main peak wavelength in a range of approximately 370 nm to approximately 460 nm.

The superlattice layer SLT may be disposed on the active layer MQW. The superlattice layer SLT may be a layer for relieving stress between the second semiconductor layer SEM2 and the active layer MQW. For example, the superlattice layer SLT may be formed of InGaN or GaN. The thickness of the superlattice layer SLT may be in a range of about 50 nm to about 200 nm. In some embodiments, the superlattice layer SLT may be omitted altogether.

The second semiconductor layer SEM2 may be disposed on the superlattice layer SLT. The second semiconductor layer SEM2 may be an n-type semiconductor. The second semiconductor layer SEM2 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer SEM2 may be any one or more of n-type doped AlGaInN, GaN, AlGaN, InGaN, AlN, and InN. The second semiconductor layer SEM2 may be doped with an n-type dopant, and the n-type dopant may be Si, Ge, Sn, or the like. For example, the second semiconductor layer SEM2 may be n-GaN doped with n-type Si. The thickness of the second semiconductor layer SEM2 may be within a range of about 2 μm to about 4 μm, but the present disclosure is not limited thereto.

The third semiconductor layer SEM3 may be disposed on the second semiconductor layer SEM2. The third semiconductor layer SEM3 may be disposed between the second semiconductor layer SEM2 and the common electrode CE. The third semiconductor layer SEM3 may be an undoped semiconductor. The third semiconductor layer SEM3 may include (or may contain) the same material as that of the second semiconductor layer SEM2 and may include (or may contain) a material that is not doped with an n-type or p-type dopant. In an embodiment, the third common semiconductor layer SEM3 may be, but is not limited to, at least one of undoped InAlGaN, GaN, AlGaN, InGaN, AlN, or InN.

A planarization layer PLL may be disposed on the bank BNL and the plurality of pixel electrodes PE1, PE2, and PE3. The planarization layer PLL may planarize a lower step so that the common electrode CE, which will be described later, may be formed (e.g., may be smoothly formed). The planarization layer PLL may be formed to have a height (e.g., a predetermined height) so that at least a part of, for example, an upper portion of, the plurality of light emitting elements LE may protrude above the planarization layer PLL. That is, the height of the planarization layer PLL with respect to the top surface of the first pixel electrode PE1 may be smaller than the height of the light emitting element LE (e.g., the plurality of light emitting elements LE may protrude above the planarization layer PLL).

The planarization layer PLL may include an organic material to planarize the lower step. For example, the planarization layer PLL may include an acrylic resin, an epoxy resin, a phenolic resin, a polyamide resin, a polyimide resin, an unsaturated polyester resin, a polyphenylene resin, a polyphenylene sulfide resin, benzocyclobutene (BCB), or the like.

The common electrode CE may be disposed on the planarization layer PLL and the plurality of light emitting elements LE. The common electrode CE may be disposed on one surface of the first substrate 110 on which the light emitting element LE is formed and may be disposed entirely in (or entirely throughout) the display area DA and the non-display area NDA. The common electrode CE is disposed to overlap each of the emission areas EA1, EA2, and EA3 in the display area DA and may have a relatively thin thickness to allow light to be emitted therethrough.

The common electrode CE may be directly disposed on the top surface and the side surface of the plurality of light emitting elements LE. The common electrode CE may be directly in contact with the second semiconductor layer SEM2 and the third semiconductor layer SEM3 from among the side surfaces of the light emitting element LE. As illustrated in FIG. 3, the common electrode CE may be a common layer that covers the plurality of light emitting elements LE and is disposed by commonly connecting the plurality of light emitting elements LE. Because the second semiconductor layer SEM2, which has conductivity, has a patterned structure in each of the light emitting elements LE, the common electrode CE may be directly in contact with the side surface of the second semiconductor layer SEM2 of each of the light emitting elements LE so that a common voltage may be applied to each of the light emitting elements LE.

Because the common electrode CE is entirely disposed on the first substrate 110 and a common voltage is applied thereto, the common electrode CE may include a material having a low resistance. In addition, the common electrode CE may be formed to have a thin thickness to allow light to pass therethrough. For example, the common electrode CE may include a material having a low resistance, such as aluminum (Al), silver (Ag), copper (Cu), or the like. The thickness of the common electrode CE may be in a range of approximately 10 Å to approximately 200 Å but is not limited thereto.

The above-described light emitting elements LE may be supplied with a pixel voltage or an anode voltage from a pixel electrode through the connection electrode 125 and may be supplied with a common voltage through the common electrode CE. The light emitting element LE may emit light having a luminance (e.g., a predetermined luminance) according to a voltage difference between the pixel voltage and the common voltage.

By disposing the plurality of light emitting elements LE as inorganic light emitting diodes on the pixel electrodes PE1, PE2, and PE3, disadvantages of organic light emitting diodes, which are vulnerable to external moisture or oxygen, may be excluded and lifespan and reliability may be improved.

The first organic layer FOL may be disposed on the bank BNL disposed in the non-emission area NEA.

The first organic layer FOL may overlap the non-emission area NEA and may be disposed not to overlap the emission areas EA1, EA2, and EA3. The first organic layer FOL may be disposed directly on the bank BNL and may be disposed to be spaced apart from a plurality of adjacent pixel electrodes PE1, PE2, and PE3. The first organic layer FOL may be disposed on the entire first substrate 110 and may be disposed to surround the plurality of emission areas EA1, EA2, and EA3. The first organic layer FOL may be disposed in a lattice shape, overall.

The first organic layer FOL may assist with detaching the plurality of light emitting elements LE in contact with the first organic layer FOL, which is the non-emission area NEA, as will be described in connection with a fabricating process, to be described later. When the laser light is irradiated, the first organic layer FOL absorbs energy and instantaneously increases its temperature to be ablated. Accordingly, the plurality of light emitting elements LE in contact with the top surface of the first organic layer FOL may be detached from the top surface of the first organic layer FOL.

The first organic layer FOL may include (or may contain) a polyimide-based compound. The polyimide-based compound of the first organic layer FOL may have a cyano group to absorb light having a wavelength of about 308 nm, that is, to absorb laser light. In an embodiment, each of the first organic layer FOL and the bank BNL may include a polyimide-based compound but may include different polyimide-based compounds. For example, the bank BNL may be formed of a polyimide-based compound not including a cyano group, and the first organic layer FOL may be formed of a polyimide-based compound including a cyano group. The transmittance of the first organic layer FOL for laser light having a wavelength of about 308 nm may be less than the transmittance of the bank BNL. For example, the transmittance of the bank BNL is about 60% or more for the laser light while the transmittance of the first organic layer FOL may be about 0%. In addition, the absorption rate of the first organic layer FOL with respect to the laser light having a wavelength of about 308 nm may be about 100%. The first organic layer FOL may have a thickness in a range of about 2 Å to about 10 μm. When the thickness of the first organic layer FOL is about 2 Å or more, the absorption rate of the laser light having a wavelength of about 308 nm may be improved. When the thickness of the first organic layer FOL is about 10 μm or less, the height difference between the first organic layer FOL and the pixel electrode PE1 may be prevented from increasing so that the light emitting element LE may be easily adhered onto the pixel electrode in a process to be described later.

The wavelength conversion member 200 may be disposed on the light emitting element unit LEP. The wavelength conversion member 200 may include a partition wall PW, a wavelength conversion layer QDL, the color filters CF1, CF2, and CF3, the light blocking member BK, and a passivation layer PTL.

The partition wall PW may be disposed on the common electrode CE of the display area DPA and may partition the plurality of emission areas EA1, EA2, and EA2 together with the bank BNL. The partition wall PW may be disposed to extend in the first direction DR1 and the second direction DR2 and may be formed in a lattice shape pattern throughout the display area DA. Further, the partition wall PW may not overlap the plurality of emission areas EA1, EA2, and EA3 and may overlap the non-emission area NEA.

The partition wall PW may have a plurality of openings OP1, OP2, and OP3 exposing the common electrode CE. The plurality of openings OP1, OP2, and OP3 may include a first opening OP1 overlapping the first emission area EA1, a second opening OP2 overlapping the second emission area EA2, and a third opening OP3 overlapping the third emission area EA3. The plurality of openings OP1, OP2, and OP3 may correspond to the plurality of emission areas EA1, EA2, and EA3. That is, the first opening OP1 may correspond to the first emission area EA1, the second opening OP2 may correspond to the second emission area EA2, and the third opening OP3 may correspond to the third emission area EA3.

The partition wall PW may provide a space for first and second wavelength conversion layers QDL1 and QDL2 to be formed. To this end, the partition wall PW may have a thickness (e.g., a predetermined thickness). For example, the thickness of the partition wall PW may be in the range of about 1 μm to about 10 μm. The partition wall PW may include (or may contain) an organic insulating material having a thickness (e.g., a predetermined thickness). The organic insulating material may include (or may contain), for example, an epoxy resin, an acrylic resin, a cardo resin, or an imide resin.

The first wavelength conversion layer QDL1 may be disposed in each of the first openings OP1. The first wavelength conversion layer QDL1 may be formed in an island pattern as dots spaced apart from each other. The first wavelength conversion layer QDL1 may include a first base resin BRS1 and a first wavelength conversion particle WCP1. The first base resin BRS1 may include a light-transmissive organic material. For example, the first base resin BRS1 may include (or may contain) an epoxy resin, an acrylic resin, a cardo resin, or an imide resin. The first wavelength conversion particle WCP1 may be a quantum dot (QD), a quantum rod, a fluorescent material, or a phosphorescent material. For example, a quantum dot may be a particulate material that emits light of a specific color when an electron transitions from a conduction band to a valence band.

The quantum dot may be a semiconductor nanocrystal material. The quantum dot may have a specific band gap according to its composition and size. Thus, the quantum dot may absorb light and then emit light having an intrinsic wavelength. Examples of semiconductor nanocrystal of quantum dots may include a group IV nanocrystal, a group II-VI compound nanocrystal, a group III-V compound nanocrystal, a group IV-VI nanocrystal, a combination thereof, or the like.

The first wavelength conversion layer QDL1 may be formed in the first opening OP1 in the first emission area EA1. The first wavelength conversion layer QDL1 may emit light by converting or shifting the peak wavelength of incident light to another specific peak wavelength. The first wavelength conversion layer QDL1 may convert at least some of the blue light emitted from the light emitting element LE into light similar to red light, which is the first light. The first wavelength conversion layer QDL1 may emit light similar to red light and, thus, may convert the received light into red light, which is the first light, through the first color filter CF1.

The second wavelength conversion layer QDL2 may be disposed in each of the second openings OP2. The second wavelength conversion layer QDL2 may be formed in an island pattern as dots spaced apart from each other. For example, the second wavelength conversion layer QDL2 may be disposed to overlap the second emission area EA2. The second wavelength conversion layer QDL2 may include a second base resin BRS2 and a second wavelength conversion particle WCP2. The second base resin BRS2 may include (or may contain) a light-transmissive organic material. Accordingly, the second wavelength conversion layer QDL2 may emit light by converting or shifting the peak wavelength of incident light to another specific peak wavelength. The second wavelength conversion layer QDL2 may convert at least some of the blue light emitted from the light emitting element LE into light similar to green light, which is the second light. The second wavelength conversion layer QDL2 may emit light similar to green light and, thus, may convert the received light into green light, which is the second light, through the second color filter CF2.

In the third emission area EA3, only a transparent light-transmissive organic material may be formed in the third opening OP3 so that the blue light emitted from the light emitting element LE may be emitted through the third color filter CF3 as it is (e.g., without conversion).

The plurality of color filters CF1, CF2, and CF3 may be disposed on the partition wall PW and the first and second wavelength conversion layers QDL1 and QDL2. The plurality of color filters CF1, CF2, and CF3 may be disposed to overlap the plurality of openings OP1, OP2, and OP3 and the first and second wavelength conversion layers QDL1 and QDL2. The plurality of color filters CF1, CF2, and CF3 may include a first color filter CF1, a second color filter CF2, and a third color filter CF3.

The first color filter CF1 may be disposed to overlap the first emission area EA1. In addition, the first color filter CF1 may be disposed on the first opening OP1 in the partition wall PW to overlap the first opening OP1. The first color filter CF1 may transmit the first light and may absorb or block the second light and the third light. For example, the first color filter CF1 may transmit light of a red wavelength band and may absorb or block light of other wavelength bands such as green and blue.

The second color filter CF2 may be disposed to overlap the second emission area EA2. In addition, the second color filter CF2 may be disposed on the second opening OP2 in the partition wall PW to overlap the second opening OP2. The second color filter CF2 may transmit the second light and may absorb or block the first light and the third light. For example, the second color filter CF2 may transmit light of a green wavelength band and absorb or block light of other wavelength bands, such as blue and red.

The third color filter CF3 may be disposed to overlap the third emission area EA3. In addition, the third color filter CF3 may be disposed on the third opening OP3 in the partition wall PW to overlap the third opening OP3. The third color filter CF3 may transmit the third light and may absorb or block the first light and the second light. For example, the third color filter CF3 may transmit light of a blue wavelength band and absorb or block light of other wavelength bands, such as red and green.

A planar area of each of the plurality of color filters CF1, CF2, and CF3 may be larger than a planar area of each of the plurality of emission areas EA1, EA2, and EA3. For example, the first color filter CF1 may have a larger planar area than the first emission area EA1. The second color filter CF2 may have a larger planar area than the second emission area EA2. The third color filter CF3 may have a larger planar area than the third emission area EA3. However, the present disclosure is not limited thereto, and a planar area of each of the plurality of color filters CF1, CF2, and CF3 may be the same as a planar area of each of the plurality of emission areas EA1, EA2, and EA3.

Referring back to FIG. 3, the light blocking member BK may be disposed on the partition wall PW. The light blocking member BK may overlap the non-emission area NEA to block transmission of light therethrough. The light blocking member BK may be disposed approximately in a lattice shape in a plan view similar to the bank BNL or the partition wall PW. The light blocking member BK may be disposed to overlap the bank BNL, the first organic layer FOL, and the partition wall PW but may not overlap the emission areas EA1, EA2, and EA3.

In one embodiment, the light blocking member BK may include (or may contain) an organic light blocking material and may be formed by a process of coating and exposing the organic light blocking material. The light blocking member BK may include a dye or a pigment having a light blocking property, and the light blocking member BK may be a black matrix. At least a part of the light blocking member BK may overlap the adjacent color filters CF1, CF2, and CF3, and the color filters CF1, CF2, and CF3 may be disposed on at least a part of the light blocking member BK.

The passivation layer PTL may be disposed on the plurality of color filters CF1, CF2, and CF3 and the light blocking member BK. The first passivation layer PTL may be disposed on the uppermost portion of the display device DD to protect the lower plurality of color filters CF1, CF2, and CF3 and the light blocking member BK. One surface, for example, a bottom surface, of the passivation layer PTL may be in contact with the top surface of each of the plurality of color filters CF1, CF2, and CF3 and the light blocking member BK.

The passivation layer PTL may include an inorganic insulating material to protect the plurality of color filters CF1, CF2, and CF3 and the light blocking member BK. For example, the first passivation layer PTL may include silicon oxide ($SiO_x$), silicon nitride ($SiN_x$), silicon oxynitride ($SiO_xN_y$), aluminum oxide ($Al_xO_y$), aluminum nitride (AlN), or the like but is not limited thereto. The passivation layer PTL may have a thickness in a range of about 0.01 μm to about 1 μm. However, the present disclosure is not limited thereto.

Figure 6:
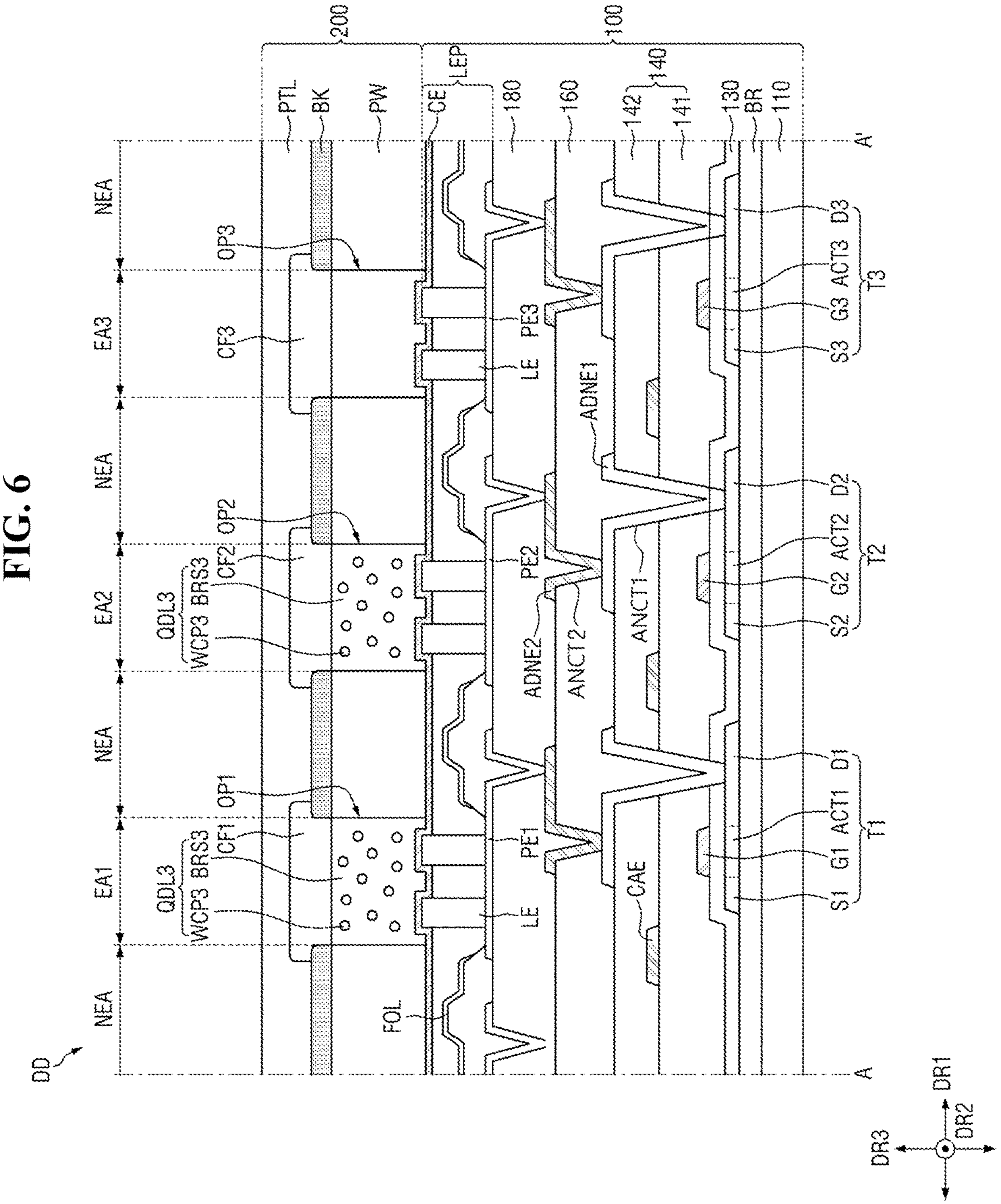
FIG. 6 is a cross-sectional view schematically illustrating a cross section taken along the line A-A' of FIG. 2 according to another embodiment.

FIG. 6 is a cross-sectional view schematically illustrating a cross section taken along the line A-A' of FIG. 2 according to another embodiment.

Referring to FIG. 6, a third wavelength conversion layer QDL3 may be disposed in each of the first and second openings OP1 and OP2.

The third wavelength conversion layer QDL3 may emit light by converting or shifting the peak wavelength of incident light to another specific peak wavelength. The third wavelength conversion layer QDL3 may convert some of the blue light emitted from the light emitting element LE into a fourth, or yellow, light. In the third wavelength conversion layer QDL3, the first light and the fourth light may be mixed to emit the fifth, or white, light. The fifth light is converted into the first light through the first color filter CF1 and is converted into the second light through the second color filter CF2 in the first emission area EA1 and the second emission area EA2, respectively.

The third wavelength conversion layer QDL3 may be disposed in each of the first and second openings OP1 and OP2 and may be disposed to be spaced apart from each other. For example, the third wavelength conversion layer QDL3 may be formed in an island pattern as dots spaced apart from each other. For example, the third wavelength conversion layer QDL3 may be disposed only in each of the first opening OP1 and the second opening OP2 in a one-to-one correspondence. In addition, the third wavelength conversion layer QDL3 may be disposed to overlap each of the first emission area EA1 and the second emission area EA2. In an embodiment, each of the third wavelength conversion layers QDL3 may completely overlap the first emission area EA1 and the second emission area EA2.

The third wavelength conversion layer QDL3 may include a third base resin BRS3 and third wavelength conversion particles WCP3. The third base resin BRS3 may include (or may contain) a light-transmissive organic material. For example, the third base resin BRS3 may include (or may contain) an epoxy resin, an acrylic resin, a cardo resin, or an imide resin.

The third wavelength conversion particle WCP3 may convert the first light incident from the light emitting element LE into the fourth light. For example, the third wavelength conversion particle WCP3 may convert light of a blue wavelength band into light of a yellow wavelength band. The third wavelength conversion particle WCP3 may be a quantum dot (QD), a quantum rod, a fluorescent material, or a phosphorescent material. For example, a quantum dot may be a particulate material that emits light of a specific color when an electron transitions from a conduction band to a valence band.

As the thickness of the third wavelength conversion layer QDL3 increases in the third direction DR3, the content (or number) of the third wavelength conversion particles WCP3 included in the wavelength conversion layer QDL increases so that the light conversion efficiency of the third wavelength conversion layer QDL3 may increase. Accordingly, the thickness of the third wavelength conversion layer QDL3 is set in consideration of the light conversion efficiency of the third wavelength conversion layer QDL3.

In the above-described third wavelength conversion layer QDL3, some of the first light emitted from the light emitting element LE may be converted into fourth light in the third wavelength conversion layer QDL3. The third wavelength conversion layer QDL3 may emit the fifth, or white, light by mixing the first light and the fourth light. For the fifth light to be emitted from the third wavelength conversion layer QDL3, the first color filter CF1, to be described later, may transmit only the first light, and the second color filter CF2 may transmit only the second light. Accordingly, the light emitted from the wavelength conversion member 200 may be the red and green light of the first light and the second light. Only a transparent light-transmissive organic material may be formed in the third opening OP3 in the third emission area EA3 so that the blue light emitted from the light emitting element LE may be emitted through the third color filter CF3 as it is. Accordingly, full colors may be produced.

FIG. 7 is a cross-sectional view schematically illustrating a cross section taken along the line A-A' of FIG. 2 according to another embodiment.

As described above, the color of the light emitted from the active layer MQW of each light emitting element LE may vary according to the indium (In) content. As the indium (In) content decreases, the wavelength band of the light emitted by the active layer MQW may shift to the red wavelength band, and as the indium (In) content increases, the wavelength band of the light emitted by the active layer MQW may shift to the blue wavelength band. Accordingly, when the indium (In) content in the active layer MQW of each light emitting element LE formed in the first emission area EA1 is about 15% or less, a first light in a red wavelength band with the main peak wavelength in a range of approximately 600 nm to 750 nm may be emitted.

When the indium (In) content in the active layer MQW of each light emitting element LE formed in the second emission area EA2 is about 25%, a second light in a green wavelength band with the main peak wavelength in a range of approximately 480 nm to 560 nm may be emitted.

When the indium (In) content in the active layer MQW of each light emitting element LE formed in the third emission area EA3 is about 35% or more, the active layer MQW may emit a third light in a blue wavelength band with the main peak wavelength in a range of approximately 370 nm to 460 nm.

In this embodiment, each light emitting element LE formed in the first emission area EA1 may emit a first light of a red wavelength band, each light emitting element LE formed in the second emission area EA2 may emit a second light of a green wavelength band, and each light emitting element LE formed in the third emission area EA3 may emit a third light of a blue wavelength band. Thus, in this embodiment, the color filters CF1, CF2, and CF3 may not be formed (or may be omitted).

Figure 9:
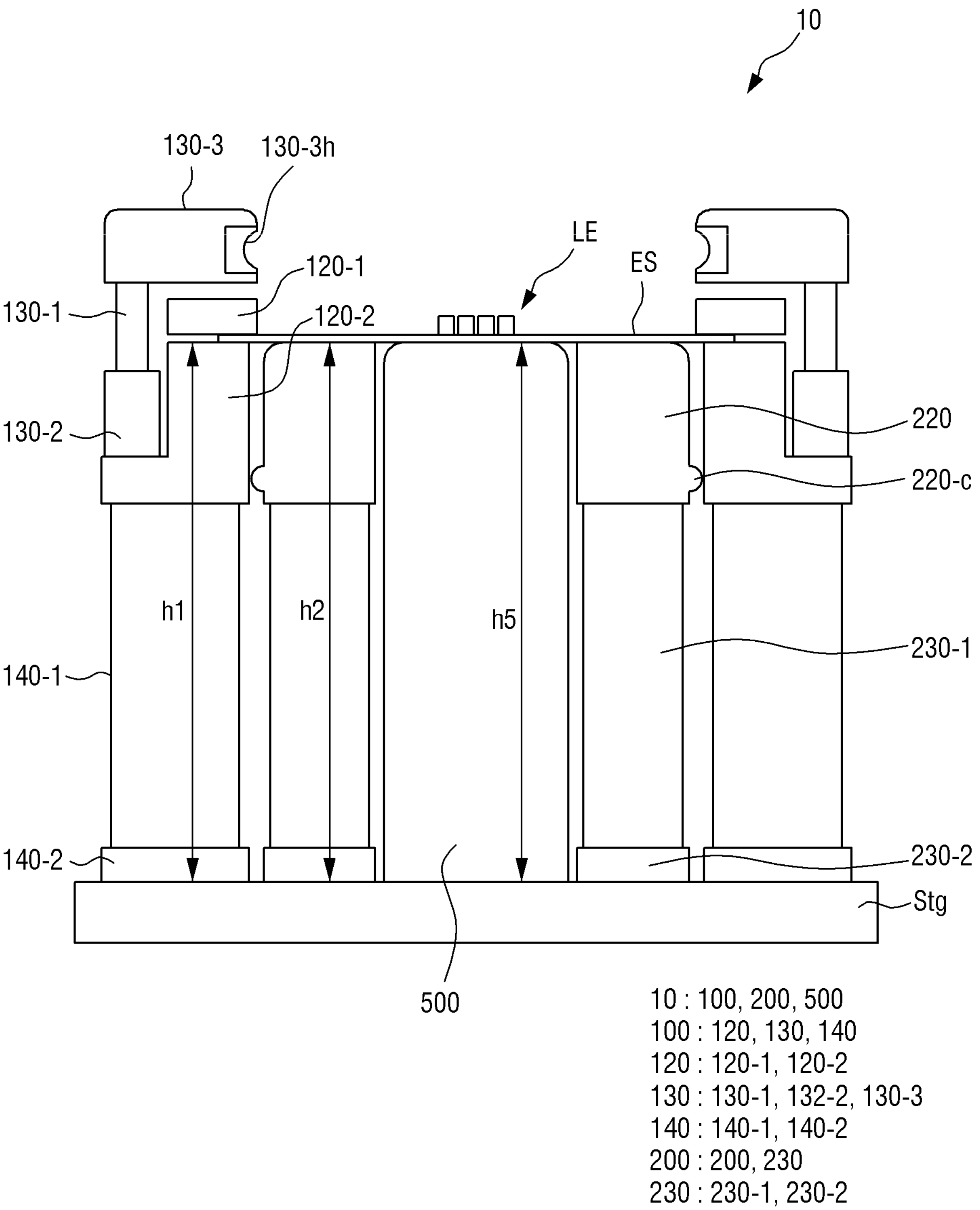
FIG. 9 is a schematic diagram of the transfer film stretching device shown in FIG. 8 according to one embodiment of the present disclosure.
Figure 10:
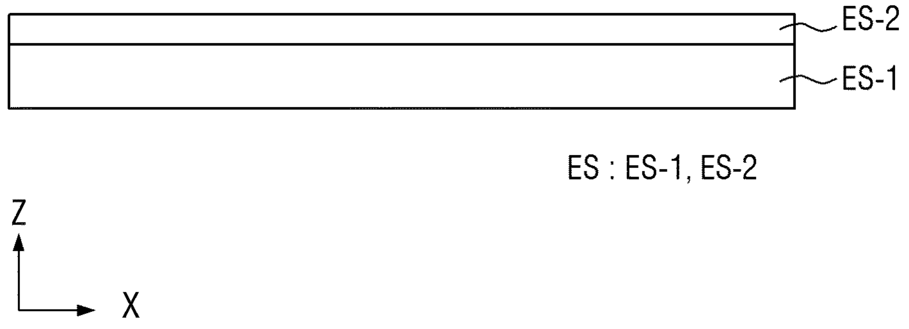
FIG. 10 is a schematic side view of a transfer film according to one embodiment of the present disclosure.
Figure 11:
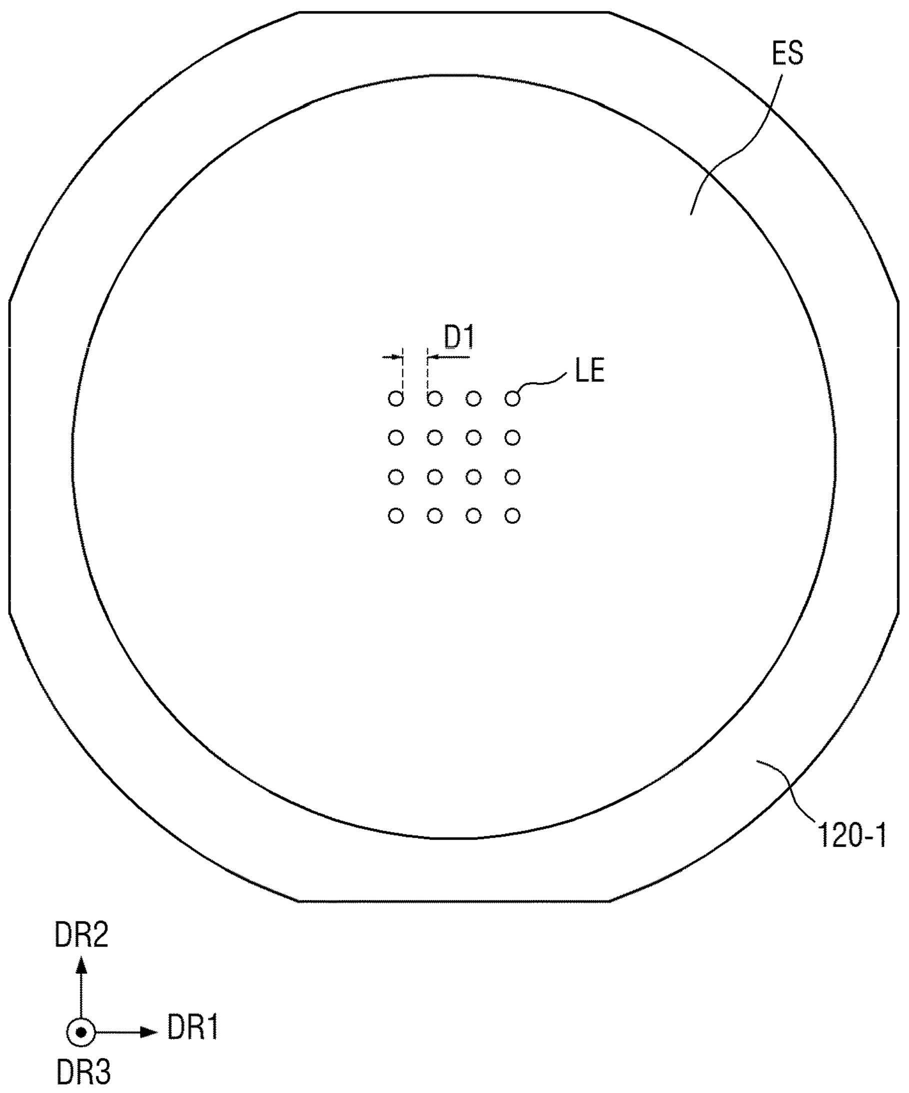
FIG. 11 is a cross-sectional view of a fixing frame and a transfer film according to one embodiment of the present disclosure.

FIG. 8 is a perspective view of a transfer film stretching device according to one embodiment of the present disclosure, and FIG. 9 is a schematic diagram illustrating the transfer film stretching device shown in FIG. 8. FIG. 10 is a schematic side view of a transfer film according to one embodiment of the present disclosure. FIG. 11 is a cross-sectional view of a fixing frame and a transfer film according to one embodiment of the present disclosure.

Referring to FIGS. 8 and 9, a transfer film stretching device 10 may include a first stretching unit 100, a second stretching unit 200, and a transfer film support unit 500.

The first stretching unit 100 and the second stretching unit 200 may have a cylindrical or polygonal columnar shape having an opening (e.g., having a central opening). The second stretching unit 200 may be disposed in the opening in the first stretching unit 100, and the transfer film support unit 500 may be disposed in the opening in the second stretching unit 200.

The transfer film support unit 500 has a cylindrical shape and supports a transfer film ES. The transfer film support unit 500 supports the transfer film ES, on which the light emitting elements LE are arranged, while the entire width of the transfer film ES fixed by a fixing frame 120-1 is stretched in an outer circumferential direction. The transfer film support unit 500 may be set and applied differently according to at least one characteristic from among the size and diameter of the transfer film ES on which the light emitting elements LE are arranged, the arrangement width or arrangement interval of the plurality of light emitting elements LE, or the stretching width of the transfer film ES.

The top surface of the transfer film support unit 500 may be formed in a disc-shaped or polygonal panel type.

Referring to FIG. 10, the transfer film ES may be made of a stretchable and elastic polymer material. The stretchable polymer material with elasticity may include, for example, polyolefin, polyvinyl chloride (PVC), elastomeric silicone, elastomeric polyurethane, elastomeric polyisoprene, or the like. The transfer film ES may include a support layer ES-1 and an adhesive layer ES-2 disposed on the support layer ES-1. The support layer ES-1 may be made of a material that is transparent to allow light to pass therethrough and has mechanical stability. For example, the support layer ES-1 may include a transparent polymer, such as polyester, polyacrylic, poly epoxy, polyethylene, polystyrene, polyethylene terephthalate, or the like. The adhesive layer ES-2 may include an adhesive material for adhesion of the light emitting element LE. For example, the adhesive material may include urethane acrylates, epoxy acrylates, polyester acrylates, or the like. The adhesive material may be a material having an adhesive strength that changes as ultraviolet (UV) or heat is applied thereto, and thus, the adhesive layer may be easily separated from the light emitting element LE.

Referring to FIG. 11, the plurality of light emitting elements LE are aligned on the transfer film ES.

The plurality of light emitting elements LE are objects to be transferred onto a circuit board. The ring-shaped fixing frame 120-1 is disposed around the outer circumference of the transfer film ES.

In another embodiment, the transfer film support unit 500 may include a fixing chuck for fixing the transfer film ES, but the present disclosure is not limited thereto. The fixing chuck may be any one of an electrostatic chuck, an adhesive chuck, a vacuum chuck, and a porous vacuum chuck. The fixing chuck may adsorb and fix the stretched transfer film ES on one surface of the transfer film support unit 500. Therefore, when a transfer head lifts the light emitting element LE attached to the transfer head, the transfer film ES may be fixed to the transfer film support unit 500 without being lifted together.

Referring back to FIG. 9, the first stretching unit 100 is disposed outside the transfer film support unit 500. The first stretching unit 100 may include a fixing unit 120, a first vertical driving unit 130, and a second vertical driving unit 140.

The fixing unit 120 may include the fixing frame 120-1 and a fixing lower part 120-2.

The fixing frame 120-1 and the fixing lower part 120-2 form a pair. The fixing frame 120-1 is disposed above the fixing lower part 120-2 to overlap the fixing lower part 120-2. Therefore, the fixing frame 120-1 may also be referred to as a fixing upper part.

The fixing frame 120-1 and the fixing lower part 120-2, which constitute the fixing unit 120, may be formed in the form of a frame or panel having a circular shape with a circular opening or a polygonal shape, such as a quadrilateral shape or the like. The fixing unit 120 may be formed in the form of a circular ring or a ring-type frame.

A height h1 of the fixing lower part 120-2 is the same as a height h5 of the transfer film support unit 500 in a ready state. The ready state is a state before the first stretching unit 100 and the second stretching unit 200 move upwardly or downwardly to perform stretching. In the ready state, the top surface of the fixing lower part 120-2 and the top surface of the transfer film support unit 500 are located on the same plane.

The first vertical driving unit 130 is disposed adjacent to the fixing unit 120 and presses the fixing unit 120 in the other direction) of the third direction (e.g., downwardly). Accordingly, the first vertical driving unit 130 fixes the fixing unit 120 to which the transfer film ES is fixed. The first vertical driving unit 130 is more distant from the transfer film support unit 500 than the fixing unit 120.

The first vertical driving unit 130 may include a pressing frame 130-3.

The pressing frame 130-3 is disposed above the fixing unit 120 to overlap the fixing unit 120 in the third direction. The pressing frame 130-3 is formed in the form of a frame or panel having a circular shape with a circular opening or a polygonal shape, such as a quadrilateral shape or the like. The pressing frame 130-3 may press and fix the outer circumference of the transfer film ES except for the opening area in a circular shape by the circular opening and the frame disposed around the opening. Although the opening structure may be formed in an elliptical shape or a polygonal shape, such as a quadrilateral shape or the like, according to the stretching direction of the transfer film ES, the outer circumference of the transfer film ES is, in one embodiment, pressed and fixed in a circular shape by applying a circular opening to make the stretching direction of the transfer film ES uniform.

The first vertical driving unit 130 may be formed of a hydraulic pumping type, such as a piston or the like, and one side thereof may be assembled to the rear surface of the pressing frame 130-3 and the other side thereof may be assembled with a pneumatic or hydraulic pressure controller. Accordingly, the first vertical driving unit 130 may move the pressing frame 130-3 in one direction or the other direction of the third direction by the pneumatic or hydraulic pressure controller.

In one embodiment, the first vertical driving unit 130 may include a first inner mast part 130-1 and a first outer mast part 130-2.

The first inner mast part 130-1 and the first outer mast part 130-2 are disposed around the fixing unit 120.

The first inner mast part 130-1 may be disposed on the first outer mast part 130-2, and the first inner mast part 130-1 may move in one direction (e.g., upwardly) and the other direction (e.g., downwardly) of the third direction while being connected with a first lift driving motor.

When the first inner mast part 130-1 moves in the other direction of the third direction, the first inner mast part 130-1 may be inserted into the first outer mast part 130-2. In one embodiment, the first inner mast part 130-1 and the first outer mast part 130-2 are used to drive the first vertical driving unit 130 in one direction or the other direction of the third direction, but the present disclosure is not limited thereto.

The pressing frame 130-3 may be disposed at the upper portion of the first vertical driving unit 130. For example, the pressing frame 130-3 is disposed above the first inner mast part 130-1, and the first inner mast part 130-1 supports the pressing frame 130-3. When the first inner mast part 130-1 moves in the other direction of the third direction, the pressing frame 130-3 moves in the other direction of the third direction together with the first inner mast part 130-1.

The pressing frame 130-3 protrudes toward the fixing frame 120-1 beyond the first inner mast part 130-1 and overlaps the fixing unit 120.

When the pressing frame 130-3 moves in the other direction of the third direction, the pressing frame 130-3 presses the fixing frame 120-1. The outer circumference of the transfer film ES is positioned between the fixing frame 120-1 and the fixing lower part 120-2. Therefore, when the pressing frame 130-3 presses the fixing frame 120-1, the fixing frame 120-1 and the fixing lower part 120-2 may fix the outer circumference of the transfer film ES.

The pressing frame 130-3 further includes a locking groove **130-3*h* on the side surface facing the second stretching unit 200, to be described later. The locking groove 130-3*h* is fitted and coupled with a locking protrusion 220-*c*, to be described later. The locking groove 130-3*h*** is made of an elastic material, such as plastic, silicon, carbon, rubber, or the like.

The second vertical driving unit 140 is disposed around the transfer film support unit 500. The second vertical driving unit 140 may be disposed under the first vertical driving unit 130 and the fixing unit 120.

The second vertical driving unit 140 is disposed under the first vertical driving unit 130.

The second vertical driving unit 140 may be formed of a hydraulic pumping type, such as a piston or the like. One side of the second vertical driving unit 140 may be assembled to the rear surface of the first vertical driving unit 130, and the other side thereof may be assembled with a pneumatic or hydraulic pressure controller. Accordingly, the second vertical driving unit 140 may move the first vertical driving unit 130 in one direction or the other direction of the third direction by the pneumatic or hydraulic pressure controller.

In one embodiment, the second vertical driving unit 140 may include a second inner mast part 140-1 and a second outer mast part 140-2.

The second inner mast part 140-1 and the second outer mast part 140-2 are disposed around the transfer film support unit 500.

The second inner mast part 140-1 may be disposed on the second outer mast part 140-2, and the second inner mast part 140-1 may move in one direction (upwardly) and the other direction (downwardly) of the third direction while being connected with a second lift driving motor.

When the second inner mast part 140-1 moves in the other direction of the third direction, the second inner mast part 140-1 may be inserted into (e.g., may be received in) the second outer mast part 140-2.

The first vertical driving unit 130 and the fixing unit 120 are disposed on the second inner mast part 140-1. Therefore, when the second inner mast part 140-1 moves in the other direction of the third direction, the first vertical driving unit 130 and the fixing unit 120 move in the other direction of the third direction together with the second inner mast part 140-1. In one embodiment, the second inner mast part 140-1 and the second outer mast part 140-2 shown as driving the second vertical driving unit 140 in one direction or the other direction of the third direction, but the present disclosure is not limited thereto.

The second stretching unit 200 is disposed between the first stretching unit 100 and the transfer film support unit 500. The second stretching unit 200 is disposed to be spaced apart from the first stretching unit 100. Further, the second stretching unit 200 is disposed to be spaced apart from the transfer film support unit 500. The second stretching unit 200 is disposed closer to the transfer film support unit 500 than the first stretching unit 100 is (e.g., the second stretching unit 200 is between the transfer film support unit 500 and the first stretching unit 100).

Therefore, when the transfer film ES is disposed on the transfer film support unit 500 and fixed by the fixing unit 120 of the first stretching unit 100, the transfer film ES is disposed on the top surface of the second stretching unit 200.

In the ready state, a height h2 of the second stretching unit 200 is the same as the height h5 of the transfer film support unit 500. In the ready state, the top surface of the second stretching unit 200 and the top surface of the transfer film support unit 500 are located on the same plane.

The second stretching unit 200 includes an auxiliary support part 220 and a third vertical driving unit 230.

The auxiliary support part 220 is adjacent to the transfer film support unit 500 and supports the transfer film ES.

The third vertical driving unit 230 may be formed of a hydraulic pumping type, such as a piston or the like, and one side thereof may be assembled to the rear surface of the auxiliary support part 220 and the other side thereof may be assembled with a pneumatic or hydraulic pressure controller. Accordingly, the third vertical driving unit 230 may move the auxiliary support part 220 in one direction or the other direction of the third direction by the pneumatic or hydraulic pressure controller.

The auxiliary support part 220 includes the locking protrusion **220-*c* protruding outwardly on one surface facing the first stretching unit 100. The locking protrusion 220-*c* protrudes toward the first stretching unit 100. When the first vertical driving unit 130 of the first stretching unit 100 moves toward the other side of the third direction, the locking protrusion 220-*c* is fitted and coupled with (or into) the locking groove 130-3*h***.

In one embodiment, the third vertical driving unit 230 may include a third inner mast part 230-1 and a third outer mast part 230-2 as a pair.

The third inner mast part 230-1 and the third outer mast part 230-2 are disposed around the transfer film support unit 500.

The third inner mast part 230-1 and the third outer mast part 230-2 may move in one direction (upwardly) and the other direction (downwardly) of the third direction while being connected to a third lift driving motor.

When the third inner mast part 230-1 moves in the other direction of the third direction, the third inner mast part 230-1 may be inserted into the third outer mast part 230-2. In one embodiment, the third inner mast part 230-1 and the third outer mast part 230-2 are shown as driving the third vertical driving unit 230 in one direction or the other direction of the third direction, but the present disclosure is not limited thereto.

Further, the first stretching unit 100, the second stretching unit 200, and the transfer film support unit 500 may be disposed on the same plane, but the present disclosure is not limited thereto.

Hereinafter, an operation of the transfer film stretching device 10 described with reference to FIGS. 8 to 11 will be described with reference to FIGS. 12 to 14.

Figure 12:
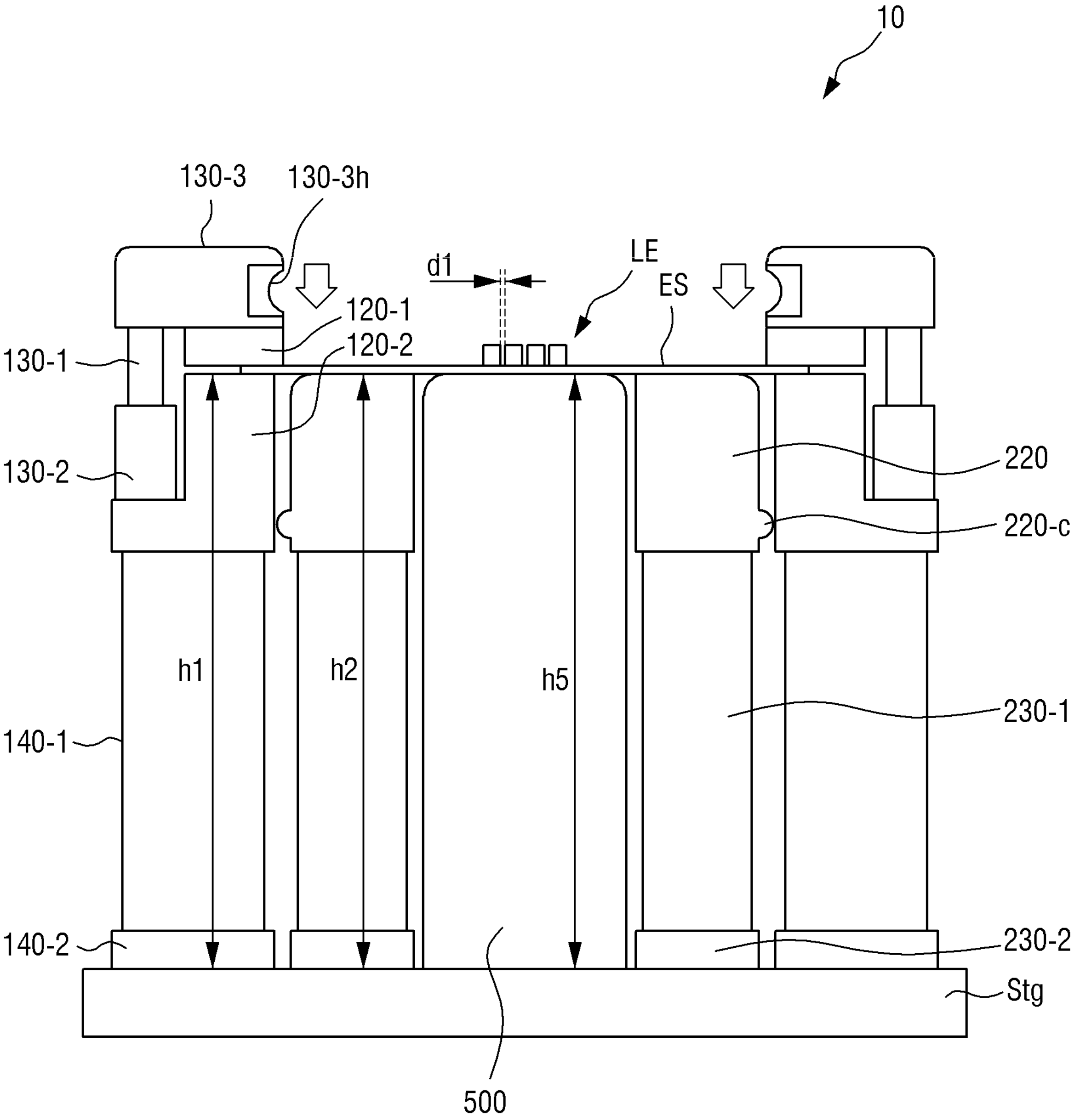
FIGS. 12 to 14 are schematic diagrams illustrating operation of the transfer film stretching device shown in FIGS. 8 and 9 according to one embodiment of the present disclosure.
Figure 13:
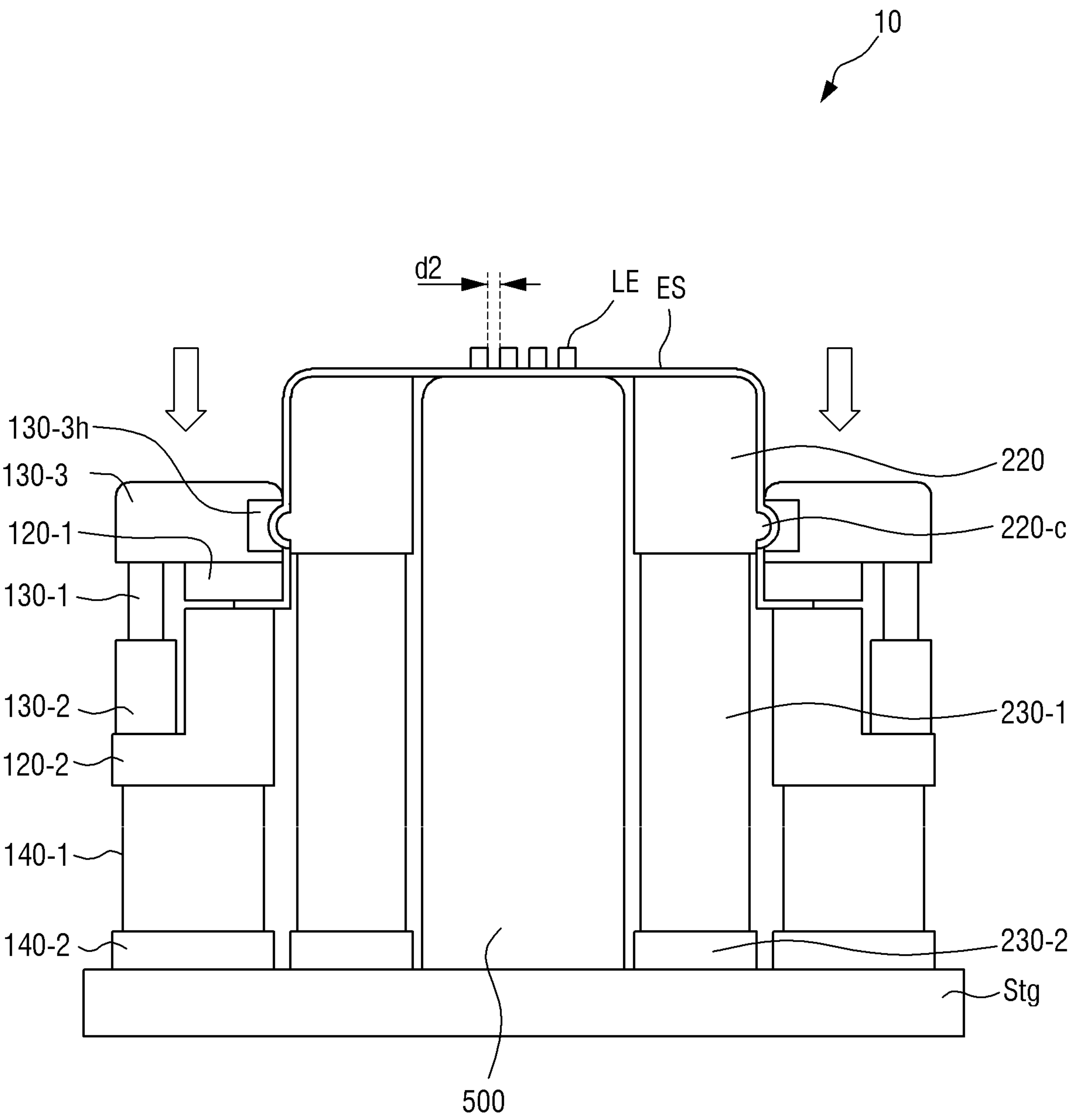
Figure 14:
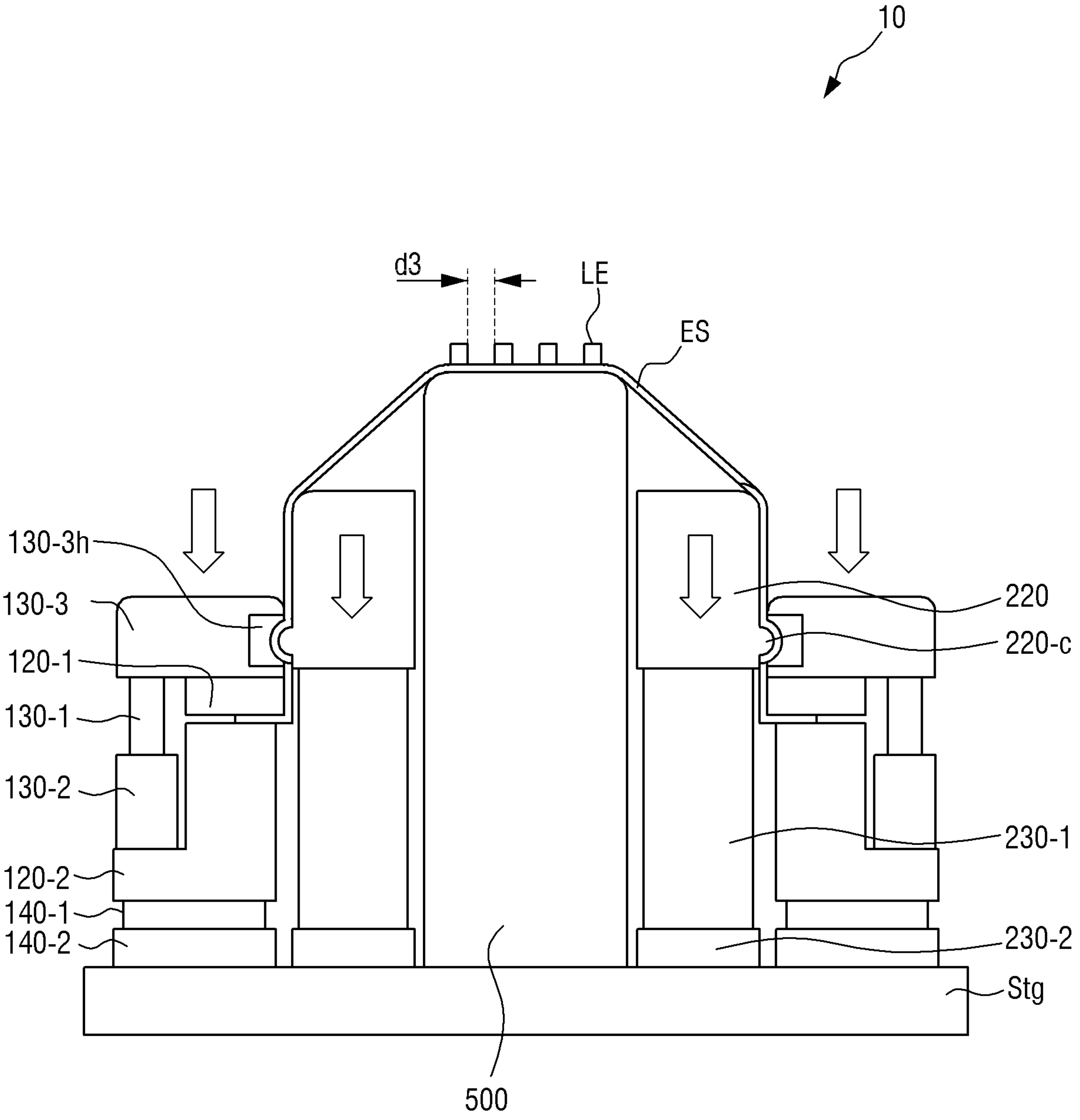

FIGS. 12 to 14 are schematic diagrams illustrating operation of the transfer film stretching device 10 according to one embodiment of the present disclosure.

First, referring to FIG. 12, in the transfer film stretching device 10, the first vertical driving unit 130 moves in the other direction of the third direction (downwardly) so that the pressing frame 130-3 presses the fixing frame 120-1. Accordingly, the outer circumference of the transfer film ES is fixed to the fixing lower part 120-2 so that the transfer film ES is prevented from deviating from the transfer film support unit 500 when the components of the transfer film stretching device 10 move upwardly or downwardly for stretching. On the transfer film ES, the plurality of light emitting elements LE are disposed to be spaced apart from each other at a first distance d1. The center of the transfer film ES and the outer circumferential area of the transfer film ES, which is fixed by the fixing frame 120-1, are located on the same plane (e.g., the transfer film ES is flat).

Referring to FIG. 13, in the transfer film stretching device 10, the second vertical driving unit 140 moves in the other direction of the third direction (downwardly) so that the top surface of the fixing lower part 120-2 is disposed lower than the top surface of the transfer film support unit 500. Accordingly, the transfer film ES is stretched (e.g., primarily stretched), and the plurality of light emitting elements LE disposed on the transfer film ES are spaced apart from each other at a second distance d2. The second distance d2 is greater than the first distance d1. The center of the transfer film ES is located on a plane different from the plane on which the outer circumferential area of the transfer film ES is located. The center of the transfer film ES may be located higher than the outer circumferential area of the transfer film ES.

When the second vertical driving unit 140 moves in the other direction of the third direction (downwardly), the first vertical driving unit 130 disposed on the second vertical driving unit 140 also moves in the other direction of the third direction (downwardly). The first vertical driving unit 130 moves in the other direction of the third direction until the locking groove **130-3*h* in the pressing frame 130-3 included in the first vertical driving unit 130 is fitted and coupled with the locking protrusion 220-*c* of the second stretching unit 200. The locking groove 130-3*h* in the pressing frame 130-3 is fitted and coupled with the locking protrusion 220-*c* of the second stretching unit 200 so that the first stretching unit 100 and the second stretching unit 200** are fixed and connected.

Next, referring to FIG. 14, in the transfer film stretching device 10, the first stretching unit 100 and the second stretching unit 200, which are fixed and connected together, move in the other direction of the third direction (downwardly). For example, the second vertical driving unit 140 of the first stretching unit 100 and the third vertical driving unit 230 of the second stretching unit 200 move in the other direction of the third direction (downwardly). The moving speeds of the second vertical driving unit 140 and the third vertical driving unit 230 are set to be the same. Accordingly, the transfer film ES is stretched (e.g., is further or secondarily stretched), and the plurality of light emitting elements LE disposed on the transfer film ES are spaced apart from each other at a third distance d3. The third distance d3 is greater than the second distance d2.

The top surface of the transfer film support unit 500, the top surface of the second stretching unit 200, and the top surface of the first stretching unit 100 are each located on different planes. Further, the top surface of the transfer film support unit 500, the top surface of the auxiliary support part 220, and the top surface of the fixing lower part 120-2 are each located on different planes.

When the separation distance between the light emitting elements LE reaches a desired distance, the movement of the second vertical driving unit 140 of the first stretching unit 100 and the movement of the third vertical driving unit 230 of the second stretching unit 200 are stopped.

The transfer film stretching device 10, according to one embodiment, may stretch the transfer film ES in a stepwise manner so that the light emitting elements LE may be arranged at precise and accurate intervals. Further, friction caused by stretching the transfer film ES is prevented from being concentrated in one place. Accordingly, the component replacement cycle due to abrasion may be extended, which makes it possible to increase a facility operation time and increase productivity.

Further, the height of the transfer film stretching device 10 may be reduced compared to related designs in which the light emitting elements are spaced apart from each other at a final interval in a single stretching process.

Figure 15:
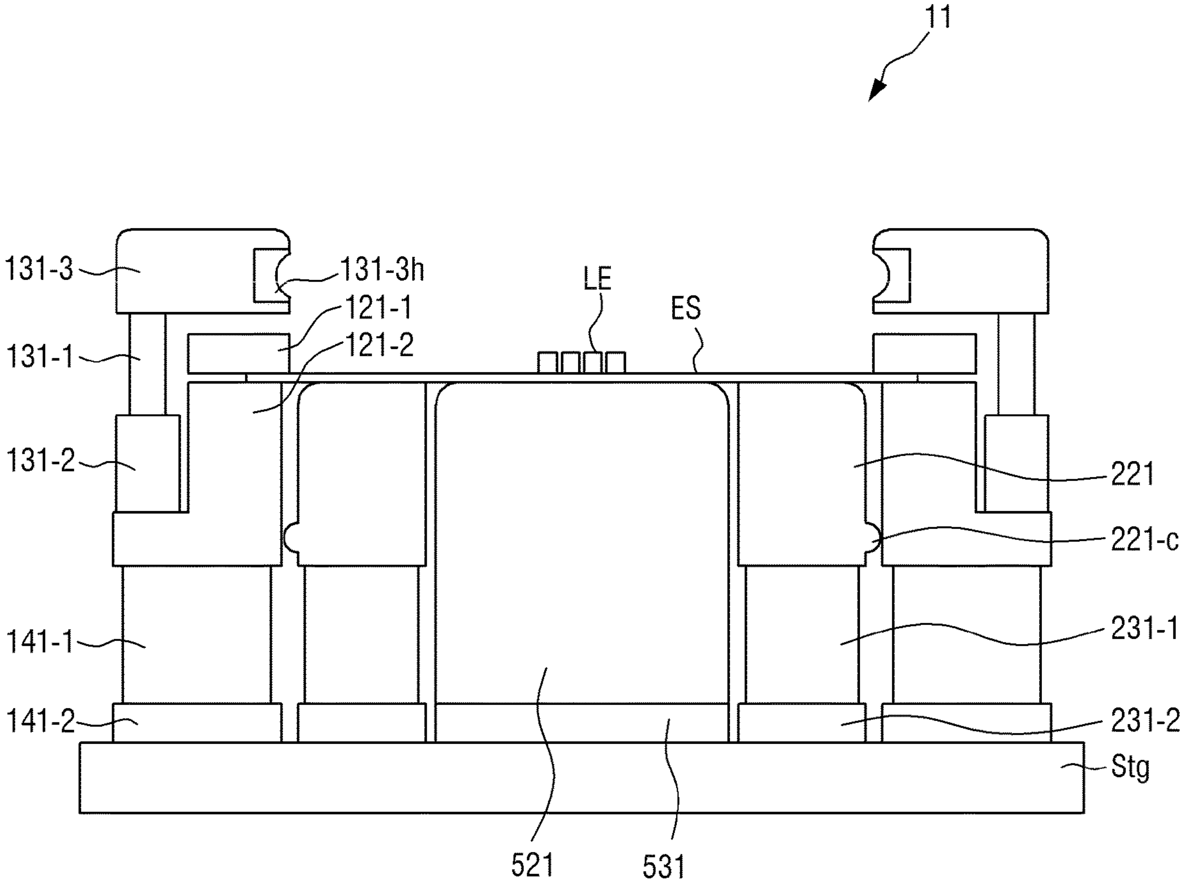
FIG. 15 is a schematic diagram illustrating a transfer film stretching device according to another embodiment of the present disclosure.
Figure 16:
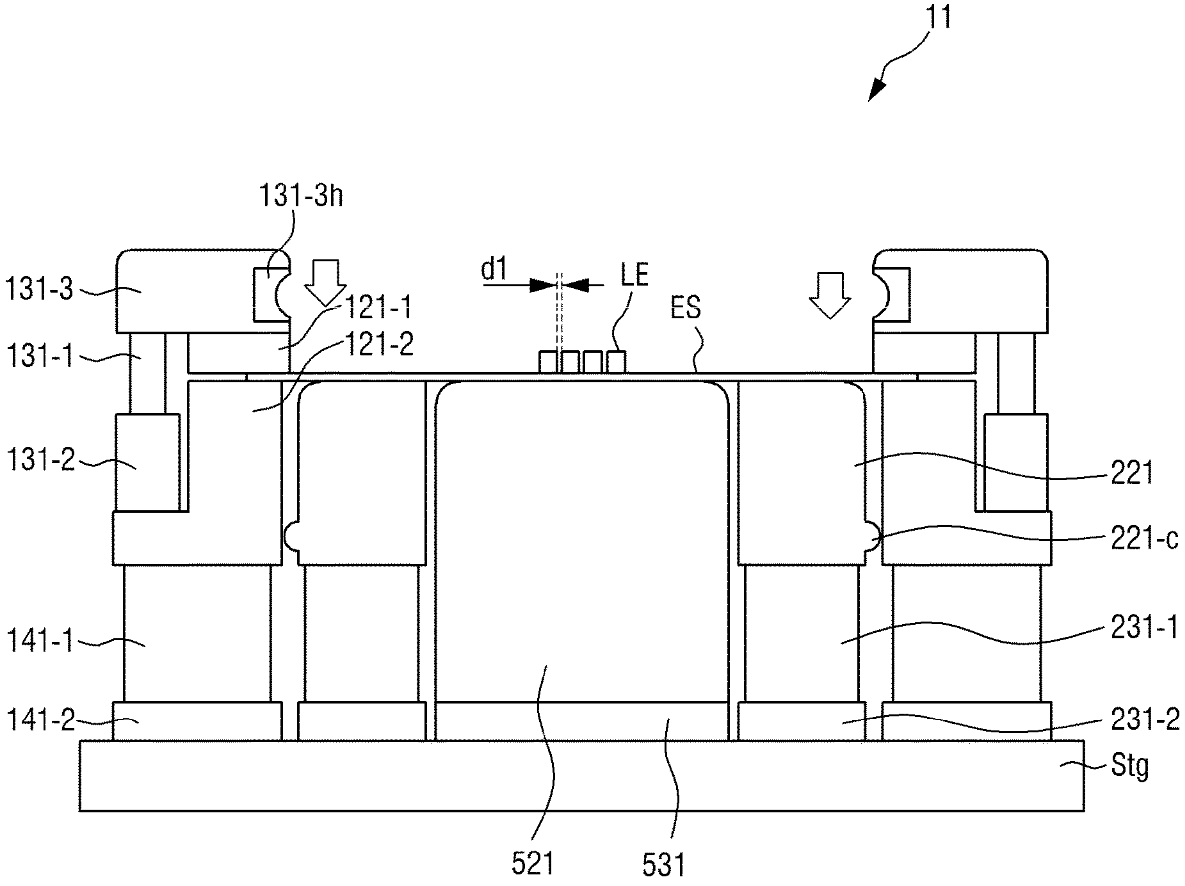
FIGS. 16 to 18 are schematic diagrams illustrating operation of the transfer film stretching device shown in FIG. 15 according to another embodiment of the present disclosure.
Figure 17:
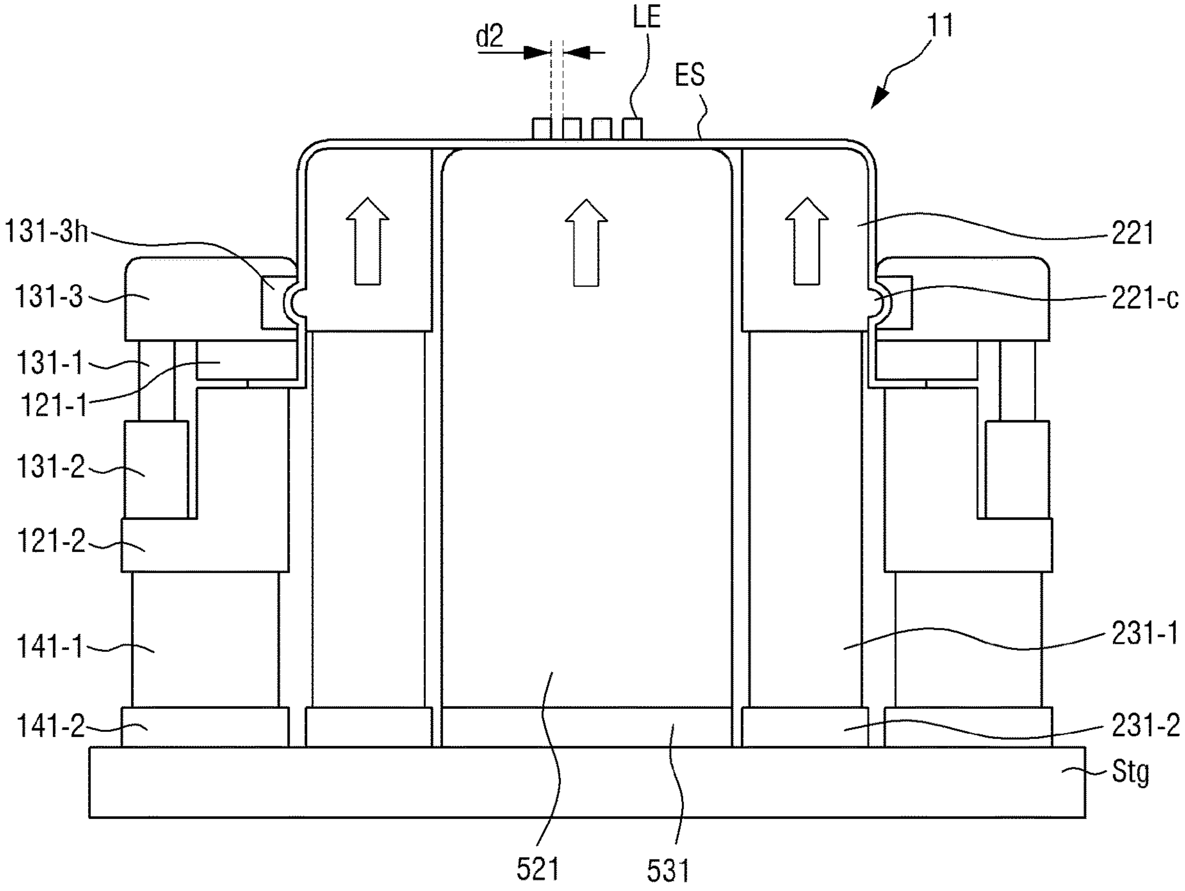
Figure 18:
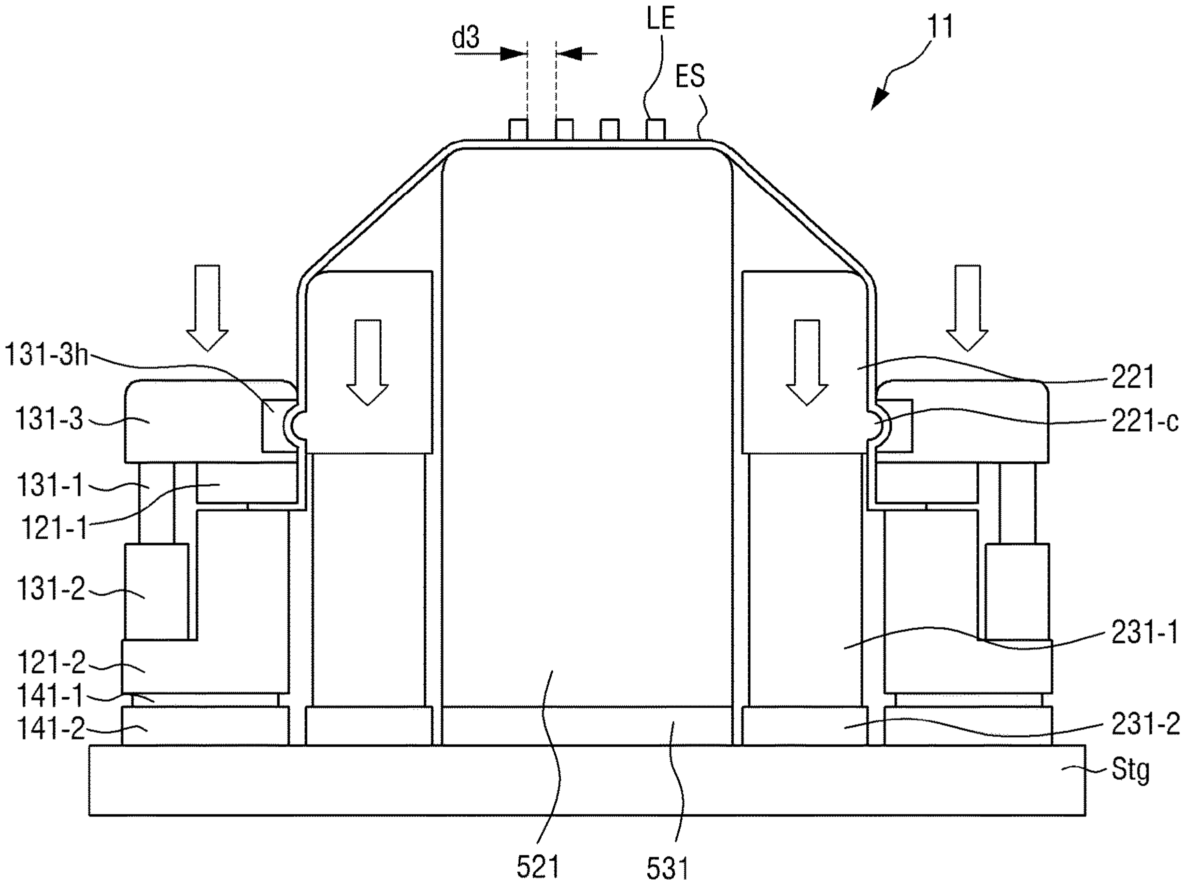

FIG. 15 is a schematic diagram illustrating a transfer film stretching device according to another embodiment of the present disclosure, and FIGS. 16 to 18 are schematic diagrams illustrating the operation of the transfer film stretching device shown in FIG. 15.

A transfer film stretching device 11 shown in FIG. 15 is different from the transfer film stretching device 10 shown in FIG. 9 in that a transfer film support unit 501 includes a main support part 521 and a fourth vertical driving unit 531.

Referring to FIG. 15, the transfer film stretching device 11 may include a first stretching unit 101, a second stretching unit 201, and the transfer film support unit 501.

The transfer film support unit 501 includes the main support part 521 and the fourth vertical driving unit 531.

The main support part 521 supports the transfer film ES on which the light emitting elements LE are arranged. The main support part 521 supports the transfer film ES while the transfer film ES fixed by a fixing frame 121-1 is being stretched across the entire width in an outer circumferential direction. The degree of stretching may be set and applied differently according to at least one characteristic from among the size and diameter of the transfer film ES on which the light emitting elements LE are arranged, the arrangement width or arrangement interval of the plurality of light emitting elements LE, or the stretching width of the transfer film ES.

The top surface of the main support part 521 may be formed in a disc-shaped or polygonal panel type.

The fourth vertical driving unit 531 may be formed of a hydraulic pumping type, such as a piston or the like. One side of the fourth vertical driving unit 531 may be assembled to the rear surface of the main support part 521, and the other side thereof may be assembled with a pneumatic or hydraulic pressure controller. Accordingly, the fourth vertical driving unit 531 may move the main support part 521 in one direction or the other direction of the third direction by the pneumatic or hydraulic pressure controller. The main support part 521 moves in one direction or the other direction of the third direction so that the transfer film ES disposed on the main support part 521 may be stretched.

Because the first stretching unit 101 is similar to the first stretching unit 100 shown in FIG. 9 and the second stretching unit 201 is similar to the second stretching unit 200 shown in FIG. 9, a detailed description thereof will be omitted.

However, in the ready position, the height of the transfer film stretching device 11 may be lower than the height of the transfer film stretching device 10 shown in FIG. 9.

Next, an operation of the transfer film stretching device 11 will be described with reference to FIGS. 16 to 18.

FIGS. 16 to 18 are schematic diagrams illustrating the operation of a transfer film stretching device according to another embodiment of the present disclosure.

First, referring to FIG. 16, in the transfer film stretching device 11, the first vertical driving unit 131 moves in the other direction of the third direction (downwardly) so that the pressing frame 131-3 presses the fixing frame 121-1. Accordingly, the outer circumference of the transfer film ES is fixed to the fixing lower part 121-2 so that the transfer film ES is prevented from deviating from the transfer film support unit 501 when the components of the transfer film stretching device 11 move upwardly or downwardly for stretching. On the transfer film ES, the plurality of light emitting elements LE are disposed to be spaced apart from each other at the first distance d1. The center of the transfer film ES and the outer circumferential area of the transfer film ES fixed by the fixing frame 121-1 are located on the same plane (e.g., the transfer film ES is flat).

Referring to FIG. 17, in the transfer film stretching device 11, the second stretching unit 201 and the transfer film support unit 501 move in one direction of the third direction (upwardly) so that the top surface of the main support part 521 and the top surface of an auxiliary support part 221 are disposed higher than the top surface of the fixing lower part 121-2. For example, a third vertical driving unit 231 of the second stretching unit 201 and the fourth vertical driving unit 531 of the transfer film support unit 501 move in one direction of the third direction (upwardly) so that the top surface of the fixing lower part 121-2 is disposed lower than the top surface of the transfer film support unit 501.

While the second stretching unit 201 and the transfer film support unit 501 are moving in one direction of the third direction (upwardly), the moving speeds of the third vertical driving unit 231 and the fourth vertical driving unit 531 are set to be the same. Accordingly, while the second stretching unit 201 and the transfer film support unit 501 are moving in one direction of the third direction (upwardly), the top surface of the main support part 521 and the top surface of the auxiliary support part 221 are constantly located on the same plane.

After moving, the top surface of the main support part 521 and the top surface of the auxiliary support part 221 are disposed higher than the top surface of the fixing lower part 121-2 so that the transfer film ES is stretched (e.g., primarily stretched) and the plurality of light emitting elements LE disposed on the transfer film ES are spaced apart from each other at the second distance d2. The second distance d2 is greater than the first distance d1. The center of the transfer film ES is located on a plane different from the plane on which the outer circumferential area of the transfer film ES fixed by the fixing frame 121-1 is located. The center of the transfer film ES may be disposed higher than the outer circumferential area of the transfer film ES.

When the third vertical driving unit 231 moves in one direction of the third direction (upwardly), the auxiliary support part 221 disposed on the third vertical driving unit 231 also moves in one direction of the third direction (upwardly). The auxiliary support part 221 moves in one direction of the third direction (upwardly) until the locking protrusion 221-*c* of the auxiliary support part 221 is fitted and coupled with the locking groove 131-3*h* of the pressing frame 130-3 that is formed in the first vertical driving unit 131. The locking protrusion 221-*c* of the auxiliary support part 221 is fitted and coupled with the locking groove 131-3*h* of the pressing frame 130-3 that is formed in the first vertical driving unit 131 so that the first stretching unit 101 and the second stretching unit 201 are fixed and connected.

Next, referring to FIG. 18, in the transfer film stretching device 11, the first stretching unit 101 and the second stretching unit 201, which are fixed and connected together, move in the other direction of the third direction (downwardly). For example, the second vertical driving unit 141 of the first stretching unit 101 and the third vertical driving unit 231 of the second stretching unit 201 move in the other direction of the third direction (downwardly). The moving speeds of the second vertical driving unit 140 and the third vertical driving unit 230 are the same. Accordingly, the transfer film ES is stretched (e.g., is further or secondarily stretched), and the plurality of light emitting elements LE disposed on the transfer film ES are spaced apart from each other at the third distance d3. The third distance d3 is greater than the second distance d2.

When the separation distance between the third light emitting elements reaches a desired distance, the movement of the second vertical driving unit 141 of the first stretching unit 101 and the movement of the third vertical driving unit 231 of the second stretching unit 201 are stopped.

Figure 19:
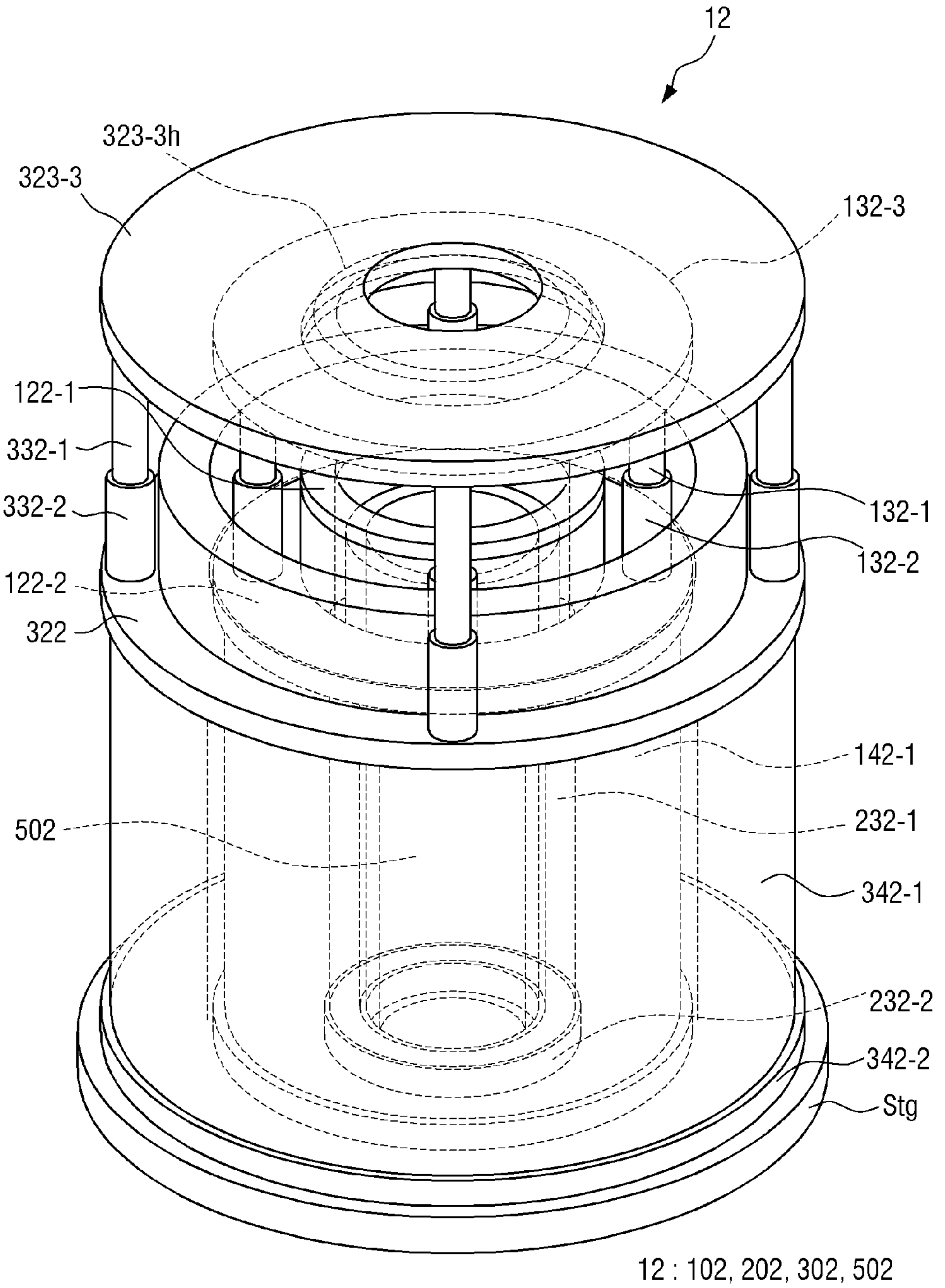
FIG. 19 is a perspective view of a transfer film stretching device according to another embodiment of the present disclosure.
Figure 20:
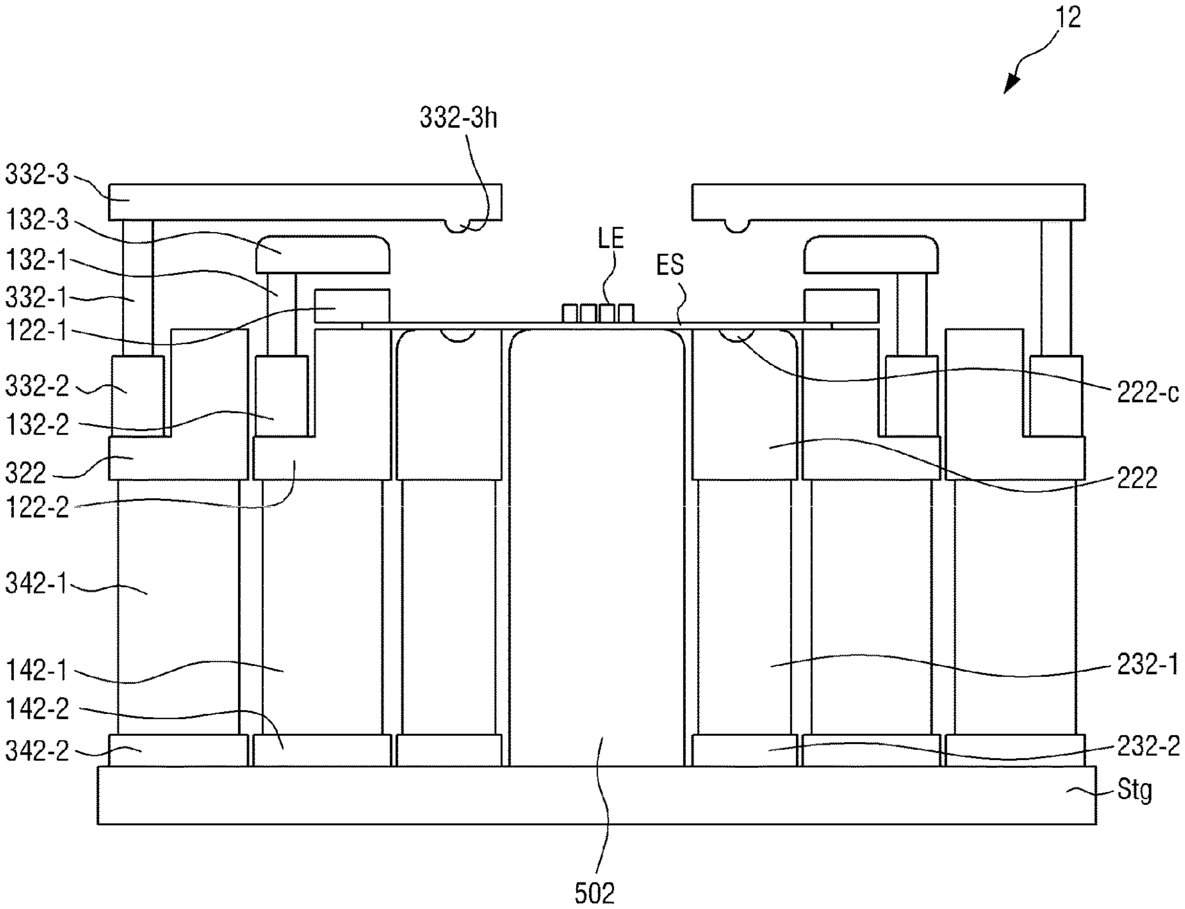
FIG. 20 is a schematic diagram illustrating a transfer film stretching device according to another embodiment of the present disclosure.

FIG. 19 is a perspective view of a transfer film stretching device according to another embodiment of the present disclosure, and FIG. 20 is a schematic diagram illustrating the transfer film stretching device shown in FIG. 19.

Referring to FIGS. 19 and 20, a transfer film stretching device 12 may include a first stretching unit 102, a second stretching unit 202, a third stretching unit 302, and a transfer film support part 502.

The transfer film support part 502 supports the transfer film ES. The transfer film support part 502 supports the transfer film ES while the entire width of the transfer film ES, that is, the transfer film ES on which the light emitting elements LE are arranged, is being stretched in the outer circumferential direction. The degree of stretching may be set and applied differently according to at least one characteristic from among the size and diameter of the transfer film ES on which the light emitting elements LE are arranged, the arrangement width or arrangement interval of the plurality of light emitting elements LE, or the stretching width of the transfer film ES.

The top surface of the transfer film support part 502 may be formed in a disc-shaped or polygonal panel type.

The plurality of light emitting elements LE are aligned on the transfer film ES.

The plurality of light emitting elements LE are objects to be transferred onto a circuit board. A ring-shaped fixing frame 122-1 is disposed around the outer circumference of the transfer film ES.

The first stretching unit 102 is different from the first stretching unit 100 shown in FIG. 9 in that a pressing frame 132-3 is not provided with a locking groove. Because the first stretching unit 102 is similar to the first stretching unit 100 shown in FIG. 9 except for the locking groove, a detailed description thereof will be omitted.

The second stretching unit 202 is disposed between the first stretching unit 102 and the transfer film support part 502. The second stretching unit 202 includes an auxiliary support part 222 and a third vertical driving unit 232.

The auxiliary support part 222 is adjacent to the transfer film support part 502 to support the transfer film ES. The auxiliary support part 222 has a locking groove 222-*c* on a top surface thereof. The locking groove 222-*c* is fitted and coupled with a locking protrusion 332-3*h* on a coupling frame 332-3, to be described later.

In the ready state, the top surface of a fixing lower part 122-2 of the first stretching unit 102 and the top surface of the transfer film support unit 500 are located on the same plane.

The third vertical driving unit 232 may be formed of a hydraulic pumping type, such as a piston or the like. One side of the third vertical driving unit 232 may be assembled to the rear surface of the auxiliary support part 222, and the other side thereof may be assembled with a pneumatic or hydraulic pressure controller. Accordingly, the third vertical driving unit 232 may move the auxiliary support part 222 in one direction or the other direction of the third direction by the pneumatic or hydraulic pressure controller.

In one embodiment, the third vertical driving unit 232 may include a third inner mast part 232-1 and a third outer mast part 232-2 as a pair.

The third inner mast part 232-1 and the third outer mast part 232-2 are disposed around the transfer film support part 502.

The third inner mast part 232-1 and the third outer mast part 232-2 may move in one direction (upwardly) and the other direction (downwardly) of the third direction while being connected to the third lift driving motor.

When the third inner mast part 232-1 moves in the other direction of the third direction (downwardly), the third inner mast part 232-1 may be inserted into (or received into) the third outer mast part 232-2. In one embodiment, the third inner mast part 232-1 and the third outer mast part 232-2 shown as driving the third vertical driving unit 232 in one direction or the other direction of the third direction, but the present disclosure is not limited thereto.

The third stretching unit 302 is disposed adjacent to and spaced apart from the first stretching unit 102. The third stretching unit 302 is more distant from (e.g., is farther from) the transfer film support part 502 than the first stretching unit 102 is.

The third stretching unit 302 may include a fourth vertical driving unit 332 and a fifth vertical driving unit 342.

The fourth vertical driving unit 332 may include a fourth inner mast part 332-1, a fourth outer mast part 332-2, and the coupling frame 332-3.

The fourth inner mast part 332-1 may be disposed on the fourth outer mast part 332-2, and the fourth inner mast part 332-1 may move in one direction (upwardly) and the other direction (downwardly) of the third direction while being connected to the first lift driving motor.

When the fourth inner mast part 332-1 moves in the other direction of the third direction (downwardly), the fourth inner mast part 332-1 may be inserted into (or received into) the fourth outer mast part 332-2.

The coupling frame 332-3 may be disposed on the fourth inner mast part 332-1.

For example, the coupling frame 332-3 is disposed on the fourth inner mast part 332-1, and the fourth inner mast part 332-1 supports the coupling frame 332-3. When the fourth inner mast part 332-1 moves in the other direction of the third direction (downwardly), the coupling frame 332-3 moves in the other direction of the third direction (downwardly) together with the first inner mast part 130-1.

The coupling frame 332-3 protrudes in the first direction in which the first stretching unit 102 is disposed and overlaps (e.g., extends over) the top surface of the first stretching unit 102 and the top surface of the second stretching unit 202.

The coupling frame 332-3 is spaced apart from the top surfaces of the first stretching unit 102 and the second stretching unit 202 in the ready state.

The coupling frame 332-3 may be formed in the form of a frame or panel having a circular shape with a circular opening or a polygonal shape, such as a quadrilateral shape or the like, but the present disclosure is not limited thereto.

The coupling frame 332-3 includes the locking protrusion 332-3*h* protruding outwardly from one surface facing the second stretching unit 202. The locking protrusion 332-3*h* protrudes toward the second stretching unit 202. When the fourth vertical driving unit 332 moves toward the other side of the third direction (downwardly), the locking protrusion 332-3*h* is fitted and coupled with the locking groove 222-*c*. The fitting and coupling of the locking protrusion 332-3*h* and the locking groove 222-*c* will be described later with reference to FIG. 23.

The fifth vertical driving unit 342 is disposed around the first vertical driving unit 142 of the first stretching unit 102. The fifth vertical driving unit 342 may be disposed under the fourth vertical driving unit 332.

The fifth vertical driving unit 342 may be formed of a hydraulic pumping type, such as a piston or the like. One side of the fifth vertical driving unit 342 may be assembled to the rear surface of the fourth vertical driving unit 332, and the other side thereof may be assembled with a pneumatic or hydraulic pressure controller. Accordingly, the fifth vertical driving unit 342 may move the fourth vertical driving unit 332 in one direction or the other direction of the third direction by the pneumatic or hydraulic pressure controller.

In one embodiment, the fifth vertical driving unit 342 may include a fifth inner mast part 342-1 and a fifth outer mast part 342-2.

The fifth inner mast part 342-1 and the fifth outer mast part 342-2 are disposed around the transfer film support part 502.

The fifth inner mast part 342-1 may be disposed on the fifth outer mast part 342-2, and the fifth inner mast part 342-1 may move in one direction (upwardly) and the other direction (downwardly) of the third direction while being connected to the second lift driving motor.

When the fifth inner mast part 342-1 moves in the other direction of the third direction (downwardly), the fifth inner mast part 342-1 may be inserted into (or received into) the fifth outer mast part 342-2.

The fourth vertical driving unit 332 is disposed on the fifth inner mast part 342-1. Therefore, when the fifth inner mast part 342-1 moves in the other direction of the third direction (downwardly), the fourth vertical driving unit 332 moves in the other direction of the third direction (downwardly) together with the fifth inner mast part 342-1. In one embodiment, the fifth inner mast part 342-1 and the fifth outer mast part 342-2 are shown as driving the fifth vertical driving unit 342 in one direction or the other direction of the third direction, but the present disclosure is not limited thereto.

Hereinafter, an operation of the transfer film stretching device 12 shown in FIGS. 19 and 20 will be described with reference to FIGS. 21 to 24.

FIGS. 21 to 24 are schematic diagrams illustrating the operation of the transfer film stretching device 12 according to one embodiment of the present disclosure.

Figure 21:
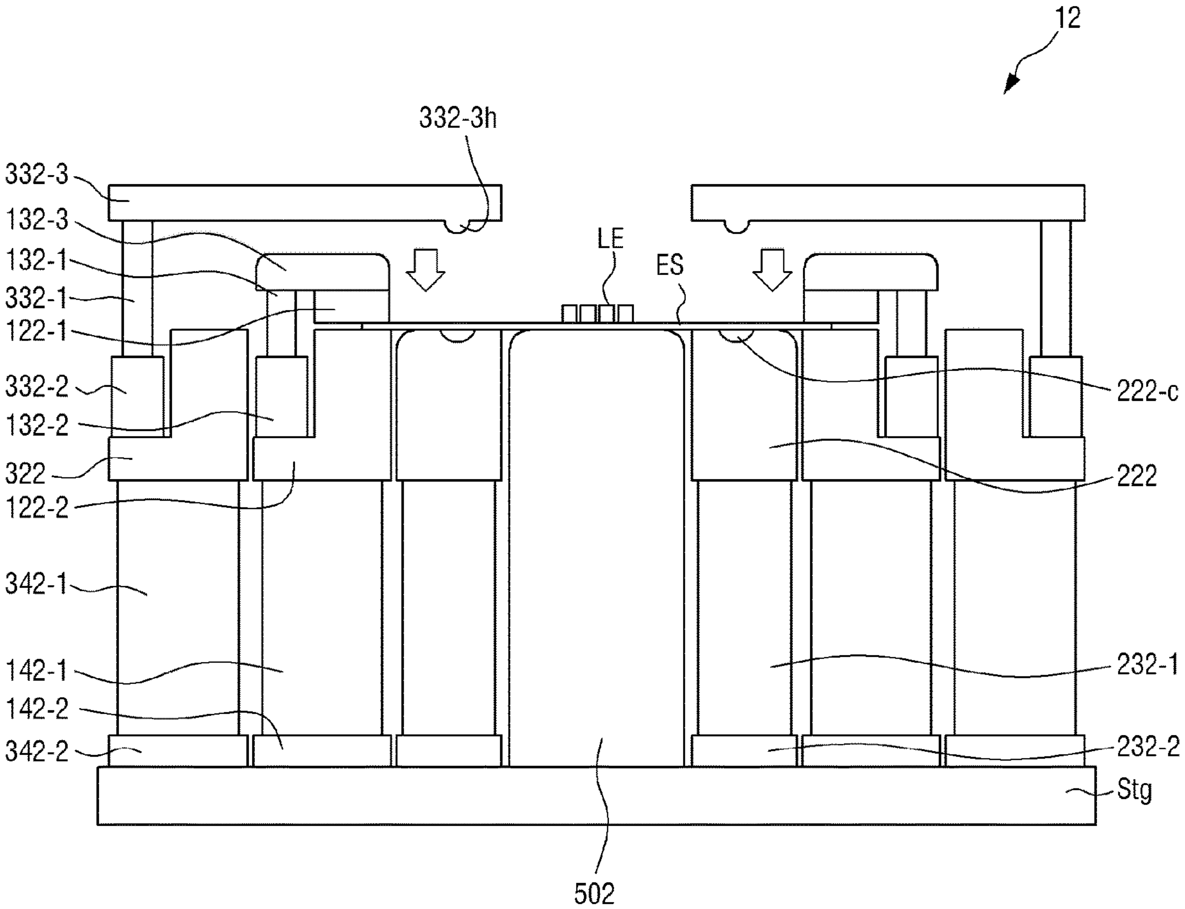
FIGS. 21 to 24 are schematic diagrams illustrating operation of the transfer film stretching device shown in FIGS. 19 and 20 according to one embodiment of the present disclosure.

Referring first to FIG. 21, in the transfer film stretching device 12, the first vertical driving unit 132 moves in the other direction of the third direction (downwardly) so that the pressing frame 132-3 presses the fixing frame 122-1. Accordingly, the outer circumference of the transfer film ES is fixed so that the transfer film ES is prevented from deviating from the transfer film support part 502 when the components of the transfer film stretching device 12 move upwardly or downwardly for stretching. On the transfer film ES, the plurality of light emitting elements LE are disposed to be spaced apart from each other at the first distance d1. The center of the transfer film ES and the outer circumferential area of the transfer film ES fixed by the fixing frame 122-1 are located on the same plane (e.g., the transfer film ES is flat).

Figure 22:
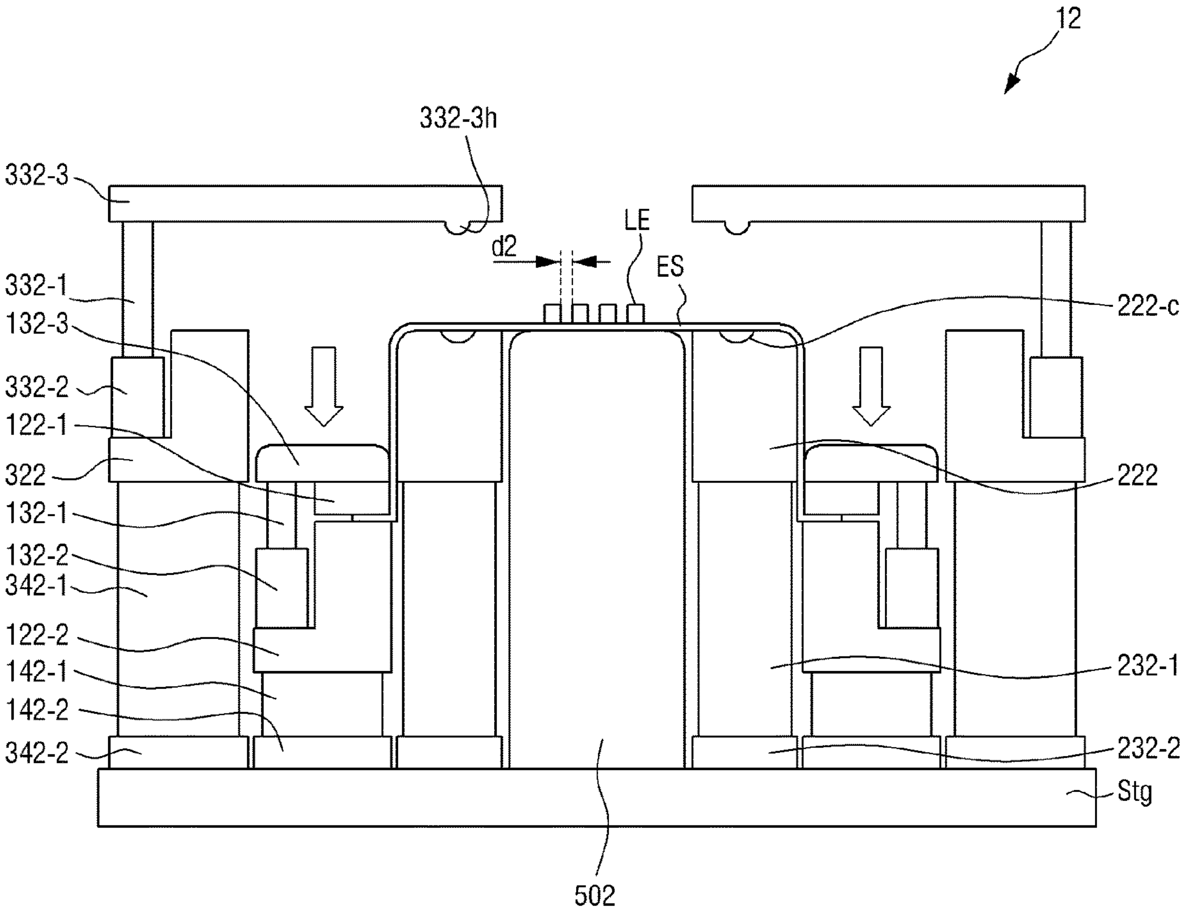

Next, referring to FIG. 22, in the transfer film stretching device 12, the second vertical driving unit 142 moves in the other direction of the third direction (downwardly). When the second vertical driving unit 142 moves in the other direction of the third direction (downwardly), the first vertical driving unit 132 disposed on the second vertical driving unit 142 also moves in the other direction of the third direction (downwardly) so that the top surface of the fixing lower part 122-2 is disposed lower than the top surface of the transfer film support part 502. Accordingly, the transfer film ES is stretched (e.g., is primarily stretched) and the plurality of light emitting elements LE disposed on the transfer film ES are spaced apart from each other at the second distance d2. The second distance d2 is greater than the first distance d1. The center of the transfer film ES is located on a plane different from the plane on which the outer circumferential area of the transfer film ES fixed by the fixing frame 120-1 is located. The center of the transfer film ES may be disposed higher than the outer circumferential area of the transfer film ES.

Figure 23:
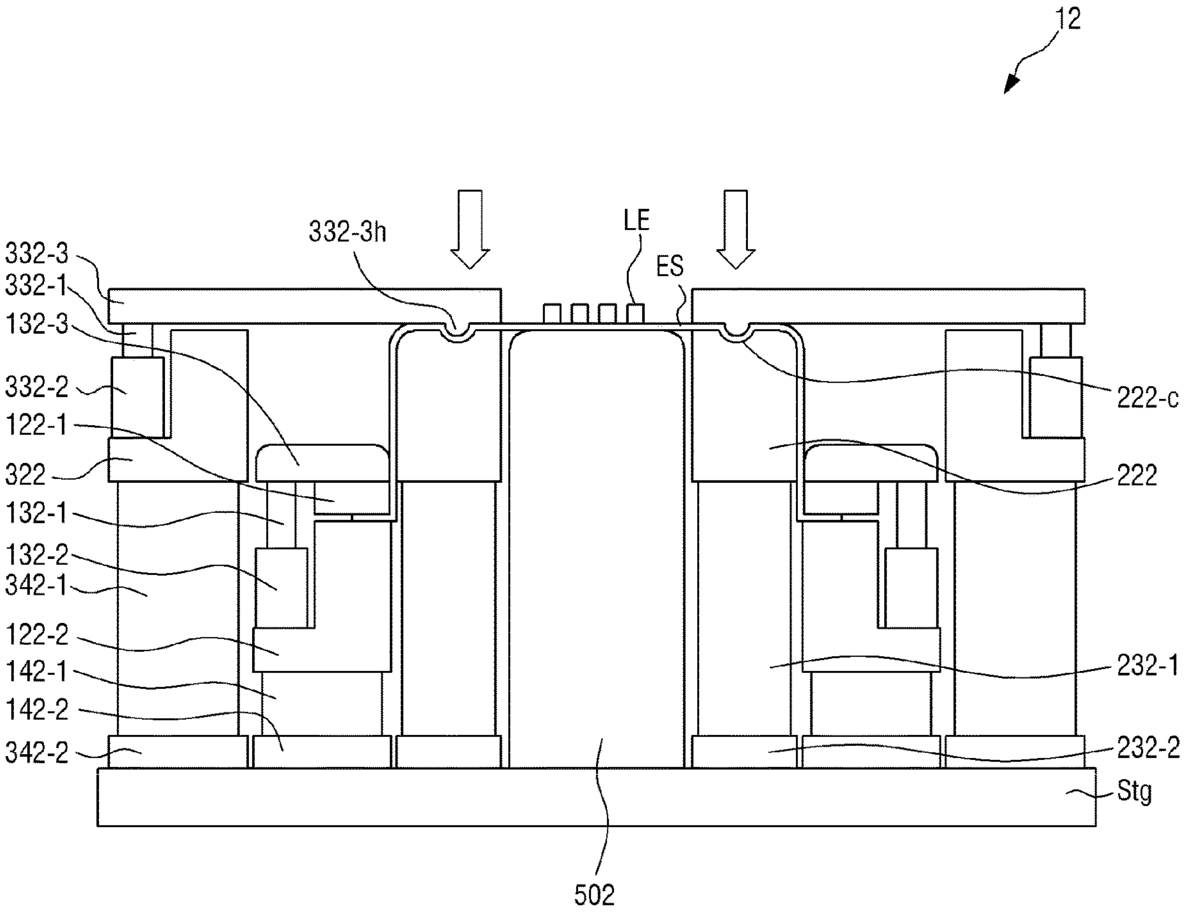

Next, referring to FIG. 23, in the transfer film stretching device 12, the fourth vertical driving unit 332 moves in the other direction of the third direction (downwardly). The fourth vertical driving unit 332 moves in the other direction of the third direction (downwardly) until the locking protrusion 332-3*h* on the coupling frame 332-3 included in the fourth vertical driving unit 332 is fitted and coupled with the locking groove 222-*c* in the auxiliary support part 222. The locking protrusion 332-3*h* on the coupling frame 332-3 is fitted and coupled with the locking groove 222-*c* in the second stretching unit 200 so that the third stretching unit 302 and the second stretching unit 202 are fixed and connected.

Figure 24:
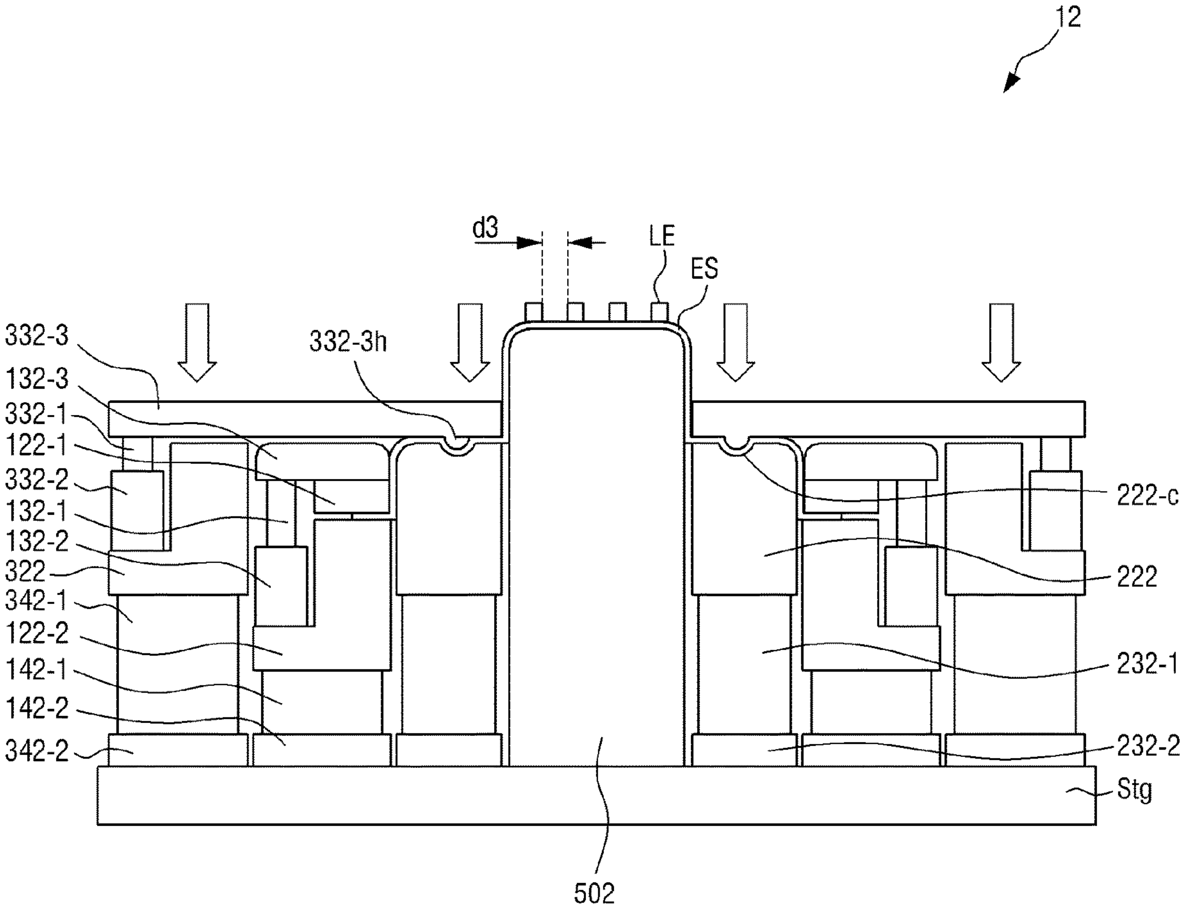

Next, referring to FIG. 24, in the transfer film stretching device 12, the third stretching unit 302 and the second stretching unit 202, which are fixed and connected together, move in the other direction of the third direction (downwardly). For example, the fifth vertical driving unit 342 of the third stretching unit 302 and the third vertical driving unit 232 of the second stretching unit 202 move in the other direction of the third direction (downwardly). The moving speeds of the fifth vertical driving unit 342 and the third vertical driving unit 232 are set to be the same. Accordingly, the transfer film ES is stretched (e.g., is further or secondarily stretched), and the plurality of light emitting elements LE disposed on the transfer film ES are spaced apart from each other at the third distance d3. The third distance d3 is greater than the second distance d2.

Due to the movement of the second stretching unit 202, the top surface of the transfer film support part 502 and the top surface of the second stretching unit 202 are located on different planes. Further, the top surface of the transfer film support part 502, the top surface of the auxiliary support part 222, and the top surface of the fixing lower part 122-2 are located on different planes.

When the separation distance between the third light emitting elements reaches a desired distance, the movement of the fifth vertical driving unit 342 of the third stretching unit 302 and the movement of the third vertical driving unit 232 of the second stretching unit 202 are stopped.

In the transfer film stretching device 12, according to one embodiment, the coupling direction of the locking protrusion 332-3*h* and the locking groove 222-*c* coincides with the vertical movement direction of the second stretching unit 202 and the third stretching unit 302. Accordingly, the load applied to the transfer film ES due to the coupling of the locking protrusion 332-3*h* and the locking groove 222-*c* is reduced so that the damage to the transfer film ES may be reduced.

Figure 25:
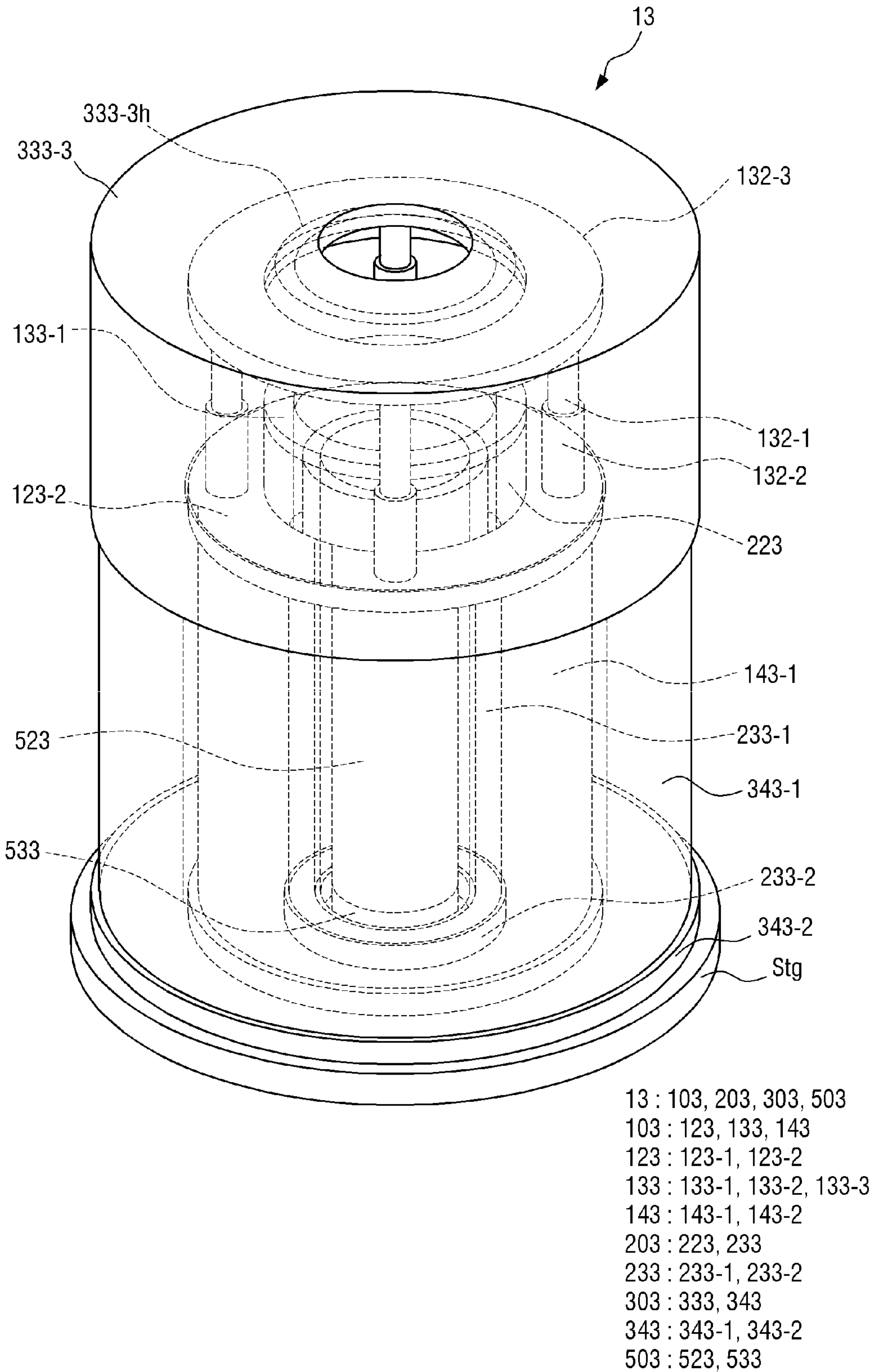
FIG. 25 is a perspective view of a transfer film stretching device according to another embodiment of the present disclosure.
Figure 26:
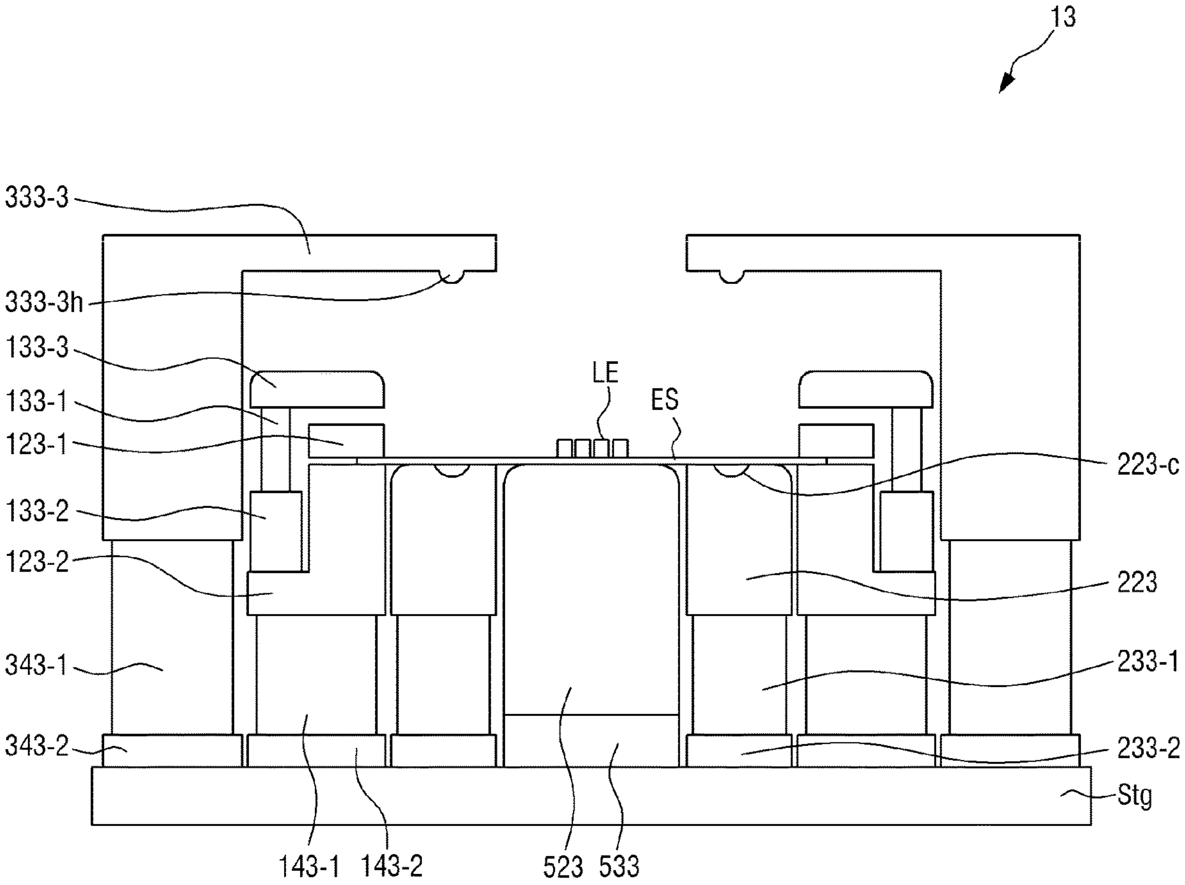
FIG. 26 is a schematic diagram illustrating a transfer film stretching device according to another embodiment of the present disclosure.

FIG. 25 is a perspective view of a transfer film stretching device according to another embodiment of the present disclosure, and FIG. 26 is a schematic diagram illustrating the transfer film stretching device shown in FIG. 25.

Referring to FIGS. 25 and 26, a transfer film stretching device 13 may include a first stretching unit 103, a second stretching unit 203, a third stretching unit 303, and a transfer film support unit 503.

The transfer film support unit 503 includes a main support part 523 and a fourth vertical driving unit 533.

The main support part 523 supports the transfer film ES. The main support part 523 supports the transfer film ES while the transfer film ES fixed by a fixing frame 123-1 of the first stretching unit 103, that is, the transfer film ES on which the light emitting elements LE are arranged, is being stretched along the entire width in an outer circumferential direction. The degree of stretching may be set and applied differently according to at least one characteristic from among the size and diameter of the transfer film ES on which the light emitting elements LE are arranged, the arrangement width or arrangement interval of the plurality of light emitting elements LE, or the stretching width of the transfer film ES.

The top surface of the main support part 523 may be formed in a disc-shaped or polygonal panel type.

The fourth vertical driving unit 533 may be formed of a hydraulic pumping type, such as a piston or the like. One side of the fourth vertical driving unit 533 may be assembled to the rear surface of the main support part 523, and the other side thereof may be assembled with a pneumatic or hydraulic pressure controller. Accordingly, the fourth vertical driving unit 533 may move the main support part 523 in one direction or the other direction of the third direction by the pneumatic or hydraulic pressure controller. The main support part 523 moves in one direction or the other direction of the third direction so that the transfer film ES disposed on the main support part 523 may be stretched.

Because the first stretching unit 103 is similar to the first stretching unit 102 shown in FIG. 20 and the second stretching unit 203 is similar to the second stretching unit 202 shown FIG. 20, detailed descriptions thereof will be omitted.

The third stretching unit 303 is disposed adjacent to and spaced apart from the first stretching unit 103. The third stretching unit 303 is more distant from (e.g., is farther from) the transfer film support unit 503 than the first stretching unit 103 is.

The third stretching unit 303 may include a coupling part 333 and a fifth vertical driving unit 343.

The coupling part 333 may be formed in a cylindrical shape having an opening and may include, at an upper portion thereof, a coupling frame 333-3 protruding toward the center of the opening.

The coupling part 333 is disposed on the fifth vertical driving unit 343 and is supported by the fifth vertical driving unit 343. Therefore, when the fifth vertical driving unit 343 moves in one direction or the other direction of the third direction, the coupling frame 333-3 also moves in one direction or the other direction of the third direction.

The coupling frame 333-3 protrudes in the first direction in which the second stretching unit 203 is disposed and overlaps (e.g., extends over) the top surface of the first stretching unit 103 and the top surface of the second stretching unit 203.

The coupling frame 333-3 is spaced apart from the top surfaces of the first stretching unit 103 and the second stretching unit 203 in the ready state.

The coupling frame 333-3 may be formed in the form of a frame or panel having a circular shape with a circular opening or a polygonal shape, such as a quadrilateral shape or the like, but the present disclosure is not limited thereto.

The coupling frame 333-3 includes a locking protrusion 333-3*h* protruding outwardly from one surface facing the second stretching unit 203. The locking protrusion 333-3*h* protrudes toward the top surface of the second stretching unit 203. When the fifth vertical driving unit 343 moves toward the other side of the third direction (downwardly), the locking protrusion 333-3*h* is fitted and coupled with the locking groove 223-*c* in the auxiliary support part 223. The fitting and coupling of the locking protrusion 333-3*h* and the locking groove 223-*c* will be described later with reference to FIG. 28.

The fifth vertical driving unit 343 may be formed of a hydraulic pumping type, such as a piston or the like. One side of the fifth vertical driving unit 343 may be assembled to the rear surface of the coupling part 333, and the other side thereof may be assembled with a pneumatic or hydraulic pressure controller. Accordingly, the fifth vertical driving unit 343 may move the coupling part 333 in one direction or the other direction of the third direction by the pneumatic or hydraulic pressure controller.

In one embodiment, the fifth vertical driving unit 343 may include a fifth inner mast part 343-1 and a fifth outer mast part 343-2.

The fifth inner mast part 343-1 and the fifth outer mast part 343-2 are disposed around the first stretching unit 103.

The fifth inner mast part 343-1 may be disposed on the fifth outer mast part 343-2, and the fifth inner mast part 343-1 may move in one direction (upwardly) and the other direction (downwardly) of the third direction while being connected to the second lift driving motor.

When the fifth inner mast part 343-1 moves in the other direction of the third direction, the fifth inner mast part 343-1 may be inserted into (or received into) the fifth outer mast part 343-2.

The coupling part 333 is disposed on the fifth inner mast part 343-1. Therefore, when the fifth inner mast part 343-1 moves in the other direction of the third direction (downwardly), the coupling part 333 moves in the other direction of the third direction (downwardly) together with the fifth inner mast part 343-1. In one embodiment, the fifth inner mast part 343-1 and the fifth outer mast part 343-2 are shown as driving the fifth vertical driving unit 343 in one direction or the other direction of the third direction, but the present disclosure is not limited thereto.

Hereinafter, operation of the transfer film stretching device 13 shown in FIGS. 25 and 26 will be described with reference to FIGS. 27 to 30.

FIGS. 27 to 30 are schematic diagrams illustrating the operation of the transfer film stretching device 13 according to one embodiment of the present disclosure.

Figure 27:
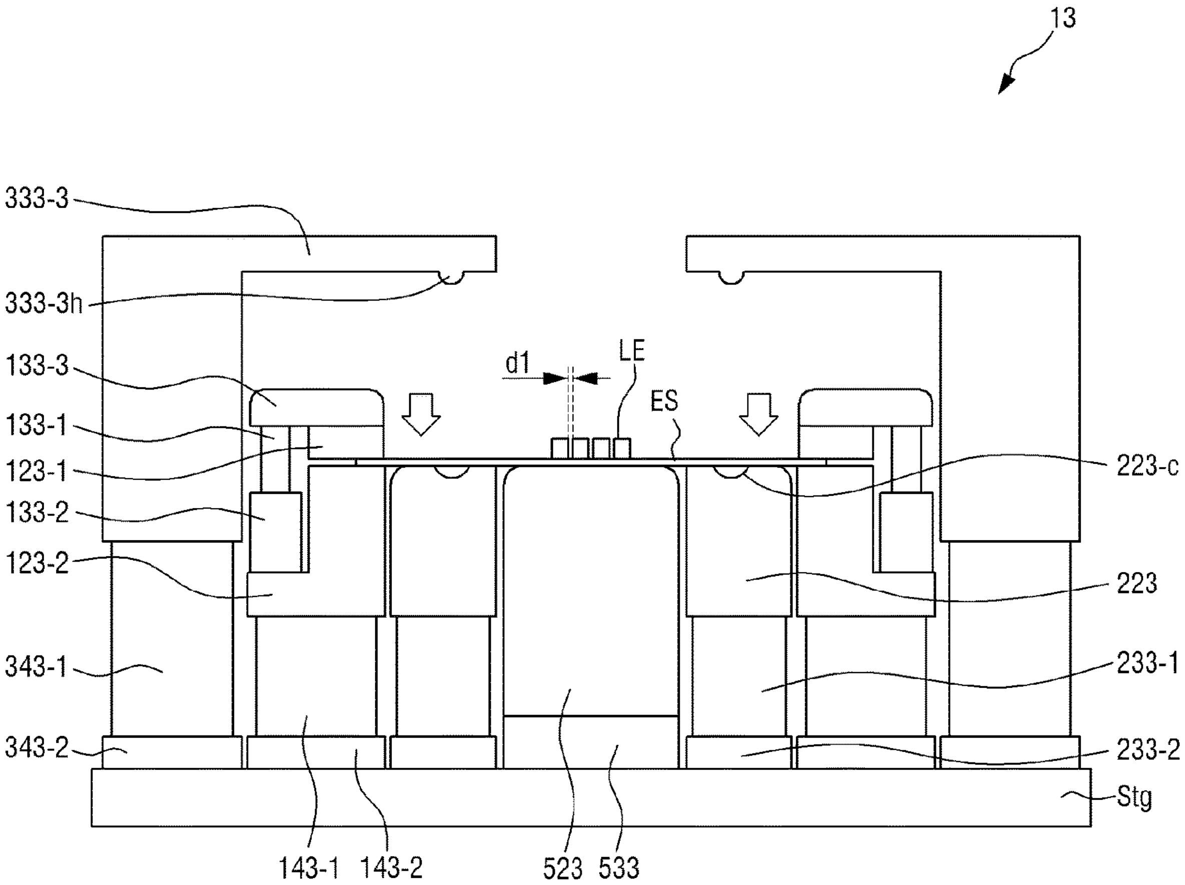
FIGS. 27 to 30 are schematic diagrams illustrating operation of the transfer film stretching device shown in FIGS. 25 and 26 according to one embodiment of the present disclosure.

Referring first to FIG. 27, in the transfer film stretching device 13, the first vertical driving unit 133 moves in the other direction of the third direction (downwardly so that the pressing frame 133-3 presses the fixing frame 123-1. Accordingly, the outer circumference of the transfer film ES is fixed to the fixing lower part 123-2 so that the transfer film ES is prevented from deviating from the transfer film support unit 503 when the components of the transfer film stretching device 13 move upwardly or downwardly for stretching. On the transfer film ES, the plurality of light emitting elements LE are disposed to be spaced apart from each other at the first distance d1. The center of the transfer film ES and the outer circumferential area of the transfer film ES fixed by the fixing frame 123-1 are located on the same plane (e.g., the transfer film ES is flat).

Figure 28:
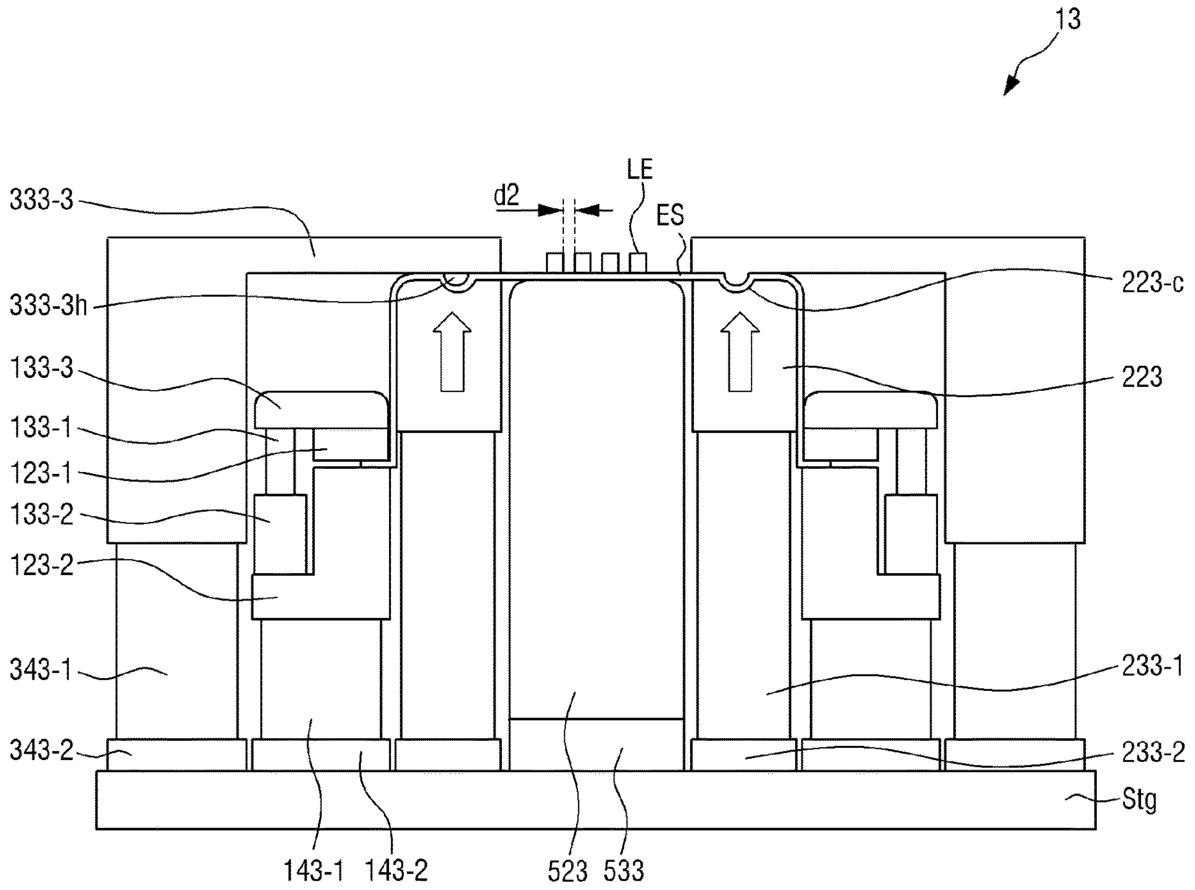

Next, referring to FIG. 28, in the transfer film stretching device 13, the second stretching unit 203 and the transfer film support unit 503 move in one direction of the third direction (upwardly) so that the top surface of the main support part 523 and the top surface of the auxiliary support part 223 are disposed higher than the top surface of the fixing lower part 123-2 of the first stretching unit 103. For example, the third vertical driving unit 233 of the second stretching unit 203 and the fourth vertical driving unit 531 of the transfer film support unit 503 move in one direction of the third direction (upwardly) so that the top surface of the fixing lower part 123-2 is disposed lower than the top surface of the transfer film support unit 503.

While the second stretching unit 203 and the transfer film support unit 503 are moving in one direction of the third direction (upwardly), the moving speeds of the third vertical driving unit 233 and the fourth vertical driving unit 533 are set to be the same. Accordingly, while the second stretching unit 203 and the transfer film support unit 503 are moving in one direction of the third direction (upwardly), the top surface of the main support part 523 and the top surface of the auxiliary support part 223 are constantly located on the same plane.

The top surface of the main support part 523 and the top surface of the auxiliary support part 223 are disposed higher than the top surface of the fixing lower part 123-2 so that the transfer film ES is stretched (e.g., is primarily stretched) and the plurality of light emitting elements LE disposed on the transfer film ES are spaced apart from each other at the second distance d2. The second distance d2 is greater than the first distance d1. The center of the transfer film ES is located on a plane different from the plane on which the outer circumferential area of the transfer film ES fixed by the fixing frame 123-1 is located. The center of the transfer film ES may be disposed higher than the outer circumferential area of the transfer film ES.

When the third vertical driving unit 233 moves in one direction of the third direction (upwardly), the auxiliary support part 223 disposed on the third vertical driving unit 233 also moves in one direction of the third direction (upwardly). The auxiliary support part 223 moves in one direction of the third direction (upwardly) until the locking groove 223-*c* in the auxiliary support part 223 is fitted and coupled with the coupling protrusion 333-3*h* on the coupling frame 333-3. The locking groove 223-*c* in the auxiliary support part 223 is fitted and coupled with the coupling protrusion 333-3*h* on the coupling frame 333-3 so that the third stretching unit 303 and the second stretching unit 203 are fixed and connected together.

Figure 29:
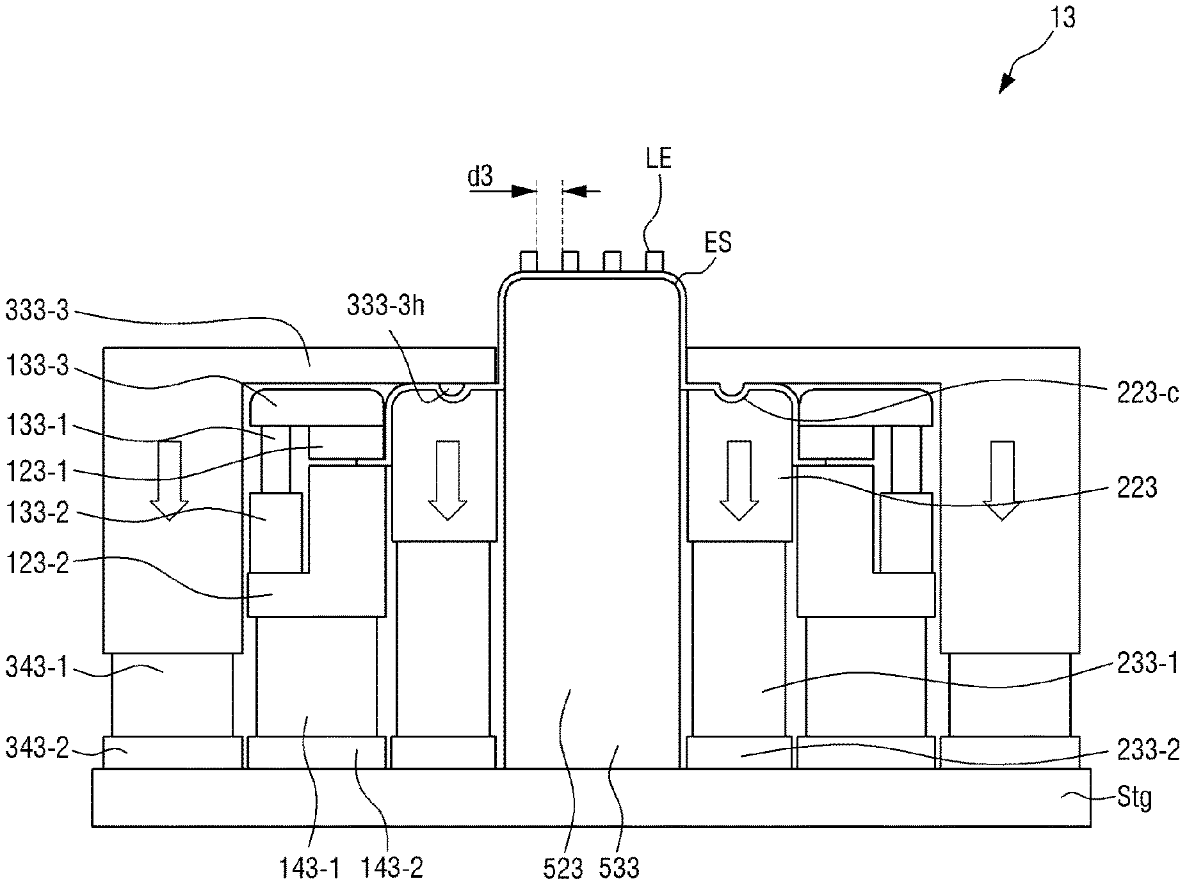

Next, referring to FIG. 29, in the transfer film stretching device 13, the third stretching unit 303 and the second stretching unit 203, which are fixed and connected together, move in the other direction of the third direction (downwardly). For example, the fifth vertical driving unit 343 of the third stretching unit 303 and the third vertical driving unit 233 of the second stretching unit 203 move in the other direction of the third direction (downwardly). The moving speeds of the fifth vertical driving unit 343 and the third vertical driving unit 233 are set to be the same. Accordingly, the transfer film ES is stretched (e.g., is further or secondarily stretched), and the plurality of light emitting elements LE disposed on the transfer film ES are spaced apart from each other at the third distance d3. The third distance d3 is greater than the second distance d2.

Due to the movement of the second stretching unit 203, the top surface of the transfer film support unit 503 and the top surface of the second stretching unit 203 are disposed on different planes. Further, the top surface of the transfer film support unit 503, the top surface of the auxiliary support part 223, and the top surface of the fixing lower part 123-2 are located on different planes.

When the separation distance between the third light emitting elements reaches a desired distance, the movement of the fifth vertical driving unit 343 of the third stretching unit 303 and the movement of the third vertical driving unit 233 of the second stretching unit 203 are stopped.

Figure 30:
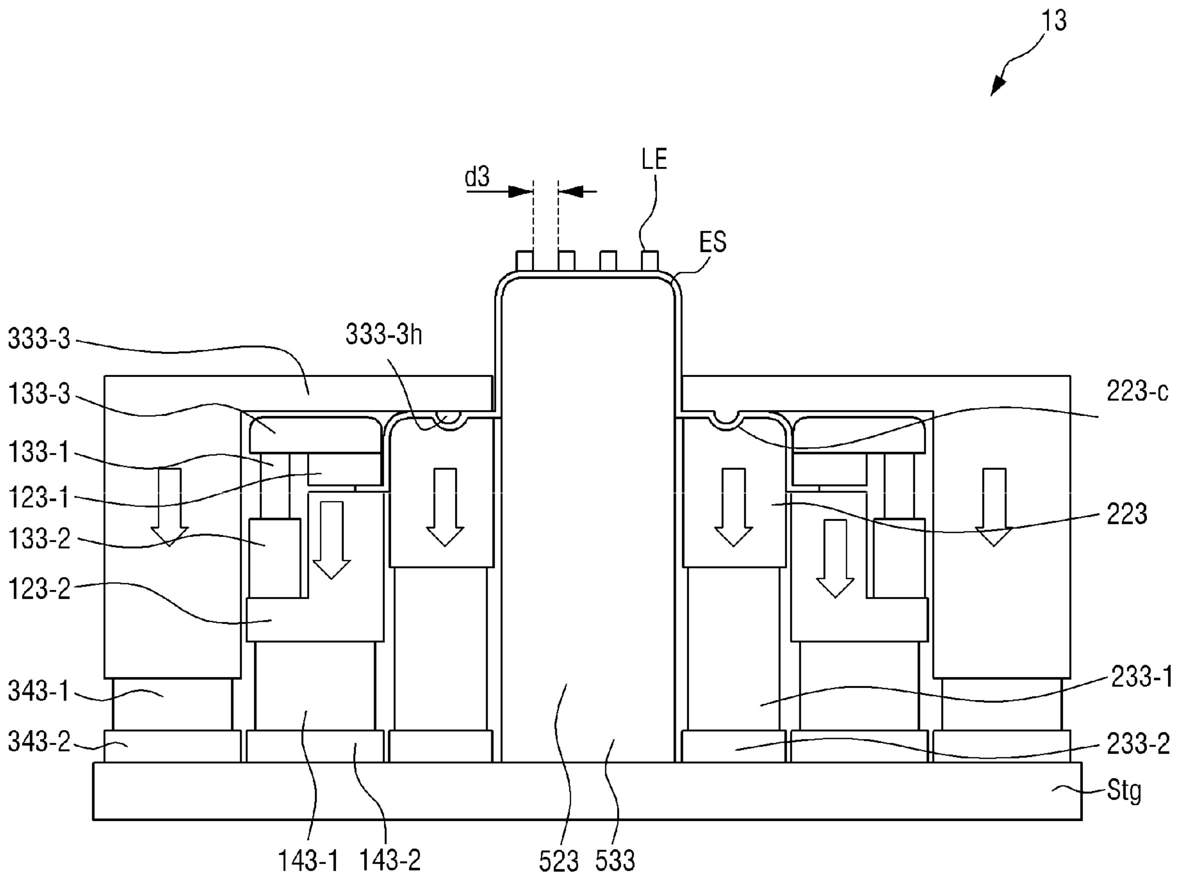

In another embodiment, as shown in FIG. 30, in the transfer film stretching device 13, the first stretching unit 103 may be lowered together with the third stretching unit 303 and the second stretching unit 203, which are fixed and connected together. Thus, when the first stretching unit 103 is additionally lowered, the third stretching unit 303 and the second stretching unit 203 may be lowered farther so that the light emitting elements LE may be farther spaced apart at the third distance d3 compared to an embodiment in which only the third stretching unit 303 and the second stretching unit 203 are lowered.

However, the aspects and features of the present disclosure are not limited to those set forth herein. The above and other aspects and features of the present disclosure will become more apparent to one of ordinary skill in the art to which the present disclosure pertains by referencing the claims, with equivalents thereof to be included therein.

What is claimed is:

1. A transfer film stretching device comprising:

a transfer film support unit having a top surface configured to receive a transfer film, the transfer film having light emitting elements arranged at a first distance mounted thereon;

a first stretching unit outside the transfer film support unit and configured to move in one direction or another direction of a third direction while fixing an outer edge of the transfer film to stretch a width of the transfer film in an outer circumferential direction; and a second stretching unit between the first stretching unit and the transfer film support unit and movable in the one direction or the other direction of the third direction independently of the first stretching unit, wherein, in a first state, the first stretching unit is configured to move in the one direction or the other direction of the third direction independently of the second stretching unit, and wherein, in a second state, the first stretching unit and the second stretching unit are fitted together and configured to move together in the one direction or the other direction of the third direction.

2. The transfer film stretching device of claim 1, wherein the first stretching unit comprises:

a fixing unit configured to fix an outer circumference of the transfer film;

a first vertical driving unit comprising a pressing frame overlapping the fixing unit in the third direction and configured to move the pressing frame in the other direction of the third direction to press the fixing unit; and a second vertical driving unit under the first vertical driving unit and configured to move in the one direction or the other direction of the third direction.

3. The transfer film stretching device of claim 2, wherein the second stretching unit comprises:

an auxiliary support part configured to support the transfer film mounted on the top surface; and a third vertical driving unit under the auxiliary support part and configured to move in the one direction or the other direction of the third direction.

4. The transfer film stretching device of claim 3, wherein the transfer film support unit comprises:

a main support part configured to support the transfer film on the top surface; and a fourth vertical driving unit under the main support part and configured to move in the one direction or the other direction of the third direction.

5. The transfer film stretching device of claim 4, wherein the pressing frame has a locking groove, wherein the auxiliary support part has a locking protrusion protruding toward the first stretching unit, and wherein the locking groove is fitted and coupled with the locking protrusion with the transfer film sandwiched therebetween and the second stretching unit and the transfer film support unit move in the one direction of the third direction to spread apart the light emitting elements on the transfer film at a second distance, the second distance being greater than the first distance.

6. The transfer film stretching device of claim 5, wherein the first stretching unit and the second stretching unit are fixed and connected together by the fitting and coupling of the locking protrusion and the locking groove, move together in the other direction of the third direction to farther spread apart the light emitting elements on the transfer film at a third distance, the third distance being greater than the second distance.

7. The transfer film stretching device of claim 3, wherein the pressing frame has a locking groove, wherein the auxiliary support part has a locking protrusion protruding toward the first stretching unit, and wherein, in the second state, the second vertical driving unit moves in the other direction of the third direction while the locking groove is fitted and coupled with the locking protrusion with the transfer film sandwiched therebetween to spread the light emitting elements on the transfer film apart at a second distance, the second distance being greater than the first distance.

8. The transfer film stretching device of claim 7, wherein, in the second state, the first stretching unit and the second stretching unit are fixed and connected together by the fitting and coupling of the locking protrusion and the locking groove, move together in the other direction of the third direction to farther spread apart the light emitting elements on the transfer film at a third distance, the third distance being greater than the second distance.

9. The transfer film stretching device of claim 3, wherein the fixing unit has a circular or polygonal panel or frame structure in which a circular or polygonal opening is formed, and wherein the pressing frame has a circular or polygonal panel or a frame structure in which a circular or polygonal opening is formed.

10. The transfer film stretching device of claim 1, wherein the first stretching unit and the second stretching unit have a cylindrical or polygonal columnar shape having an opening, and wherein the second stretching unit is in the opening of the first stretching unit, and the transfer film support unit is in the opening of the second stretching unit.

11. A transfer film stretching device comprising:

a transfer film support unit having a top surface configured to receive a transfer film, the transfer film having light emitting elements mounted thereon and spaced apart from each other at a first distance;

a first stretching unit outside the transfer film support unit and configured to move in one direction or another direction of a third direction while fixing an outer edge of the transfer film to stretch a width of the transfer film in an outer circumferential direction;

a second stretching unit between the first stretching unit and the transfer film support unit and movable in the one direction or the other direction of the third direction independently of the first stretching unit; and a third stretching unit outside the first stretching unit and movable in the one direction or the other direction of the third direction independently of the first stretching unit and the second stretching unit.

12. The transfer film stretching device of claim 11, wherein the first stretching unit comprises:

a fixing unit configured to fix an outer circumference of the transfer film;

a first vertical driving unit comprising a pressing frame overlapping the fixing unit in the third direction and configured to move the pressing frame in the other direction of the third direction to press the fixing unit; and a second vertical driving unit under the first vertical driving unit and configured to move in the one direction or the other direction of the third direction.

13. The transfer film stretching device of claim 12, wherein the second vertical driving unit moves in the other direction of the third direction to spread apart the light emitting elements on the transfer film at a second distance.

14. The transfer film stretching device of claim 13, wherein the second stretching unit comprises:

an auxiliary support part configured to support the transfer film mounted on the top surface; and a third vertical driving unit under the auxiliary support part and configured to move in the one direction or the other direction of the third direction.

15. The transfer film stretching device of claim 14, wherein the transfer film support unit comprises:

a main support part configured to support the transfer film mounted on the top surface; and a fourth vertical driving unit under the main support part and configured to move in the one direction or the other direction of the third direction.

16. The transfer film stretching device of claim 15, wherein the third stretching unit comprises:

a coupling part comprising a coupling frame overlapping the auxiliary support part in the third direction; and a fifth vertical driving unit under the coupling part and configured to move in the one direction or the other direction of the third direction, and wherein the coupling frame comprises a locking protrusion protruding toward the auxiliary support part.

17. The transfer film stretching device of claim 16, wherein the auxiliary support part has a locking groove overlapping the locking protrusion in the third direction, and wherein the locking groove is fitted and coupled with the locking protrusion with the transfer film sandwiched therebetween and the second stretching unit and the transfer film support unit move in the one direction of the third direction to spread apart the light emitting elements on the transfer film at the second distance.

18. The transfer film stretching device of claim 17, wherein the third stretching unit and the second stretching unit are fixed and connected together by the fitting and coupling of the locking groove and the locking protrusion, move together in the other direction of the third direction to spread apart the light emitting elements on the transfer film at a third distance, the third distance being greater than the second distance.

19. The transfer film stretching device of claim 18, wherein the third stretching unit, the second stretching unit, and the transfer film support unit are fixed and connected together by the fitting and coupling of the locking groove and the locking protrusion move in the other direction of the third direction to spread apart the light emitting elements on the transfer film at the third distance.

20. The transfer film stretching device of claim 11, wherein the first stretching unit, the second stretching unit, and the third stretching unit have a cylindrical or polygonal columnar shape having an opening, and wherein the first stretching unit is in the opening of the third stretching unit, the second stretching unit is in the opening of the first stretching unit, and the transfer film support unit is in the opening of the second stretching unit.

* * * * *